(12) United States Patent
Ikushima et al.

(10) Patent No.: US 7,563,635 B2
(45) Date of Patent: Jul. 21, 2009

(54) ELECTRONIC DEVICE AND METHOD OF MANUFACTURING THE SAME

(75) Inventors: Kimiya Ikushima, Hirakata (JP); Hiroyoshi Komobuchi, Kyoto (JP); Asako Baba, Tokyo (JP); Mikiya Uchida, Kyoto (JP)

(73) Assignee: Panasonic Corporation, Osaka (JP)

( * ) Notice: Subject to any disclaimer, the term of this patent is extended or adjusted under 35 U.S.C. 154(b) by 101 days.

(21) Appl. No.: 11/838,937

(22) Filed: Aug. 15, 2007

(65) Prior Publication Data

US 2007/0298534 A1    Dec. 27, 2007

Related U.S. Application Data

(63) Continuation of application No. 10/515,359, filed as application No. PCT/JP03/16837 on Dec. 25, 2003, now Pat. No. 7,364,932.

(30) Foreign Application Priority Data

Dec. 27, 2002  (JP) .............................. 2002-379357
Aug. 8, 2003   (JP) .............................. 2003-289888

(51) Int. Cl.
*H01L 21/00* (2006.01)

(52) U.S. Cl. .............................. 438/55; 438/48; 438/51; 438/52; 438/53; 257/E21.499; 257/E21.501

(58) Field of Classification Search ............ 438/48–55; 257/E21.499, E21.501

See application file for complete search history.

(56) References Cited

U.S. PATENT DOCUMENTS 5,329,110 A    7/1994    Shimabukuro et al.

(Continued)

FOREIGN PATENT DOCUMENTS

JP    06-302834 A    10/1994

(Continued)

OTHER PUBLICATIONS

K. Ikushima, et al., "Fabrication and Characterization of a Pixel Level Micro Vacuum Package for Infrared Imager," Proc. MEMS, pp. 520-523, (2004).

(Continued)

*Primary Examiner*—Davienne Monbleau
*Assistant Examiner*—Matthew Reames
(74) *Attorney, Agent, or Firm*—Panitch Schwarze Belisario & Nadel LLP

(57) ABSTRACT

In the present invention, an etching hole 21 is formed in a polysilicon film 14 as a cavity-wall member. Through the etching hole 21, hydrofluoric acid is injected, so as to dissolve a silicon oxide film 13, thereby forming a cavity 22. In the cavity 22, a detecting unit 12 of a sensor is in an exposed condition. Next, by sputtering, an Al film 16 is deposited in the etching hole 21 and on an upper face of a substrate. Thereafter, a portion of the Al film 16 positioned on the polysilicon film 14 is removed by etching back, thereby leaving only a metal closure 16a of Al which closes the etching hole. The sputtering step is performed under a pressure of 5 Pa or less, so that the pressure in the cavity can be held to be low.

8 Claims, 38 Drawing Sheets

U.S. PATENT DOCUMENTS

| | | | |
|---|---|---|---|
| 5,597,957 | A | 1/1997 | Schieferdecker et al. |
| 6,274,440 | B1 | 8/2001 | Arndt et al. |
| 6,582,569 | B1 | 6/2003 | Chiang et al. |
| 6,590,280 | B2 | 7/2003 | Satou et al. |
| 6,636,002 | B2 | 10/2003 | Kim |
| 6,787,387 | B2 | 9/2004 | Ikushima et al. |
| 2003/0155643 | A1* | 8/2003 | Freidhoff .................... 257/704 |
| 2004/0053434 | A1 | 3/2004 | Bruner |
| 2004/0065932 | A1 | 4/2004 | Reichenbach et al. |
| 2004/0126953 | A1 | 7/2004 | Cheung |
| 2005/0017276 | A1 | 1/2005 | Ikushima et al. |

FOREIGN PATENT DOCUMENTS

| | | |
|---|---|---|
| JP | 11-326037 A | 11/1999 |
| JP | 2000-055758 A | 2/2000 |
| JP | 2000-055759 A | 2/2000 |
| JP | 2000-124469 A | 4/2000 |
| JP | 2003-017672 A | 1/2003 |

OTHER PUBLICATIONS

S. Zurn, et al., "Sealed Vacuum Electronic Devices by Surface Micromachining," IEDM '91, pp. 205-208, 1991.

Kyle S. Lebouitz, A. Mazaheri, R. T. Howe, A. P. Pisano, "Vacuum encapsulation of resonant devices using permeable polysilicon," Proc. MEMS '99, pp. 4'70-475, 1999.

Aaron Partridge et al., "New Thin Film Epitaxial Polysilicon Encapsulation for Piezoresistive Accelerometers," Proc. MEMS, pp. 54-59, (2001).

C. T. Sune, G. W. Jones, D. Vellenga, "Fabrication of Encapsulated Silicon-Vacuum Field-Emission Transistors and Diodes," J. Vac. Sci. Technol. No. 5, vol. 10, pp. 2984-2988, (1992).

Hong, C., et al., "Silicon metal-oxide-semiconductor field effect transistor/field emission array fabricated using chemical mechanical polishing", J. Vac. Sci. Techol. B., vol. 21 No. 1 pp. 500-505(2003).

Kruse, P., et al., "Uncooled Infrared Imaging Arrays and Systems (Semiconductors and Semimetals)", Academic Press, pp. 114-115 (1997).

* cited by examiner (a)

(b)

(a)

(b)

Micro Vacuum Package

Micro Heater

Vacuum-Current Characteristic
(Applied Voltage 5V)

(a) (b)

(c)

ELECTRONIC DEVICE AND METHOD OF MANUFACTURING THE SAME

CROSS-REFERENCE TO RELATED APPLICATIONS

This application is a Continuation of U.S. patent application Ser. No. 10/515,359, filed Nov. 22, 2004, which is a Section 371 of International Application No. PCT/JP2003/016837, filed Dec. 25, 2003 and the disclosure of which is incorporated herein by reference.

BACKGROUND OF THE INVENTION

The present invention relates to an electronic device provided with a cavity of which an internal pressure is held at a low level and a production method thereof. The present invention particularly relates to an electronic device in which a sensing unit of an infrared sensor or the like is hermetically closed in an atmosphere of a reduced pressure, and a production method thereof. In addition, the present invention relates to an electronic device in which a pressure of the atmosphere in such a cavity can be measured, and the pressure can be further reduced as required, and a production method thereof.

For the purpose of increasing detection sensitivity, in an electronic device such as an infrared sensor, conventionally, at least a sensing unit is disposed in a cavity formed on a substrate, and the sensing unit is hermetically closed in a vacuum atmosphere or an inert gas atmosphere by a cap unit.

Such electronic devices include, other than the infrared sensor, a pressure sensor, an acceleration sensor, a flow-rate sensor, a vacuum transistor, and the like.

Among such sensors, infrared sensors can be generally classified into thermal sensors such as a bolometer sensor, a pyroelectric sensor, a thermopile sensor, or a thermocouple sensor, and quantum-type sensors using PbS, InSb, HgCdTe, or the like. Many of the bolometer sensors comprise detecting units formed from a resistivity-changeable material such as polysilicon, Ti, TiON, or $VO_x$, but some utilize a transient characteristic of a forward current of a PN diode, or the like. The thermopile sensor utilizes Seebeck effect caused in a PN junction, for example, and the pyroelectric infrared sensor utilizes the pyroelectric effect of a material such as PZT, BST, ZnO, or $PbTiO_3$. The quantum sensor detects a current caused by electronic excitation. In addition, there is an infrared sensor having chromel-alumel thermocouple which detects infrared rays by Seebeck effect, or the like.

In order to maintain the detection sensitivity and the accuracy of the infrared sensor at high levels, it is preferred that heat dissipation from an infrared detecting unit be as small as possible. It is known that when the detecting unit is enclosed in a vacuum atmosphere or an inert gas atmosphere of a reduced pressure which is hermetically sealed by a micro vacuum package, or the like, the detection characteristics are improved.

The sensitivity of the pressure sensor or the acceleration sensor is also improved when the viscous resistance of the air existing around the detecting unit is lowered, so that it is preferred that the detecting unit be enclosed in a vacuum atmosphere or an inert gas atmosphere of a reduced pressure which is hermetically sealed by a cap unit, or the like. When the interior of the cap unit is sealed so as to be in a vacuum condition, preferably, it can be confirmed that the vacuum level in the cap unit can be held in the production or in the use of the electronic device.

Hereinafter with reference to FIGS. 1A to 1F, a conventional method of fabricating an electronic device will be described.

In a step shown in FIG. 1A, a silicon substrate 101 on which a sensing unit 102 of an infrared sensor or the like is formed is prepared. After a silicon oxide film 103 is deposited on the substrate by CVD, for example, the silicon oxide film 103 is patterned so as to cover the sensing unit 102 and the peripheral portion thereof. Since the silicon oxide film 103 functions as a sacrificial layer, the silicon oxide film is removed by etching in a succeeding step, thereby defining the shape of a cavity.

In a step shown in FIG. 1B, a polysilicon film 104 is formed so as to cover the silicon oxide film 103 by CVD. The polysilicon film 104 constitutes a sidewall and a ceiling wall of a cap unit of the electronic device.

In a step shown in FIG. 1C, a number of etching holes 111 which run through the polysilicon film 104 and reach the silicon oxide film 103 are formed.

In a step shown in FIG. 1D, hydrofluoric acid is injected through the etching holes 111, so as to dissolve the silicon oxide film 103. The solution is removed via the etching holes 111. As a result, a cavity 112 surrounded by the silicon oxide film 103 is formed, and the sensing unit 102 of the sensor is exposed in the cavity 112.

Next, in a step shown in FIG. 1E, a polysilicon film 106 is deposed by CVD so as to cover the polysilicon film 104. At this time, the polysilicon film 106 is also deposited in interior walls of the etching holes 111, so as to close the etching holes 111. In a time period after the start of CVD until the etching holes are completely closed, the polysilicon film 106 is deposited on an interior wall of the cavity 112.

The above-mentioned CVD process is generally performed by using a reaction gas such as $SiH_4$ under a pressure of 500 mTorr (about 67 Pa). Therefore, the cavity 112 is hermetically sealed in a condition where the internal pressure is about 500 mTorr (about 67 Pa) in the CVD process. In addition, in the CVD process, $SiH_4$ which is not yet reacted and an $H_2$ gas caused by the reaction remain in the interior of the cavity 112. Moreover, $SiH_4$ which is not yet reacted and the $H_2$ gas caused by the reaction are adsorbed to the polysilicon film 106 deposited on the wall of the cavity 112.

Next, in a step shown in FIG. 1F, the whole of the substrate 101 is heated at high temperatures of 500° C. or more under high vacuum. At this time, the $SiH_4$ gas in the cavity 112 is decomposed to some extent, and the $H_2$ gas is discharged to the exterior through the polysilicon films 104 and 106. Accordingly, the pressure in the cavity 112 is slightly reduced from the internal pressure of the cavity 112 in the CVD process, so that the vacuum level of the cavity 112 is somewhat increased.

The above-described production method is described in Japanese Laid-Open Patent Publication No. 2000-124469, for example.

Next, a prior art for increasing the vacuum level in the interior of a vacuum package (a cap unit), and a prior art for measuring a vacuum level (a pressure) will be described.

FIG. 42 schematically shows a sectional configuration of an electronic device having a conventional vacuum package (see Japanese Laid-Open Patent Publication No. 11-326037). The electronic device shown in FIG. 42 includes a silicon substrate 91, a transmitting window 94 fixed on the silicon substrate 91 by means of a solder 99. A gap 93 having a height of about 1 to 10 mm is disposed between the transmitting window 94 and the silicon substrate 91. A getter 95 having a size of several millimeters is disposed in the gap 93.

A through hole 97 is formed in the transmitting window 94, and the getter 95 is disposed in the gap 93 through the through hole 97. When the silicon substrate 91 is disposed in a vacuum, the gap 93 is evacuated through the through hole 97, so that the pressure is reduced. The through hole 97 is closed by melting the solder 99 for vacuum sealing, so as to hold the gap 93 in a vacuum condition. Thereafter, when the getter 95 is activated, the pressure of the gap 93 is further reduced, and a high vacuum condition can be attained.

The vacuum level in the cap unit can be measured by using a Pirani gauge, for example. The Pirani gauge is an apparatus for obtaining a vacuum level based on an electric resistance value of the resistive element disposed in a vacuum. The coefficient of thermal conductivity of a gas depends on a pressure of the gas, i.e., a vacuum level. For this reason, if the coefficient of thermal conductivity from a heated resistive element to the gas is obtained, it is possible to determine the vacuum level of the gas by appropriate calibration.

Recently, electronic devices are miniaturized, so that the above-described vacuum packages (cap units) are more strongly required to be microminiaturized. For example, an image sensor in which a number of infrared detecting units and visible-light detecting units arranged in a matrix are provided on one and the same substrate is proposed. In such an image sensor, each of the infrared detecting units having a size of about 50 μm×50 μm is sealed by a micro vacuum package having a size of about 100 μm×100 μm (Japanese Laid-Open Patent Publication No. 2003-17672).

In order to manufacture a microminiaturized electronic device on which an FEA device and a transistor for performing high-speed switching operation in a vacuum are mixedly mounted, a technique in which a microminiaturized vacuum package is formed only in a portion of the FEA device on the substrate is described, for example, in Silicon metal-oxide-semiconductor field effect transistor/field emission array fabricated using chemical mechanical polishing, C. Y. Hong and A. I. Akinwande, J. Vac. Sci. Technol. B Vol. 21, No. 1, p 500-505, January/February 2003.

According to the above-described method of fabricating the electronic device, the $SiH_4$ gas is decomposed in the cavity 112 in the thermal treatment step shown in FIG. 1F, and the $H_2$ gas is discharged to the exterior of the cavity 112. Therefore, the vacuum level in the cavity is slightly increased as compared with the pressure of 500 mTorr (about 67 Pa) in the CVD process. However, there exists a problem that an increase in vacuum level is not expected, for the purpose of improving the sensitivity of the sensor.

In the above-described production method, any cavity is not formed between the detecting unit 102 and the substrate 101. By disposing sacrificial layers for respective upper and lower layers of the detecting unit 102, it is possible to fabricate a configuration in which the atmospheric gas in the cavity is in contact not only above but also below the detecting unit 102.

FIG. 2 is a perspective view showing the vicinity of a detecting unit of a bolometer-type infrared sensor having such a configuration. In FIG. 2, a resistive element 151 referred to as a "bolometer" functioning as an infrared detecting unit, and a supporting member 152 for supporting the resistive element 151 are formed on a substrate 101. The resistive element 151 is formed from a patterned polysilicon film, for example. The supporting member 152 is often disposed by laminating a polysilicon film, a nitride film, an oxide film, and the like. The supporting member 152 has arm portions extended from a supporting main portion on an upper face of which the resistive element 151 is formed. The supporting member 152 is fixed to the substrate 101 via the arm portions.

In FIG. 2, a cavity-wall member is not shown. In an actual infrared sensor, a supporting member 150 is disposed in an interior of a cavity which is the same as the cavity 112 shown in FIG. 1F.

Hereinafter, a problem caused in the case where the etching holes are closed by CVD will be described in detail.

Although not shown in FIG. 2, when infrared rays pass through the polysilicon films surrounding the cavity (the films indicated by the reference numerals 104 and 106 in FIG. 1F) and are incident on the resistive element 151, the temperature of the resistive element 151 is increased. In conjunction with the temperature rise, the resistance value is varied. The infrared sensor having the configuration of FIG. 2 measures the change of the resistance value, so as to detect the amount of infrared rays incident on the resistive element 151.

In order to increase the detection sensitivity of the infrared sensor, it is necessary to increase the magnitude of temperature rise of the resistive element 151 when the infrared rays are incident on the resistive element 151. Therefore, it is preferred that the resistive element 151 functioning as an infrared detecting unit and the exterior thereof be thermally insulated as much as possible.

The thermal conductance between the resistive element 151 and the exterior thereof is classified into thermal conductance via the supporting member 152 which connects the resistive element 151 to the substrate 101, and thermal conductance via a gas around the resistive element 151.

The thermal conductance via the supporting member 152 becomes smaller, as a sectional area of the narrowest portion of the supporting member 152 is smaller, and as the distance from the substrate 101 is larger. For example, if a technique of MEMS (Micro-Electro-Mechanical Systems) is used, it is possible to configure the portion (the connecting portion) of the supporting member 152 coupled to the substrate 101 by two columns of $Si_3N_4$ having a sectional area of 3 μm² and a length of 50 μm. In this case, the thermal conductance is $3\times10^{-7}$ (W/K).

On the other hand, the thermal conductance via the gas around the resistive element 151 is smaller, as the pressure of the gas is smaller. For this reason, it is necessary to reduce the pressure of the gas around the detecting unit, in order to increase the sensitivity of the infrared sensor.

However, in the conventional production method described with reference to FIGS. 1A to 1F, after the step shown in FIG. 1E, the internal pressure of the cavity 112 is maintained at about 500 mTorr (about 67 Pa) by the residual gas. After the formation of the cavity 112, vacuum and high temperature treatment is performed, thereby diffusing hydrogen in the interior into the exterior. Thus, the internal pressure of the cavity 112 can be somewhat reduced, but the $SiH_4$ gas which cannot be discharged to the exterior of the cavity 112 by the high temperature heating remains in the cavity.

In the infrared image sensor such as a bolometer type, a relationship shown in the graph of FIG. 3 exists between the pressure of the gas covering the detecting unit and the sensitivity. Such a relationship is described, for example, in "Uncooled Infrared Imaging Arrays and Systems" by Academic Press, page 115.

In the graph of FIG. 3, the ordinate indicates the sensitivity, and the abscissa indicates the atmospheric pressure of the detecting unit 12. As is seen from the graph, as the pressure is lower, the sensitivity increases. The sensitivity in the case of the pressure of 50 mTorr is about three times as much as the sensitivity in the case of the pressure of 500 mTorr. Therefore, it is desired that the internal pressure of the cavity is 50 mTorr or less.

The supporting member 152 for the detecting unit 151 of the infrared sensor has a minute configuration as shown in FIG. 2. Thus, if the heating at extremely high temperatures is performed in the step of FIG. 1F, thermal stress is generated in the supporting member 152, so that the supporting member 152 may be broken.

In the case where high temperature heating of 660° C. or more is performed, there arises a problem that Al used as wiring for the sensor is molten. Thus, it is necessary to perform the heating at the temperature or lower temperatures. However, in such temperatures, the diffusion velocity of $H_2$ to the exterior is very low, so that the function as the heating for increasing the vacuum level is not expected so much.

As described above, by the conventional production method in which the etching holes are closed by CVD, it is difficult that the vacuum level of the cavity 112 is further increased, and hence the detection sensitivity is increased.

If the method described with reference to FIG. 12 is adopted in order to increase the vacuum level, it is extremely difficult to dispose the getter shown in FIG. 12 in the minute cavity with good yield.

If the above-mentioned vacuum package (the cap unit) is miniaturized so as to have a size of 1 mm or less, it becomes further difficult to dispose the getter agent in the interior of each vacuum package by a conventional method. For example, in the case where each of the infrared detecting units is sealed by a micro vacuum package having a size of about 100 μm×100 μm, it is very difficult and it takes a lot of trouble to disposed a getter agent in the interior of each of a number of vacuum packages.

Moreover, many of the techniques for detecting the vacuum level by a conventional Pirani gauge are produced for the purpose of measuring the vacuum level in a vacuum chamber of a large-size apparatus. Thus, the smallest detecting device has a length of about 0.2 inches. Therefore, the conventional Pirani gauge is not suitable for measuring the internal pressure of the above-mentioned micro vacuum package.

BRIEF SUMMARY OF THE INVENTION

The present invention has been conducted in view of the above-described prior art, and it is an object of the present invention to provide an electronic device at least part of which is held in a cavity, and an internal pressure of the cavity can be reduced as compared with the conventional one, and to provide a production method thereof.

It is another object of the present invention to provide an electronic device which can measure an internal pressure of a micro vacuum package, and a production method thereof.

It is still another object of the present invention to provide an electronic device in which the vacuum level in a micro vacuum package can be easily maintained or improved, and a production method thereof.

The method of fabricating an electronic device according to the present invention includes the steps of: (a) preparing a substrate on which part of the electronic device is disposed, and forming a sacrificial layer which covers the part of the electronic device on a selected region of the substrate; (b) forming a cavity-wall film which covers the sacrificial layer on the substrate; (c) forming at least one opening which runs through the cavity-wall film and reaches the sacrificial layer in the cavity-wall film; (d) selectively etching at least part of the sacrificial layer via the opening, thereby forming a cavity surrounding the part of the electronic device; and (e) forming a sealing member for closing the opening by sputtering.

In a preferred embodiment, in the step (e), the sealing member is formed by sputtering a metal.

In a preferred embodiment, in the step (e), the sealing member is formed by sputtering silicon.

In a preferred embodiment, in the step (e), after a film for the sealing member is deposited in the opening and on the cavity-wall film, a portion of the film for the sealing member positioned on an upper face of the cavity-wall film is removed, thereby leaving the sealing member in the opening.

In a preferred embodiment, in the step (e), the sputtering is performed in an inclined direction with respect to a direction perpendicular to a main face of the substrate.

In a preferred embodiment, in the step (c), an opening having a shape which is wider in an upper portion and is narrower in a lower portion is formed.

In a preferred embodiment, in the step (b), a side opening which reaches a side face of the sacrificial layer is additionally formed.

In a preferred embodiment, in the step (b), the opening is formed so that the opening does not overlap the part of the electronic device as seen from the direction of the sputtering in the step (e).

In a preferred embodiment, in the step (e), the sputtering is performed under a pressure of 10 Pa or less.

In a preferred embodiment, in the step (e), the sputtering is performed under a pressure of 5 Pa or less.

In a preferred embodiment, in the step (a), the sacrificial layer is formed from a polysilicon film, and in the step (b), a silicon oxide film is formed as the cavity-wall film.

In a preferred embodiment, the part of the electronic device is a detecting unit of an infrared sensor, in the step (a), the sacrificial layer is formed from a polysilicon film, and in the step (b), a polysilicon film and a silicon oxide film enwrapping the polysilicon film are formed as the cavity-wall film.

In a preferred embodiment, in the step (a), the sacrificial layer is formed from a silicon oxide film, and in the step (b), a polysilicon film is formed as the cavity-wall film.

In a preferred embodiment, the production method further includes the step of, after the step (d) and before the step (e), depositing a film on an exposed surface of the substrate by CVD, thereby making the opening smaller.

In a preferred embodiment, the production method further includes the step of, before the step (a), forming a detecting unit of an infrared sensor as the part of the electronic device, and a sacrificial layer for a lower cavity embedding the side and the bottom side of the detecting unit, and in the step (d), the sacrificial layer and the sacrificial layer for the lower cavity are removed.

The electronic device according to the present invention includes: a substrate; part of the electronic device disposed on the substrate; a cavity-wall member surrounding the part of the electronic device with a cavity interposed therebetween; and a sealing member for closing an opening disposed in a ceiling portion of the cavity-wall member, and the sealing member is formed by sputtering.

In a preferred embodiment, the sealing member is constituted by silicon.

In a preferred embodiment, the sealing member is constituted by a metal.

In a preferred embodiment, a pressure in the cavity is 10 Pa or less.

In a preferred embodiment, a pressure of the cavity is 5 Pa or less.

In a preferred embodiment, the sealing member is constituted by a metal.

In a preferred embodiment, the sealing member is constituted by an oxide film.

In a preferred embodiment, the part of the electronic device is a detecting unit of an infrared sensor, and the cavity-wall member is constituted by polysilicon and a silicon oxide film enwrapping the polysilicon.

In a preferred embodiment, the part of the electronic device is a detecting unit of an infrared sensor, and the side and the bottom side of the detecting unit are surrounded by a lower cavity.

In a preferred embodiment, the opening does not overlap the part of the electronic device as seen from the direction of sputtering.

In another aspect of the present invention, the method of fabricating an electronic device including a cavity of reduced pressure, and a pressure measuring element at least part of which is disposed in the cavity includes the steps of: (a) disposing the pressure measuring element on a substrate; and (b) forming the cavity so as to include the at least part of the pressure measuring element, wherein the step (b) of forming the cavity includes the step (b1) of forming an opening for supplying an etchant to a region to be etched, the step (b2) of supplying the etchant to the region to be etched through the opening, thereby removing the region to be etched, and the step (b3) of forming a sealing member for closing the opening by sputtering.

In a preferred embodiment, the step (a) includes the step (a1) of forming a heat absorbing and/or emitting portion having a function of heat generation and/or heat sink and a temperature detecting portion having a function of detecting a temperature on the substrate by a thin film deposition technique, thereby forming the pressure detecting element.

In a preferred embodiment, the heat absorbing and/or emitting portion generates heat by Joule heat.

In a preferred embodiment, the temperature detecting portion detects a temperature based on a resistance variation depending on a temperature of an electric resistor.

In a preferred embodiment, the heat absorbing and/or emitting portion has a function of generating heat by Joule heat by means of an electric resistor and a function of detecting a temperature based on a resistance variation depending on a temperature of an electric resistance of the electric resistor, and the heat absorbing and/or emitting portion and the temperature detecting portion are constituted by one and the same thin film of an electric resistive element.

In a preferred embodiment, the heat absorbing and/or emitting portion is a Peltier element.

In a preferred embodiment, the step (b) includes: the step of forming a sacrificial layer functioning as the region to be etched on the pressure measuring element; the step of forming a cavity-wall film which covers the sacrificial layer on the substrate; and the step of forming the opening in the cavity-wall film, thereby exposing at least part of the sacrificial layer via the opening.

In a preferred embodiment, the production method further includes the step of, before the step (a1) is performed, forming a sacrificial layer for thermally insulating the heat absorbing and/or emitting portion which covers part of the substrate on a selected region of the substrate, and the step of, after the step (a1) is performed, removing at least part of the sacrificial layer for thermally insulating the heat absorbing and/or emitting portion.

In a preferred embodiment, the production method further includes: the step of, before the step (a1) is performed, forming a sacrificial layer for thermally insulating the heat absorbing and/or emitting portion functioning as part of the region to be etched on a selected region of the substrate; the step of, after the pressure measuring element is formed on the sacrificial layer for thermally insulating the heat absorbing and/or emitting portion, forming a cavity-wall sacrificial layer functioning as another part of the region to be etched on the pressure measuring element; the step of forming a cavity-wall film covering the sacrificial layer for thermally insulating the heat absorbing and/or emitting portion and the cavity-wall sacrificial layer; the step of forming the opening in the cavity-wall film, thereby exposing a surface of a portion of at least one of the sacrificial layer for thermally insulating the heat absorbing and/or emitting portion and the cavity-wall sacrificial layer; and the step of removing at least part of the sacrificial layer for thermally insulating the heat absorbing and/or emitting portion and the cavity-wall sacrificial layer via the opening.

In a preferred embodiment, the production method further includes: the step of forming an etch stop layer on the substrate; the step of forming the opening in the etch stop layer; the step of forming at least one of the heat absorbing and/or emitting portion and the temperature detecting portion on the etch stop layer; and the step of supplying the etchant through the opening, and removing a region of the substrate functioning as the region to be etched, thereby forming at least part of the cavity.

In a preferred embodiment, the production method further includes: the step of preparing, as the substrate, a substrate having a region functioning as an etch stop layer in the surface or in the inside thereof and having a region functioning as the region to be etched below the region functioning as the etch stop layer; the step of forming the opening in the etch stop layer;

the step of forming at least one of the heat absorbing and/or emitting portion and the temperature detecting portion on the etch stop layer; and the step of supplying the etchant via the opening and removing at least part of the region to be etched of the substrate.

In a preferred embodiment, the heat absorbing and/or emitting portion has a size of 1 mm or less.

In a preferred embodiment, the step (b3) is performed under a pressure of 10 Torr or less.

In a preferred embodiment, in the step (b3), silicon is sputtered.

In a preferred embodiment, the thin film deposition technique is vacuum evaporation.

In a preferred embodiment, the thin film deposition technique is performed by CVD or PVD.

In a still another aspect of the present invention, the method of fabricating an electronic device which includes a cavity of reduced pressure, a gettering thin film, disposed in the cavity, having a function of adsorbing an ambient material, and an activating portion having a function of activating the gettering thin film by heat generation includes the steps of: (a) providing the activating portion and the gettering thin film on a substrate by thin film deposition technique; and (b) forming the cavity, wherein the step (b) of forming the cavity includes the step (b1) of forming an opening through which an etchant is supplied to a region to be etched, the step (b2) of supplying the etchant to the region to be etched through the opening, thereby removing the region to be etched, and the step (b3) of forming a sealing member for closing the opening by sputtering.

In a preferred embodiment, the step (a) includes the step (a1) of forming the activating portion by a thin film deposition technique, and the step (a2) of forming the gettering thin film in a position which is in contact with the activating portion by a thin film deposition technique.

In a preferred embodiment, the step (a) includes, before the steps (a1) and (a2) are performed, the step of forming a sacrificial layer for the activating portion which covers part of the substrate on a region in which the activating portion is formed, and the step (b) includes the step of removing at least part of the sacrificial layer for the activating portion.

In a preferred embodiment, the production method further includes: the step of forming an etch stop layer on the substrate; the step of forming the opening in the etch stop layer; the step of forming at least one of the activating portion and the gettering thin film on the etch stop layer; and the step of supplying the etchant through the opening and removing a region of the substrate functioning as the region to be etched, thereby forming at least part of the cavity.

In a preferred embodiment, the production method further includes: the step of preparing, as the substrate, a substrate having a region functioning as an etch stop layer in the surface or in the inside thereof and a region functioning as the region to be etched below the region functioning as the etch stop layer; the step of forming the opening in the etch stop layer; the step of forming at least one of the activating portion and the gettering thin film above the etch stop layer; and the step of supplying the etchant through the opening, thereby removing at least part of the region to be etched of the substrate.

In a preferred embodiment, the step (b) includes the step of forming a cavity-wall sacrificial layer functioning as the region to be etched on the activating portion, the step of forming a cavity-wall film which covers the cavity-wall sacrificial layer on the substrate, and the step of forming the opening in the cavity-wall film and exposing at least part of the cavity-wall sacrificial layer via the opening.

In a preferred embodiment, the activating portion has a size of 1 mm or less.

In a preferred embodiment, the step (b3) is performed under a pressure of 10 Torr or less.

In a preferred embodiment, in the step (b3), silicon is sputtered.

In a preferred embodiment, the thin film deposition technique is vacuum evaporation.

In a preferred embodiment, the activating portion generates heat due to Joule heat by an electric resistor.

In a preferred embodiment, the activating portion is a Peltier element.

In a preferred embodiment, the electronic device includes at least one infrared detecting portion and at least one visible-light detecting portion formed on the substrate, the cavity has a shape which surrounds at least part of the infrared detecting portion, but does not surround part of the visible-light detecting portion.

In a preferred embodiment, the number of the visible-light detecting portions formed on the substrate is plural, and the visible-light detecting portions are arranged on the substrate.

In a preferred embodiment, the numbers of the infrared detecting portions and the visible-light detecting portions formed on the substrate are plural, respectively, and the infrared detecting portions and the visible-light detecting portions are arranged on the substrate.

The production method further includes the step of forming a mirror for reflecting infrared rays and visible light.

In another aspect of the present invention, the electronic device includes: a substrate; part of the electronic device disposed on the substrate; a cavity-wall member surrounding the part of the electronic device with a cavity interposed therebetween; and a sealing member for closing an opening disposed in a ceiling portion of the cavity-wall member, wherein the sealing member is formed from a thin film, and an internal pressure of the cavity is 10 Pa or less.

In a preferred embodiment, a gettering thin film is disposed inside the cavity.

In a preferred embodiment, at least part of the cavity exists below the gettering thin film.

In a preferred embodiment, the electronic device includes a micro heater for heating the gettering thin film.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Hereinafter, embodiments of the present invention will be described with reference to the accompanying drawings.

Embodiment 1

Hereinafter a first embodiment of the present invention will be described with reference to the drawings.

Figure 4A:
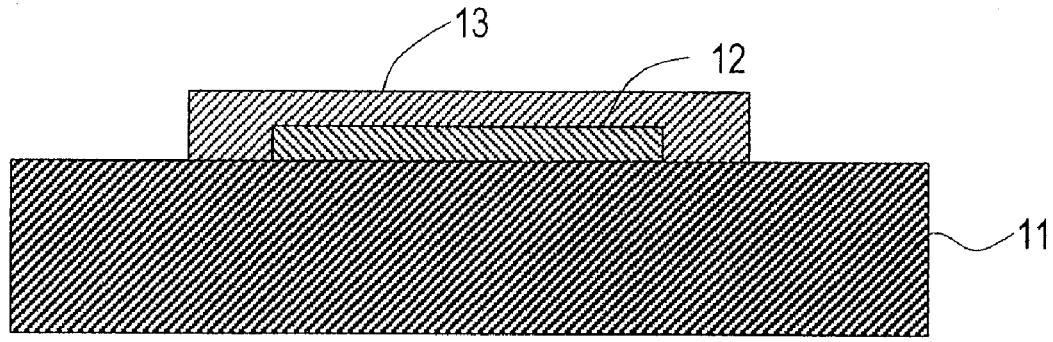
FIG. 4A is a sectional view showing a step before an etching opening is formed in a production process of an electronic device according to a first embodiment of the present invention.

First, in a step shown in FIG. 4A, a detecting unit 12 such as a bolometer of an infrared sensor is formed on a main face of a silicon substrate 11. Specifically, after a thin film of a material having a sensor function is deposited on the silicon substrate 11, micro-fabrication such as photolithography and etching is performed, thereby patterning the thin film. A planar shape of the detecting unit 12 is designed so as to have the same planar shape as that of the resistive element 151 shown in FIG. 2, for example.

Next, after a silicon oxide film 13 which covers the detecting unit 12 is deposited on the silicon substrate 11 by a thin film deposition technique such as CVD, the silicon oxide film 13 is patterned so as to cover the detecting unit 12 and the peripheral portion thereof. The patterning can be also performed by photolithography and etching techniques. The patterned silicon oxide film 13 functions as a sacrificial layer, and is removed by etching later, thereby defining the shape of a cavity. The thickness of the silicon oxide film 13 defines the height of the cavity. In this embodiment, the thickness of the silicon oxide film 13 is set in the range of not less than 0.5 μm nor more than 2 μm, for example.

Figure 4B:
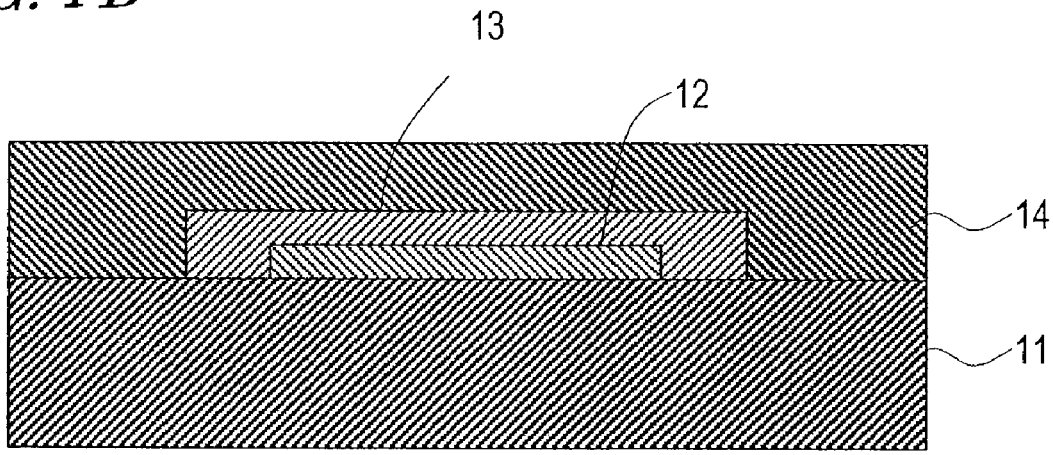
FIG. 4B is a sectional view showing a step before the etching opening is formed in the production process of the electronic device according to the first embodiment of the present invention.

Next, in a step shown in FIG. 4B, a polysilicon film 14 which covers the silicon oxide film 13 is deposited on the silicon substrate 11 by the thin film deposition technique such as CVD. The polysilicon film 14 is a cavity-wall member functioning as a sidewall and a ceiling wall of a cap unit of the electronic device, after the cavity is formed. The thickness of the polysilicon film 14 is set in the range of not less than 0.5 μm nor more than 2 μm, for example. In this embodiment, the sacrificial layer which is removed by etching is formed from the silicon oxide film, so that it is necessary to form the cavity-wall member from a material which is difficult to be etched by an etchant for etching the silicon oxide film. Polysilicon is one of materials exhibiting superior anti-etching property against various etchants utilized for etching silicon oxide.

Figure 4C:
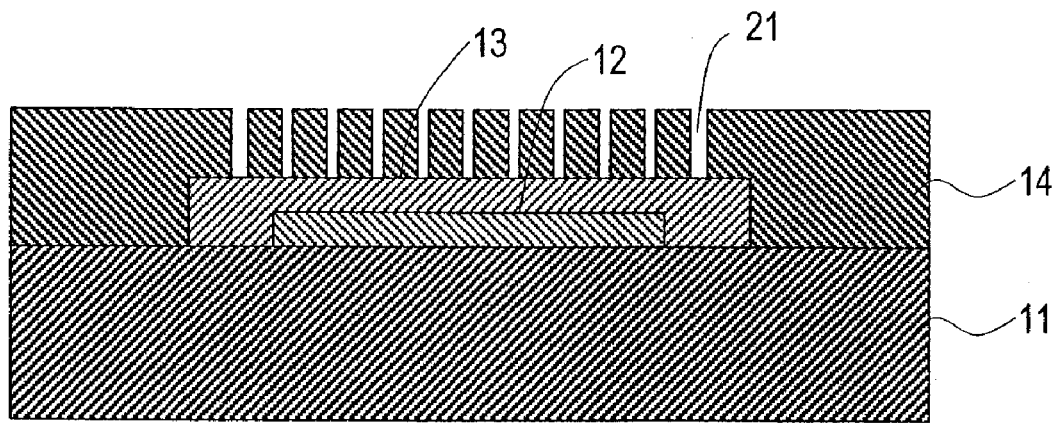
FIG. 4C is a sectional view showing a step before the etching opening is formed in the production process of the electronic device according to the first embodiment of the present invention.

In a step shown in FIG. 4C, a number of etching holes 21 which run through the polysilicon film 14 and reach the silicon oxide film 13 are formed. An arbitrary number of etching holes 21 are formed in arbitrary positions and in an arbitrary arrangement by photolithography and etching techniques. In this embodiment, the diameter of the etching hole 21 is set in the range of not less than 0.1 μm nor more than 6 μm.

Figure 4D:
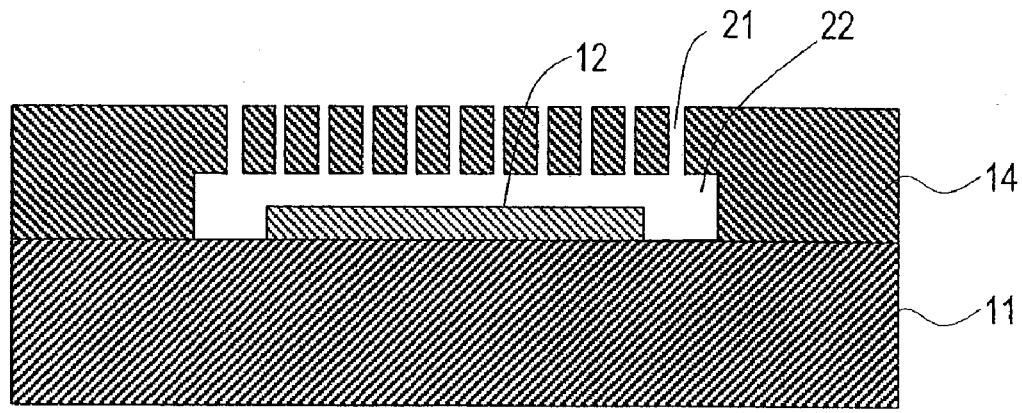
FIG. 4D is a sectional view showing a step after the etching opening is formed in the production process of the electronic device according to the first embodiment of the present invention.

Next, in a step shown in FIG. 4D, hydrofluoric acid is injected into the etching holes 21, so as to etch the silicon oxide film 13. The silicon oxide film 13 which is reacted with the hydrofluoric acid and dissolved is removed via the etching holes 21, so as to form a cavity 22 surrounded by the polysilicon film 14. In the interior of the cavity 22, the detecting unit 12 of the sensor is exposed.

Figure 4E:
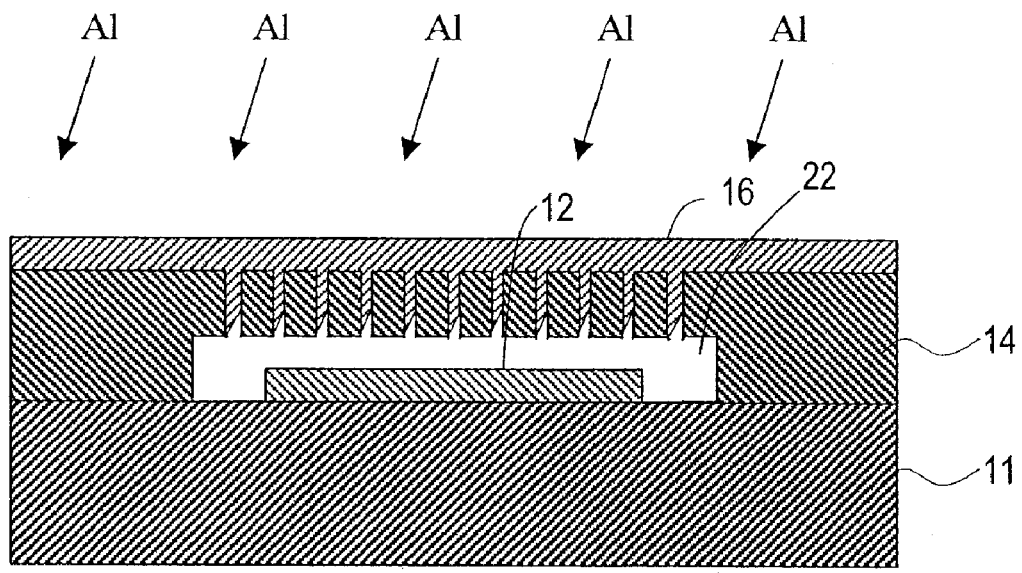
FIG. 4E is a sectional view showing a step after the etching opening is formed in the production process of the electronic device according to the first embodiment of the present invention.

In a step shown in FIG. 4E, an Al film 16 which covers an upper face of the polysilicon film 14 is formed on the silicon substrate 11. In this embodiment, the Al film 16 is formed by sputtering in an oblique direction. The thickness of the Al film 16 is varied depending on a diameter of the etching hole 21. In this embodiment, the thickness is set to be 2.0 μm. The sputtering is performed under a pressure of 5 Pa or less. The etching holes 21 are closed by the Al film 16 and the pressure of the interior of the cavity is 5 Pa or less.

Figure 4F:
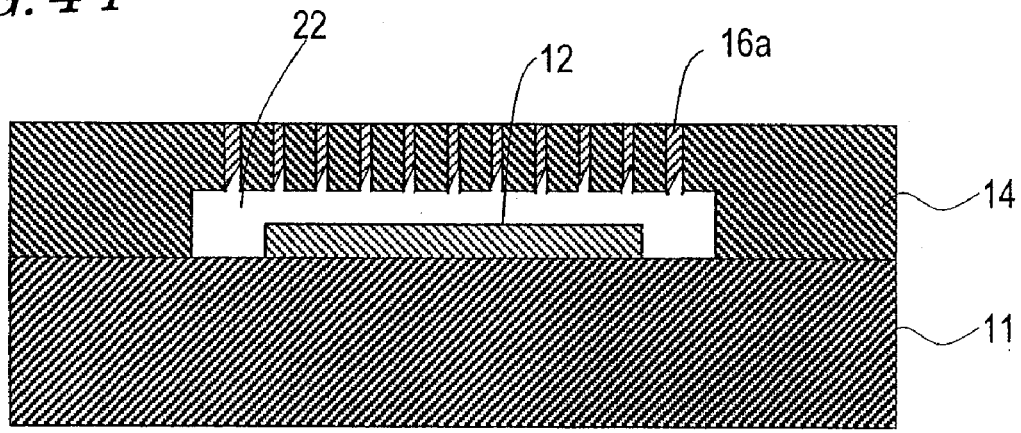
FIG. 4F is a sectional view showing a step after the etching opening is formed in the production process of the electronic device according to the first embodiment of the present invention.

Next, as shown in FIG. 4F, portions of the Al film 16 which are higher than the upper face of the polysilicon film 14 are removed by etching-back, and only a metal sealing member 16a of Al which closes the etching holes 21 is left. Herein, in the case where a relatively large detecting unit is disposed in the interior of the cavity 22, it is preferred that the following steps A and B be performed before the step shown in FIG. 4A, thereby depositing a sacrificial layer (the silicon oxide film 13) so as to cover the detecting unit of the sensor in a step shown in FIG. AA.

Step A: Forming a detecting unit and a peripheral circuit portion of a sensor

Step B: Forming a polysilicon film for covering the detecting unit and the peripheral circuit portion of the sensor Infrared rays can pass through the polysilicon film 14, but cannot pass through the metal sealing member 16a. However, the whole of the metal sealing member 16a occupies an extremely small area, so that there is almost no problem in actuality. As described later, the positions in which the etching holes 21 are formed in the step shown in FIG. 4E do not overlap the detecting unit (the resistive element 151 shown in FIG. 2) of the infrared sensor as much as possible. Thus, it is possible to suppress the deterioration in detection sensitivity for the infrared rays.

According to this embodiment, in the step shown in FIG. 4E, the Al film (the metal film) for closing the etching holes 21 is deposited by sputtering, so that it is possible to close the etching holes 21 under a lower pressure as compared with the case of CVD (i.e., at a higher vacuum level). Therefore, it is possible to hold the vacuum level of the cavity 22 high, and to hold the pressure to be 5 Pa or less, for example. Therefore, the heat conductance from the detecting unit of the sensor disposed in the cavity 22 via the surrounding space can be reduced, and the detection sensitivity of the sensor can be improved.

According to this embodiment, it is unnecessary to perform thermal treatment after the etching holes 21 are closed. Thus, it is possible to improve the sensitivity of the sensor, without badly affecting aluminum wirings or the like. In addition, in this embodiment, since a metal is used for closing the etching holes 21, there exists almost no polysilicon film which adsorbs a gas or the like in the cavity 22 as in the case of CVD. Therefore, there does not occur such a problem that the residual gas or the like is discharged into the cavity 22 during the use of the electronic device, so as to deteriorate the vacuum level.

In a step shown in FIG. 4F, it is desired that the sputtering be performed in such a condition that an Ar gas is caused to flow into a chamber at a flow rate of 10 to 30 (ml/min), and the temperature in the chamber is held at 400° C. to 500° C. If the temperature in the chamber during the sputtering is lower than 400° C., the velocity of reflow of sputtered Al particles is lowered. Thus, there occurs a portion in which the growth rate of the Al film is low. Thus, an extremely long time is required for closing the etching holes. On the other hand, the temperatures exceeding 500° C. during the sputtering badly affect the Al wirings and the like.

In the case where the sputtering in the oblique direction is not performed, it is desired that the distance between a target for sputtering and the substrate is 10 cm or less. In long-throw sputtering in which the distance between the target for sputtering and the substrate is 10 cm or more, a ratio of metal particles which are vertically incident on the upper face of the substrate is increased. Thus, the rate at which the metal film is deposited on a sidewall surface of the etching hole is lowered. Therefore, a longer time is required for closing the etching holes, and the number of metal particles invaded in the cavity is increased.

For example, in the case where the Ar gas is caused to flow into the chamber at a flow rate of 10 to 30 (ml/min), the temperature in the chamber is held at 400° C. to 500° C., and the distance between the target for sputtering and the substrate is 10 cm or less, a metal film of about 600 nm is deposited on the upper face of the substrate for about 40 seconds unless the sputtering in the oblique direction is performed. At the same time, the etching holes each having a diameter of 0.3 μm are closed.

The metals to be sputtered include, in addition to aluminum (Al), tungsten (W), titan (Ti), molybdenum (Mo), copper (Cu), tantalum (Ta), barium (Ba), strontium (Sr), platinum (Pt), rubidium (Rb), and the like, and compounds thereof. Any of the metals can be used.

In semiconductor process of the current 0.13 μm rule, in sputtering of Cu and Ta, the directivity is generally increased by generating plasma at a pressure of several Pa and ionizing the sputtered metal. On the other hand, Al, Ti, and W are sputtered at a low pressure of about 100 mPa. Therefore, in the case where the pressure in the chamber is desired to be a low pressure of 10 mPa, it is preferred that the sputtering of Al, Ti, and W be performed. In the case of a sensor requiring a vacuum which is not so high, such as an infrared sensor, it is preferred that the sputtering be performed at a pressure of 5 Pa or less. If the sputtering is performed at a pressure of 10 Pa or less, it is possible to sufficiently improve the detection sensitivity of the sensor, as compared with the conventional production method.

Embodiment 2

Hereinafter a second embodiment according to the present invention will be described.

In the above-described first embodiment, the etching holes 21 are closed by the metal sealing member 16a by obliquely sputtering a metal from the above of the polysilicon film 14. Alternatively, instead of the oblique sputtering, if the shape of the etching hole 21 is contrived, the etching hole 21 can be closed by vertical sputtering.

Figure 5:
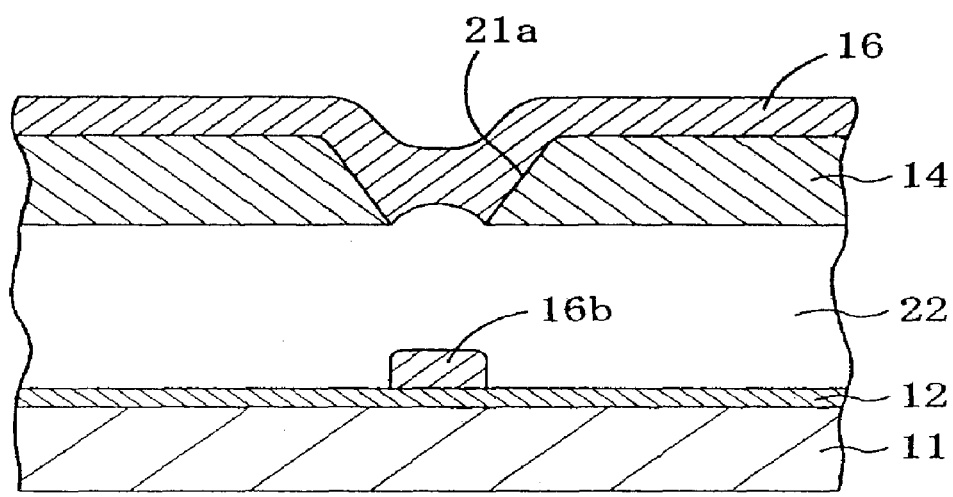
FIGS. 5(a) and 5(b) are fragmentary sectional views each of which shows part of a production process of an electronic device according to a second embodiment.
Figure 5:
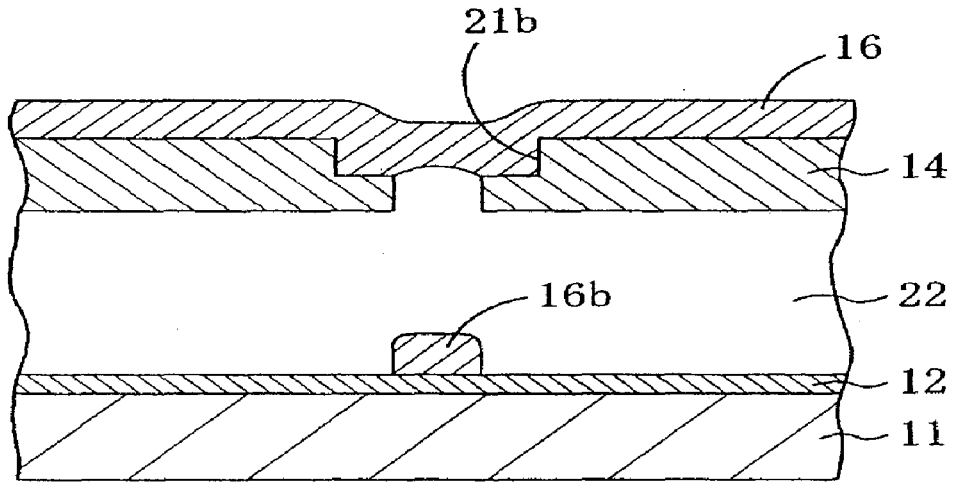

FIGS. 5(a) and (b) are partial sectional views each showing part of a production process of an electronic device according to this embodiment. Both of FIGS. 5(a) and (b) show the configuration of the polysilicon film and the like formed in the step shown in FIG. 4E.

Figure 3:
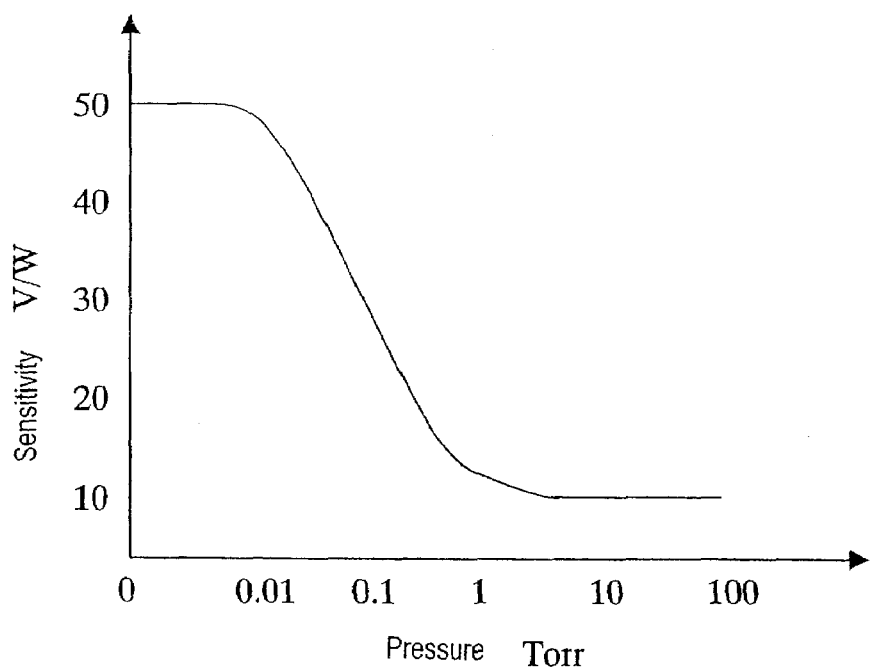
FIG. 3 is a graph showing a relationship between an atmospheric pressure and sensitivity in a detecting unit of an infrared image sensor.

In the polysilicon film 14 of the electronic device according to a modification shown in FIG. 5(a), an etching hole 21a of a tapered shape is formed. In this modification, the sputtered metal is deposited on a tapered wall of the etching hole 21a, thereby closing the etching hole 21a. In the polysilicon film 14 of an electronic device according to a modification shown in FIG. 3(b), an etching hole 21b having a stepped shape is disposed. In this modification, the sputtered metal is deposited on a wall surface parallel to a main face of the stepped portion of the etching hole 21b, thereby closing the etching hole.

In both of the modifications shown in FIGS. 5(a) and (b), the sputtered metal is invaded into the cavity 22 in an initial process of the sputtering, and a deposited portion 16b of metal is formed on the detecting unit 12 of the sensor and the substrate 11. In this case, when the detecting unit 12 is a resistive element (a bolometer) of an infrared sensor, for example, since, generally, metals do not transmit infrared rays, the metal may possibly affect the detection sensitivity. In order to avoid such problem, it is preferred that the following configuration be adopted.

Figure 1A:
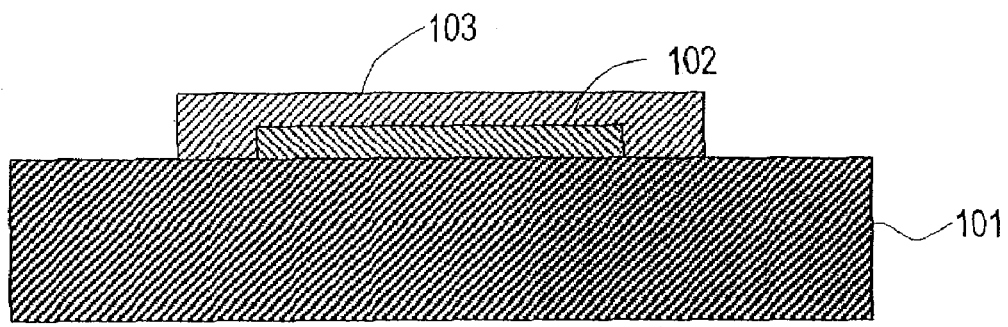
FIG. 1A is a sectional view of a step illustrating a conventional method of fabricating an electronic device.
Figure 1B:
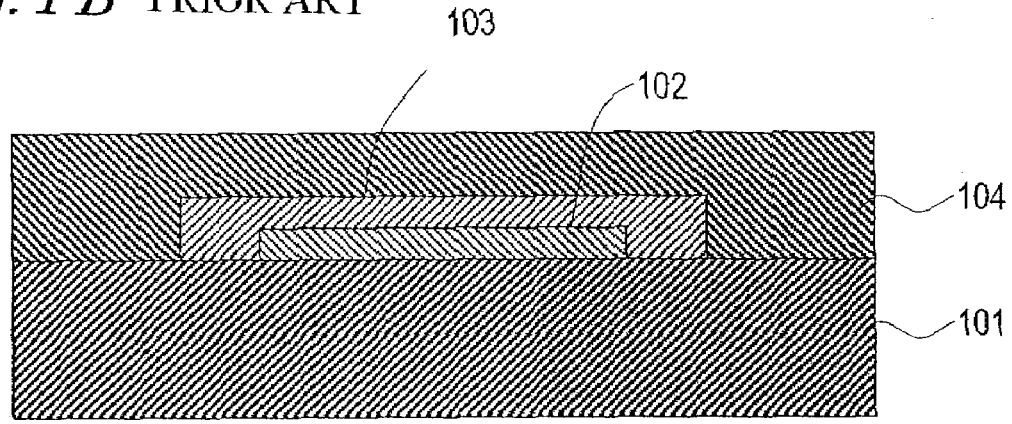
FIG. 1B is a sectional view of a step illustrating the conventional method of fabricating an electronic device.
Figure 1C:
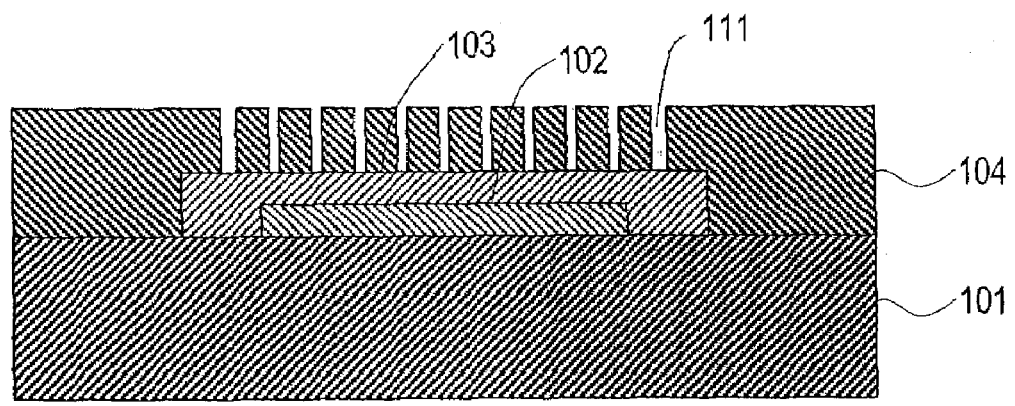
FIG. 1C is a sectional view of a step illustrating the conventional method of fabricating an electronic device.
Figure 1D:
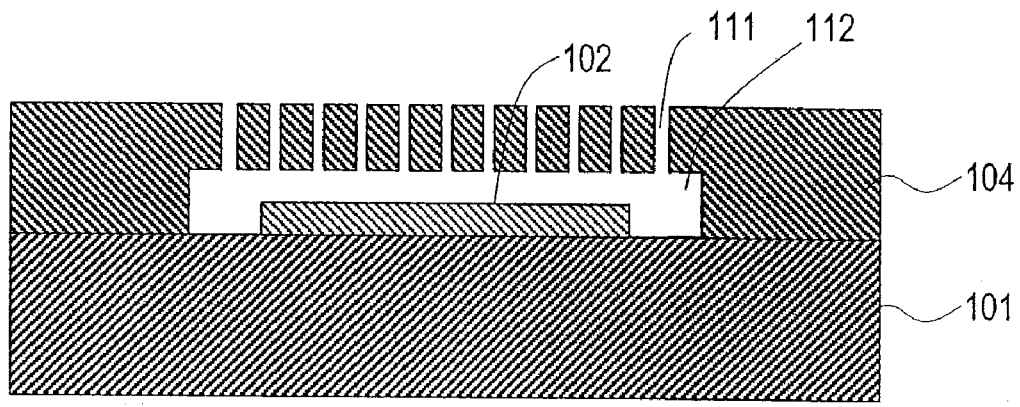
FIG. 1D is a sectional view of a step illustrating the conventional method of fabricating an electronic device.
Figure 1E:
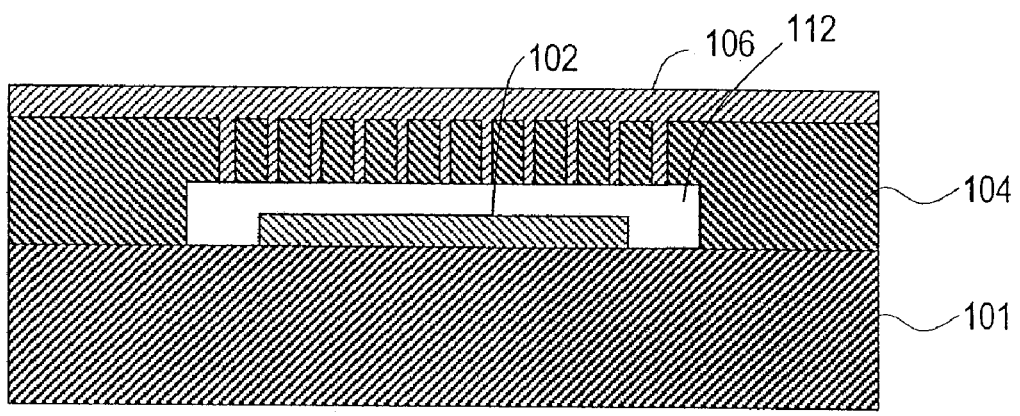
FIG. 1E is a sectional view of a step illustrating the conventional method of fabricating an electronic device.
Figure 1F:
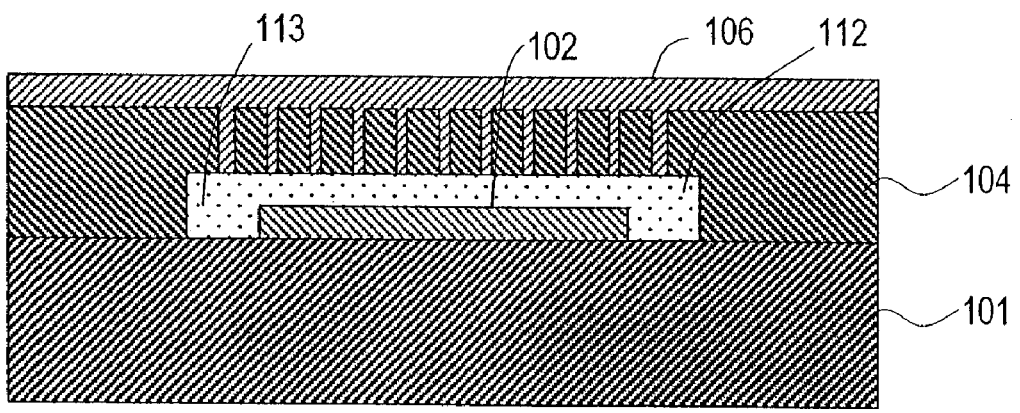
FIG. 1F is a sectional view of a step illustrating the conventional method of fabricating an electronic device.
Figure 2:
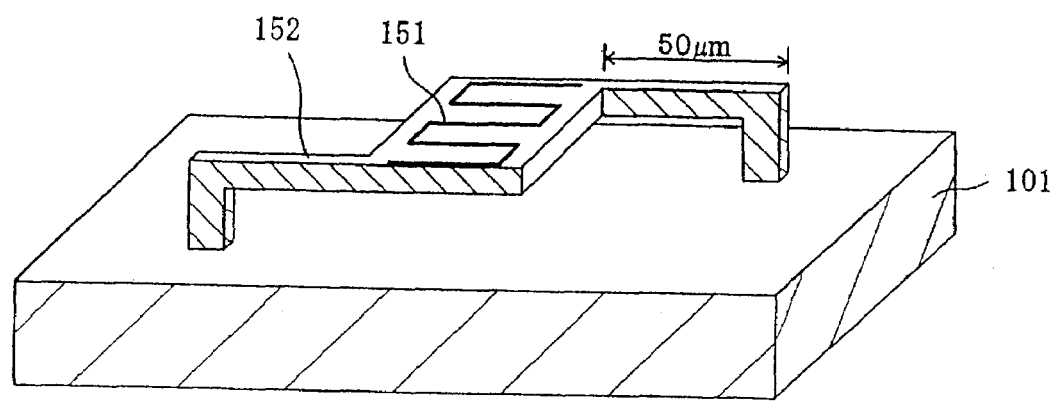
FIG. 2 is a perspective view illustrating a configuration in the vicinity of a detecting unit of a bolometer-type infrared sensor.

As first means, in the case of the resistive element 151 shown in FIG. 2, the etching hole is disposed in such a manner that the etching hole and the resistive element 151 are not overlapped on the passage of the infrared rays, as less as possible. In the infrared sensor, the infrared rays converged by a lens or the like are incident on the detecting unit, so that it is sufficient that metals do not exist in a position blocking the passage of the infrared rays. Especially when parallel infrared rays are incident on the detecting unit of the sensor in a direction perpendicular to the main face of the substrate, it is sufficient that the resistive element and the etching hole are not overlapped in terms of a plane.

Figure 6:
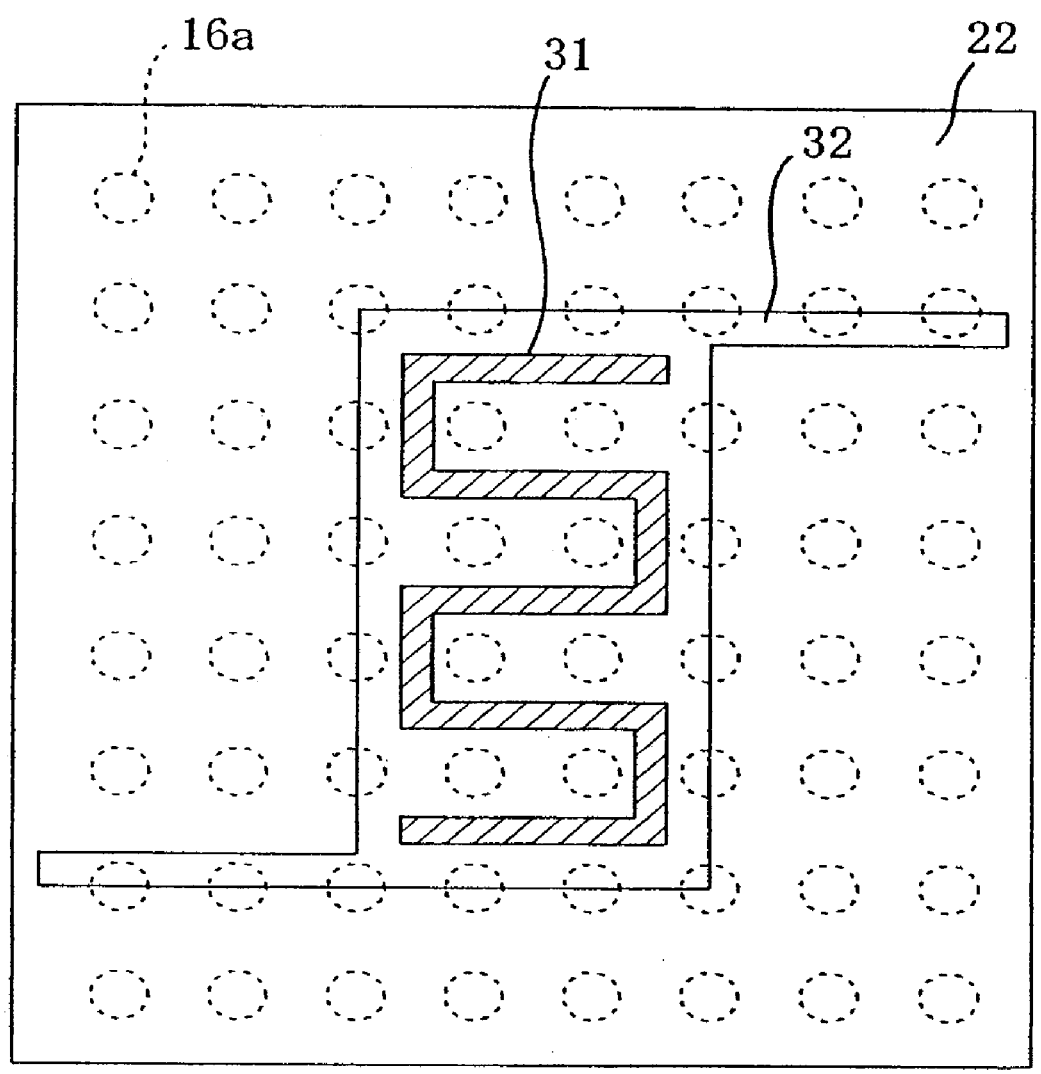
FIG. 6 is a fragmentary cross-sectional view showing a configuration of the interior of a cavity of the electronic device in the second embodiment in the case where first means for preventing the sensitivity of an infrared sensor from being deteriorated is provided.

FIG. 6 is a partial cross-sectional view showing a configuration of an interior of the cavity of the electronic device in the case where such first means is employed. In FIG. 6, only an inner wall surface of the cavity 22 is shown, and diagrammatic representation of an appearance of the polysilicon film surrounding the cavity 22 is omitted. A circle depicted by a dashed line in the figure indicates a metal sealing member 16a for closing the etching hole. As shown in the figure, when the resistive element 31 as the bolometer of the infrared sensor and the supporting member 32 are disposed in the cavity 22, the resistive element 31 and the metal sealing member 16a for closing the etching hole are disposed in such a manner that they do not mutually overlap in an incident direction of the infrared rays. Thus, it is possible to prevent the deterioration in detection sensitivity because of the metal sealing member 16a through which the infrared rays is not transmitted.

As second means, a resistive element as the detecting unit of the infrared sensor is covered with an insulating film such as a thin oxide film to such a degree that the infrared rays can transmit. In such a case, even if metal is deposited thereon, the temperature of the resistive element is increased as the temperature of the metal is increased by absorbing the infrared rays, so that the detection sensitivity is not greatly affected. Therefore, in this case, if the resistive element overlaps the metal film for closing the etching hole, the detection of the infrared rays is calculated by subtracting the amount. Thus, it is considered that unless the metal film is conductive to the resistive element, the metal film does not affect the detection accuracy. In addition, it is considered that, if the metal film for closing the etching hole does not cover about 50% of the planar area of the resistive element when it is viewed from the incident direction of the infrared rays, the detection sensitivity is not so affected.

In the case where the second means is employed, in order to hold the area of the detecting unit of the infrared sensor smaller, and to maintain the detection sensitivity higher, it is preferred that the metal film for closing the etching hole be disposed so as not to cover 10% or more of the planar area of the resistive element when it is viewed from the incident direction of the infrared rays.

Embodiment 3

Figure 7A:
FIG. 7A is a sectional view showing a step before a sacrificial layer is formed in a production process of an electronic device in a third embodiment of the present invention.
Figure 7B:
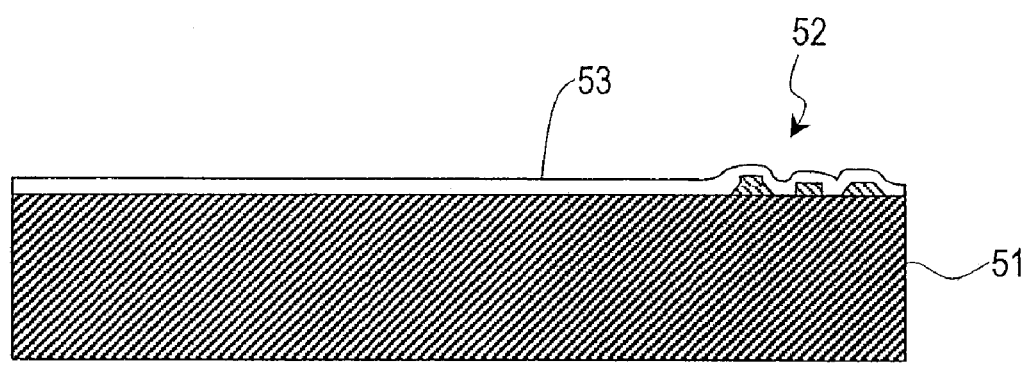
FIG. 7B is a sectional view showing a step before the sacrificial layer is formed in the production process of the electronic device in the third embodiment of the present invention.
Figure 7C:
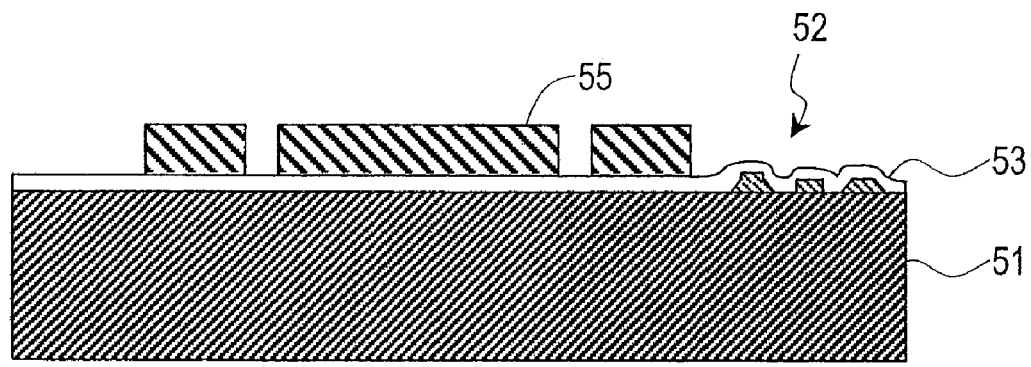
FIG. 7C is a sectional view showing a step before the sacrificial layer is formed in the production process of the electronic device in the third embodiment of the present invention.
Figure 7D:
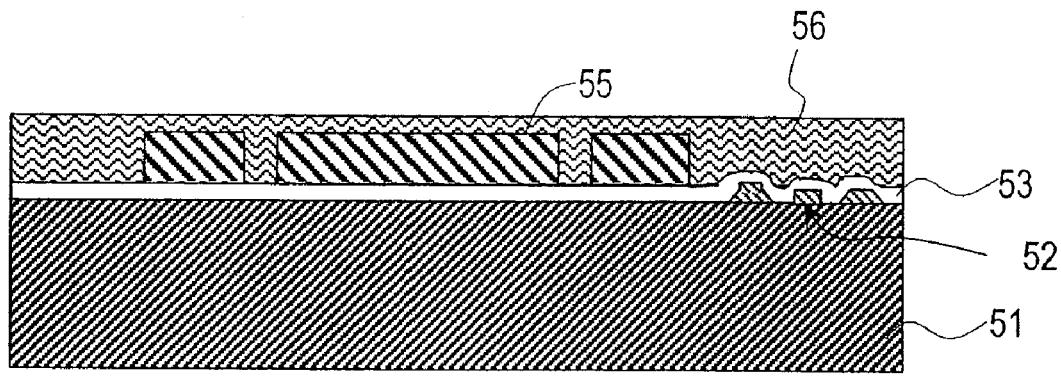
FIG. 7D is a sectional view showing a step before planarization of a BPSG film is performed after the sacrificial layer is formed in the production process of the electronic device in the third embodiment of the present invention.
Figure 7E:
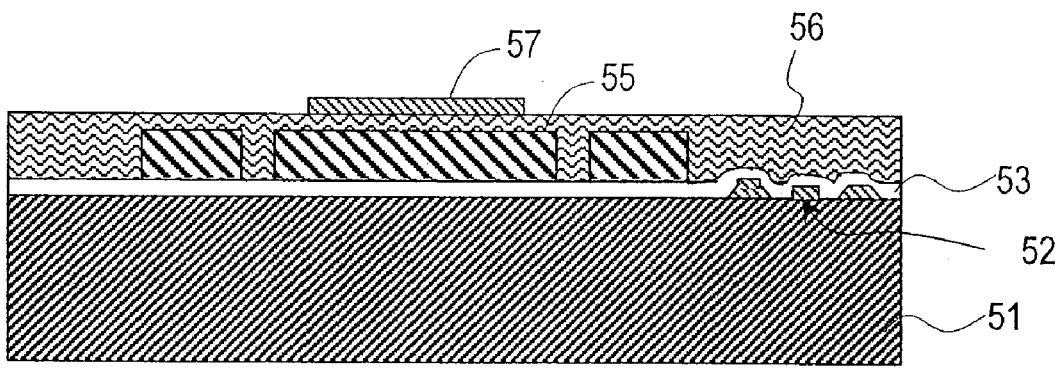
FIG. 7E is a sectional view showing a step before planarization of the BPSG film is performed after the sacrificial layer is formed in the production process of the electronic device in the third embodiment of the present invention.
Figure 7F:
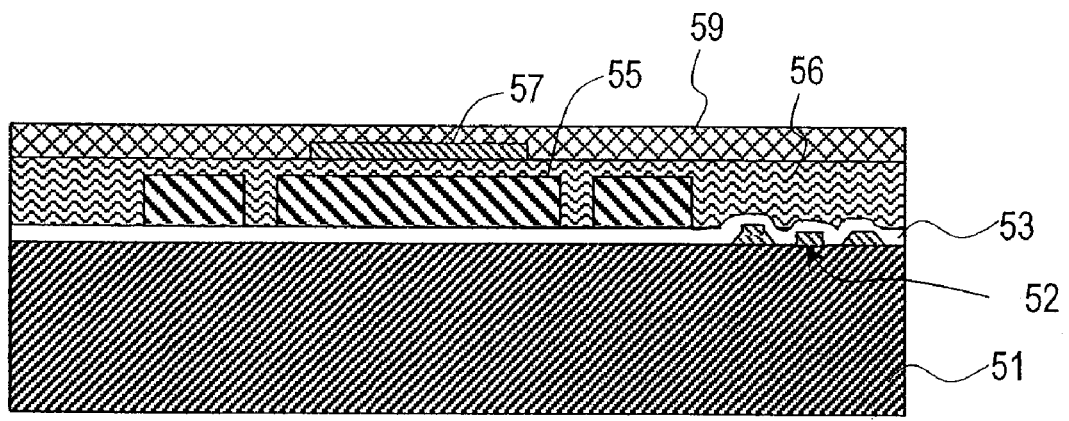
FIG. 7F is a sectional view showing a step before planarization of the BPSG film is performed after the sacrificial layer is formed in the production process of the electronic device in the third embodiment of the present invention.
Figure 7G:
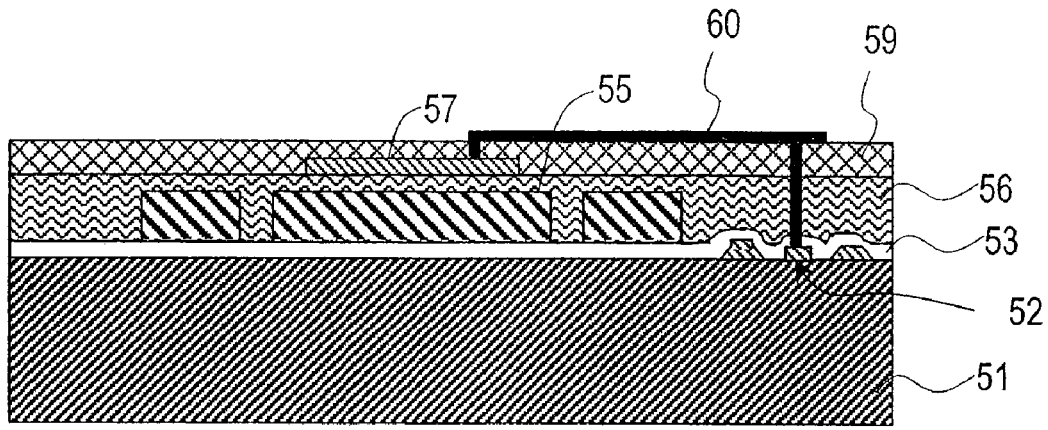
FIG. 7G is a sectional view showing a step before patterning of a protection film and the like is performed after the planarization of the BPSG film is performed in the production process of the electronic device in the third embodiment of the present invention.
Figure 7H:
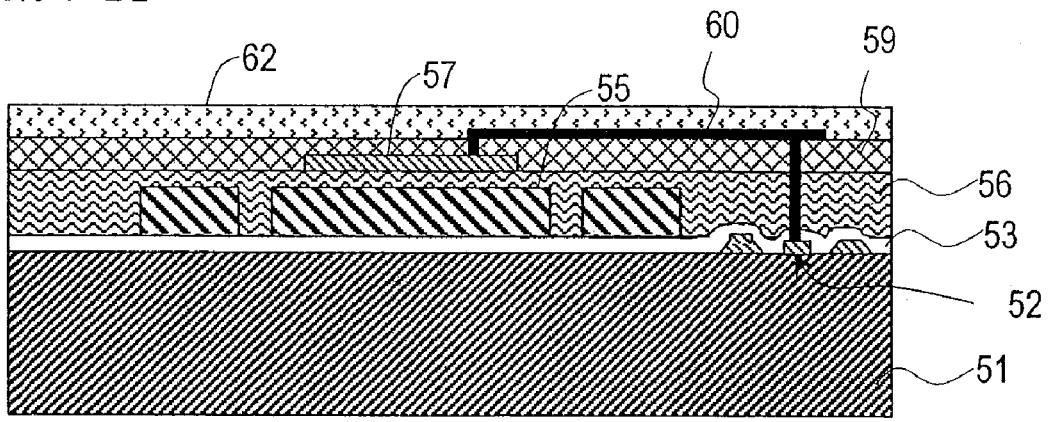
FIG. 7H is a sectional view showing a step before patterning of the protection film and the like is performed after the planarization of the BPSG film is performed in the production process of the electronic device in the third embodiment of the present invention.
Figure 7I:
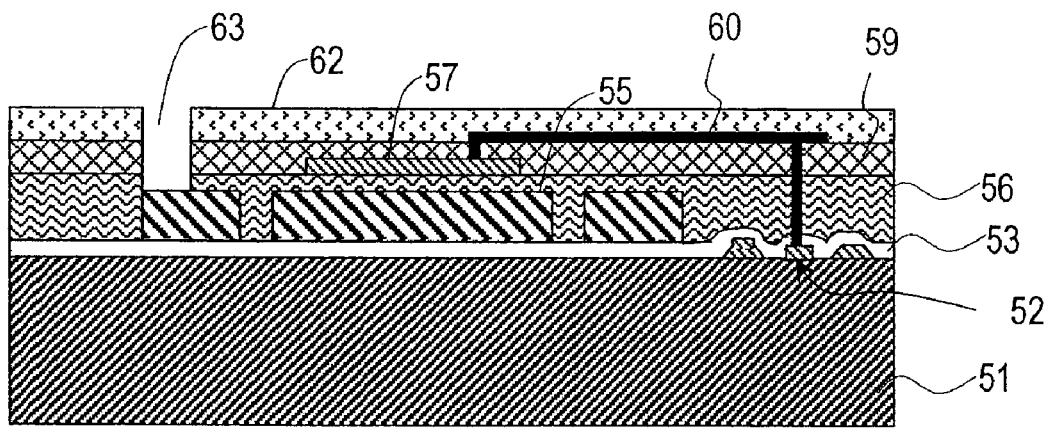
FIG. 7I is a sectional view showing a step before patterning of the protection film and the like is performed after the planarization of the BPSG film is performed in the production process of the electronic device in the third embodiment of the present invention.
Figure 7J:
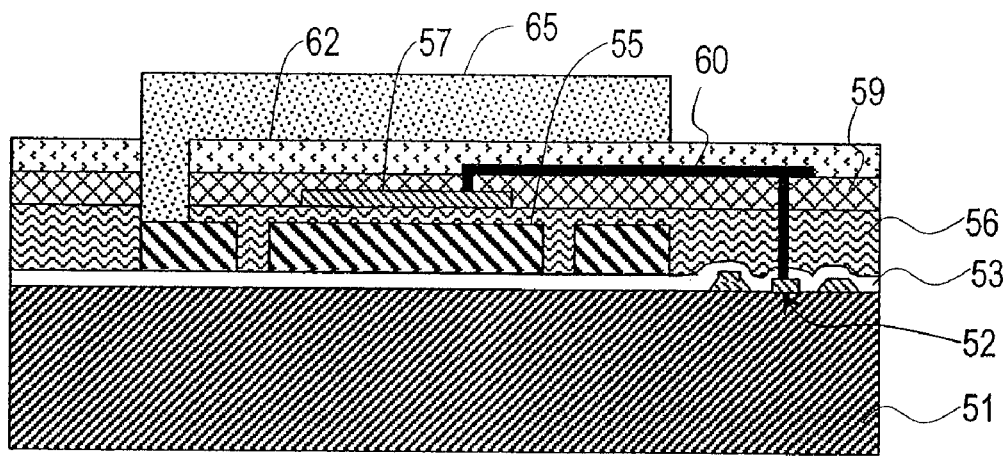
FIG. 7J is a sectional view showing a step before an etching hole is formed after the patterning of the protection film and the like is performed in the production process of the electronic device in the third embodiment of the present invention.
Figure 7K:
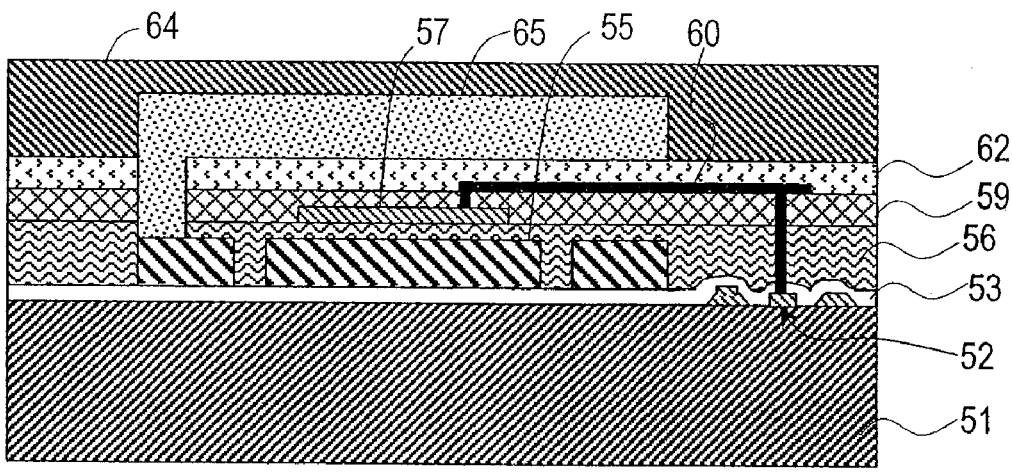
FIG. 7K is a sectional view showing a step before the etching hole is formed after the patterning of the protection film and the like is performed in the production process of the electronic device in the third embodiment of the present invention.
Figure 7L:
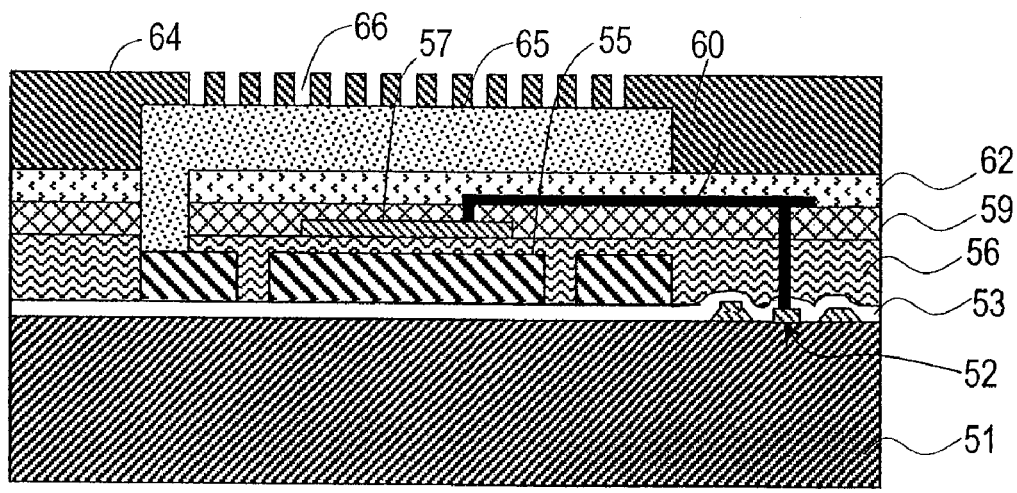
FIG. 7L is a sectional view showing a step before the etching hole is formed after the patterning of the protection film and the like is performed in the production process of the electronic device in the third embodiment of the present invention.
Figure 7M:
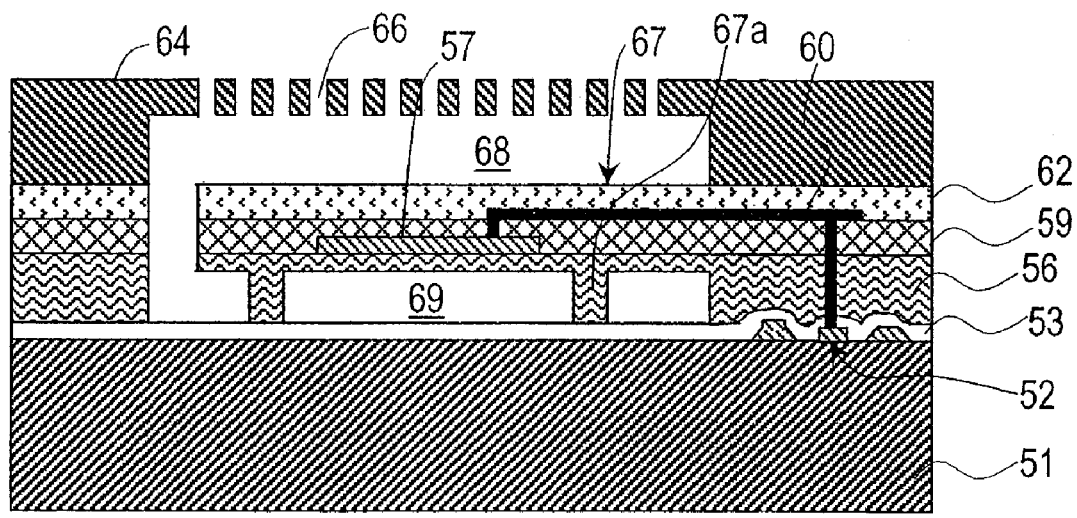
FIG. 7M is a sectional view showing a step before a sealing member by which the etching hole is closed is formed after the etching hole is formed in the production process of the electronic device in the third embodiment of the present invention.
Figure 7N:
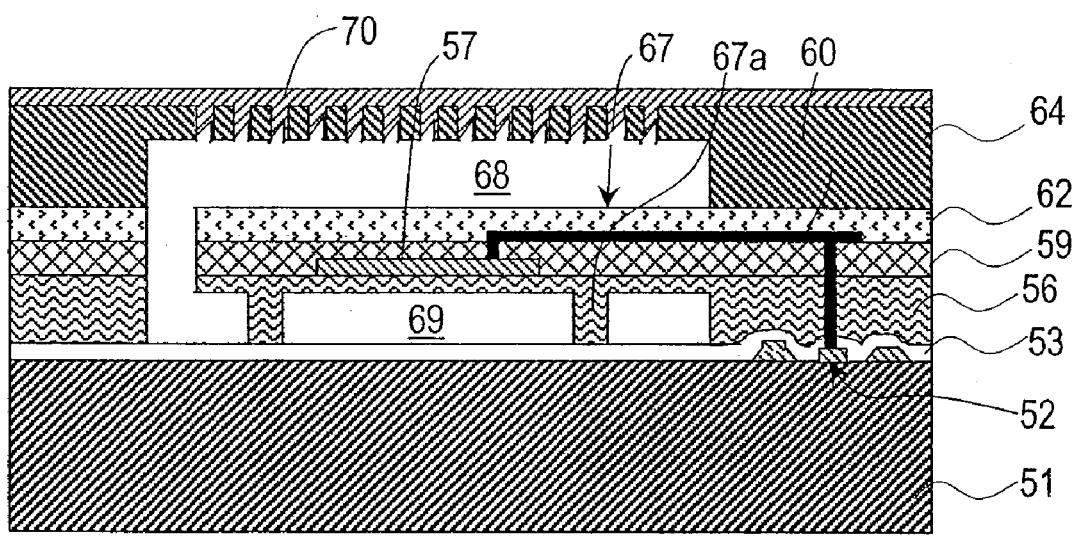
FIG. 7N is a sectional view showing a step before the sealing member by which the etching hole is closed is formed after the etching hole is formed in the production process of the electronic device in the third embodiment of the present invention.

With reference to FIGS. 7A to 7N, a third embodiment according to the present invention will be described. FIGS. 7A to 7C are sectional views showing steps before a sacrificial layer is formed in a production process of an electronic device in this embodiment. FIGS. 7D to 7F are sectional views showing steps before a BPSG film is planarized after the sacrificial layer is formed in the production process of the electronic device according to this embodiment. FIGS. 7G to 7I are sectional views showing steps before a protection film and the like are patterned after the BPSG film is planarized in the production process of the electronic device according to this embodiment. FIGS. 7J to 7L are sectional views showing steps before etching holes are formed after the protecting film and the like are patterned in the production process of the electronic device according to the embodiment. FIGS. 7M and 7N are sectional views showing steps before a sealing member for closing the etching holes are formed after the etching holes are formed in the production process of the electronic device according to this embodiment.

Herein a method of fabricating a bolometer-type infrared sensor is described. Alternatively, this embodiment can be applied to a method of fabricating a sensor of another type.

In a step shown in FIG. 7A, a peripheral circuit portion 52 is formed on a silicon substrate 51. In the peripheral circuit portion 52, a known device such as MOS transistors or diodes are formed.

Next, in a step shown in FIG. 7B, a silicon oxide film 53 which covers the silicon substrate 51 and the peripheral circuit portion 52 is formed by CVD.

In a step shown in FIG. 7c, after a polysilicon film is deposited on the silicon oxide film 53, the polysilicon film is patterned, thereby forming a first sacrifice polysilicon layer 55. The first sacrifice polysilicon layer 55 is removed in a later step, thereby defining the shape of a lower cavity.

In a step shown in FIG. 7D, after a silicon oxide film 56 which covers the entire of the substrate 51 is formed by CVD, an upper face of the silicon oxide film 56 is planarized. The planarization is performed by a method of CMP, etching back, or the like.

In a step shown in FIG. 7E, after a polysilicon film is deposited on the silicon oxide film 56, and then patterned, thereby forming a resistive element 57 functioning as a bolometer. The resistive element 57 has the same planar shape as that of a resistive element 31 shown in FIG. 11. As the resistive element 57, a metal of titan (Ti) or the like may be used, instead of polysilicon.

In a step shown in FIG. 7F, a BPSG (borophosphor silicate glass) film 59 which covers the silicon oxide film 56 and the resistive element 57 is deposited. Thereafter, planarization is performed by reflow. The BPSG film 59 is disposed so as to electrically insulate the Al wiring from the peripheral circuit portion 52 and the resistive element 57. For this reason, instead of the BPSG film 59, another insulating film can be used.

Next, in a step shown in FIG. 7G, contact holes which reach the device of the peripheral circuit portion 52 and the resistive element 57, respectively, are formed through the BPSG film 59. Thereafter, an Al alloy film is deposited in the interior of each of the contact holes and on the BPSG film 59. Then, the Al alloy film is patterned, so as to form Al wiring 60 for connecting the resistive element 57 to the device of the peripheral circuit portion 52.

In a step shown in FIG. 7H, a protecting film 62 of silicon nitride which covers the Al wiring 60 and the BPSG film 59 is formed.

Figure 8:
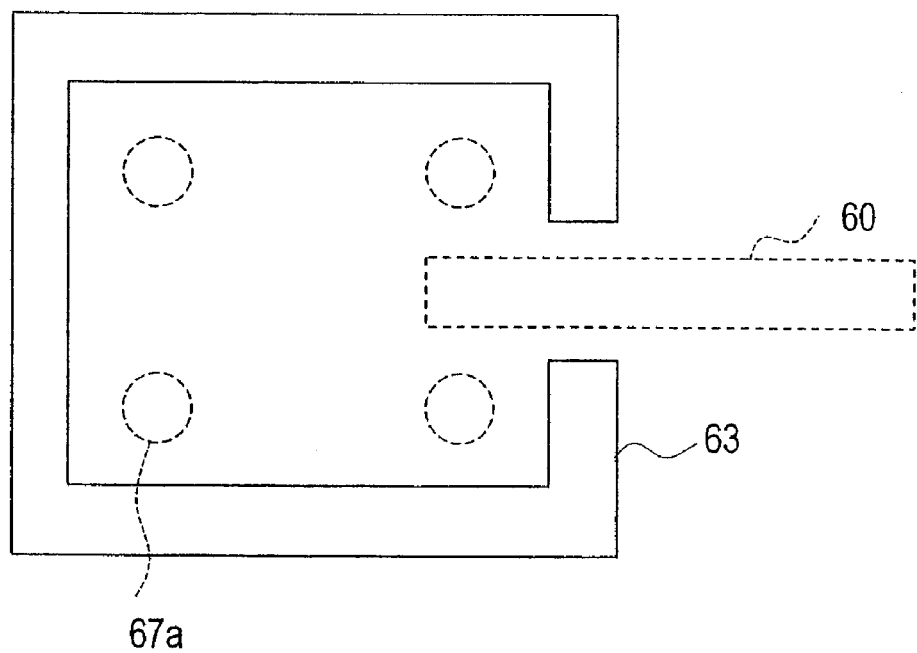
FIG. 8 is a planar layout view showing a groove 63 in FIG. 12l.

In a step shown in FIG. 7I, a groove 63 is formed through the protecting film 62, the BPSG film 59, and the silicon oxide film 56, and the groove 63 reaches the first sacrifice polysilicon layer 55. The planar layout of the groove 63 at this time is shown in FIG. 8. The groove 63 is formed so as not to run across the Al wiring 60.

In a step shown in FIG. 7J, a polysilicon film is deposited in the hole 63 and on the protecting film 62. Thereafter the polysilicon film is patterned, thereby forming a second sacrifice polysilicon layer 65 having a thickness of about 1 μm. The second sacrifice polysilicon layer 65 is removed later together with the first sacrifice polysilicon layer 55, thereby defining the shape of an upper cavity.

In a step shown in FIG. 7K, a silicon oxide film 64 having a thickness of about 2 μm is deposited by CVD so as to cover the second sacrifice polysilicon layer 65 and the protecting film 62. Thereafter, the upper face of the silicon oxide film 64 is planarized by CMP or other techniques.

In a step shown in FIG. 7L, a number of etching holes 66 are formed through the silicon oxide film 64, and the etching holes 66 reach the second sacrifice polysilicon layer 65. The diameter of an etching hole 66 is 0.3 μm or more, for example.

In a step shown in FIG. 7M, a $CF_4$ gas is introduced to the second sacrifice polysilicon layer 65 and the first sacrifice polysilicon layer 55 through the etching holes 66, so as to remove the first and second sacrifice polysilicon layers 55 and 56. As the result of this treatment, an upper cavity 68 is formed above the resistive element 57 as an infrared detecting unit of the infrared sensor and the supporting member 67 for supporting this, and a lower cavity 69 is formed below them. Specifically, the resistive element 57 and the substrate 51 are connected only by a supporting column 67a of the supporting member 67, so that the resistive element 57 is almost insulated from the silicon substrate 51.

In a step shown in FIG. 7N, an Al film 70 is deposited in the interior of the etching holes 66 and on an upper face of the silicon oxide film 24 by sputtering in an oblique direction with respect to the substrate 51. At this time, the sputtering is performed under a pressure of 10 Pa or less. If the pressure exceeds 10 Pa, the heat insulating property in the cavity is insufficient. In the case where the diameter of the etching hole 66 is 0.3 μm, for example, the thickness of the Al film 70 can be set to be 2.0 μm, for example. In order to close the etching hole 66 having a diameter of 0.3 μm, it is necessary that the Al film 70 has a thickness of 1.7 μm or more. In addition, if the diameter of the etching hole 66 is increased, the thickness of the Al film 70 deposited by sputtering is required to be increased accordingly.

According to this embodiment, in the step shown in FIG. 7N, the Al film (the metal sealing member) for closing the etching holes 66 is deposited by sputtering. For this reason, as compared with the case of CVD, the etching holes 66 can be closed under a much lower pressure (a higher vacuum level). Therefore, the vacuum levels of the upper cavity 68 and the lower cavity 69 can be held to be high. Especially when the etching holes are closed by sputtering under a pressure of 5 Pa or less, the pressure of the upper cavity 68 and the lower cavity 69 can be held to be a pressure of 5 Pa or less. As a result, the thermal conductivity from the detecting unit of the sensor disposed between the upper cavity 68 and the lower cavity 69 via surrounding space can be reduced. The detection sensitivity of the sensor can be improved to be about three times as much as the prior art. In addition, it is unnecessary to perform the thermal treatment after the polysilicon film for closing the etching holes is deposited as in the conventional production process. Therefore, the aluminum wiring and the like are not badly affected, and the sensitivity of the sensor can be improved.

Figure 7O:
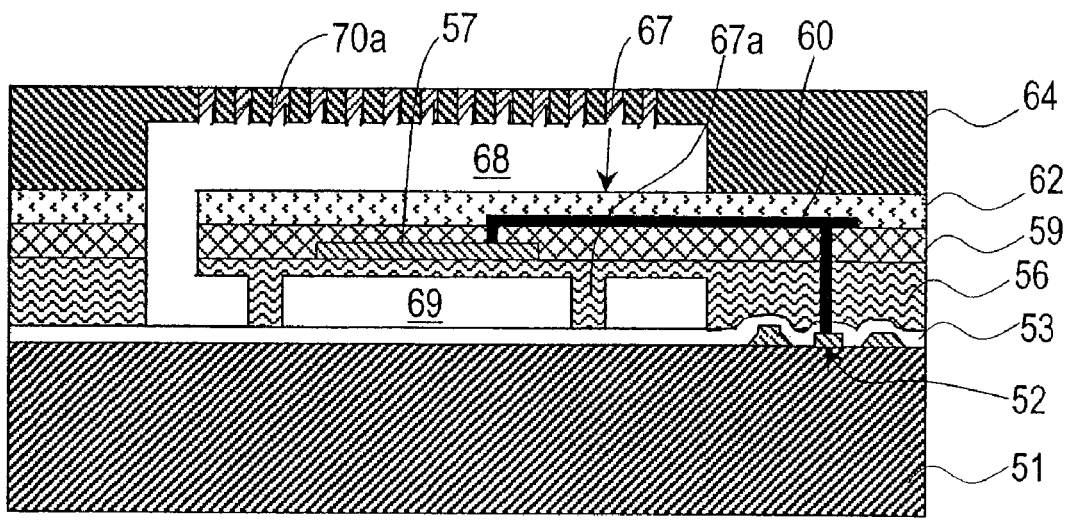
FIG. 7O is a sectional view showing a step before the sealing member by which the etching hole is closed is formed after the etching hole is formed in the production process of the electronic device in the third embodiment of the present invention.

As shown in FIG. 7O, etching back is performed, and the etching holes 66 are closed by a metal sealing member 70a.

In this embodiment, a metal is used for closing the etching holes 66. Thus, there exists almost no polysilicon film which adsorbs a gas or the like in the upper cavity 68 and the lower cavity 69, as in the case of CVD. Therefore, there arises no problem that a residual gas or the like is discharged into the respective cavities 68 and 69 during the use of the electronic device, so that the vacuum level is deteriorated.

In the production process of the infrared sensor of this embodiment, the wall portion for sealing the bolometer (the resistive element 57) of the infrared sensor and the supporting member 67 is constituted by silicon oxide or silicon nitride, and the sacrificial layers are formed from polysilicon, so that the following advantages are attained. When the sacrifice polysilicon layers 55 and 65 are to be etched, a $CF_4$ gas is used. As compared with the polysilicon layer, an etching rate for the oxide film or the nitride film by the $CF_4$ gas is smaller. Therefore, the oxide film and the nitride film (the material constituting the supporting member 67) which support the resistive element 57 as the detecting unit of the infrared sensor are not removed by the $CF_4$ gas. Thus, it is unnecessary to dispose an etch stop layer around the oxide film or the nitride film. Therefore, the process flow in the case where the detecting unit of the infrared sensor is disposed in the cavity is simplified.

In this embodiment, an example in which the $CF_4$ gas is used for etching the sacrifice polysilicon layers 55 and 56 is described. Instead of the $CF_4$ gas, an etchant such as KOH or TMAH, or an etching gas such as XeF may be used. Especially when an etchant is used, it is possible to maintain a high etching selective ratio of the sacrifice polysilicon layers 55 and 56 to the silicon oxide film.

In the step shown in FIG. 7N, it is desired that the sputtering be performed with holding the temperature in the chamber at 400° C. to 500° C. while the Ar gas is introduced into the chamber at a flow rate of 10 to 30 (ml/min). In the case where the temperature in the chamber during the sputtering is less than 400° C., the velocity of reflow of the sputtered Al particles is reduced, and a portion in which the growth speed of Al film is low is generated. Therefore, it takes an extremely long time to close the etching holes. On the other hand, when the temperature in sputtering exceeds 500° C., the temperature badly affects the Al wiring 60 and the like.

In the case where the sputtering in the oblique direction is not performed, the distance between the sputtering target and the substrate is desirably 10 cm or less. In long throw sputtering in which the distance between the sputtering target and the substrate is 10 cm or more, the ratio of metal particles vertically incident on the upper face of the substrate is increased, so that the velocity at which the metal film is deposited on the side wall surface of the etching hole is lowered. Thus, it takes much more time to close the etching hole, and the number of metal particles invaded into the cavity is increased.

For example, in the case where the Ar gas is introduced into the chamber at a flow rate of 10 to 30 (ml/min), the temperature in the chamber is held at 400° C. to 500° C., and the distance between the sputtering target and the substrate is 10 cm or less, a metal film of about 600 nm is deposited on the upper face of the substrate for about 40 seconds, unless the sputtering in the oblique direction is performed. At the same time, the etching holes each having a diameter of 0.3 μm is closed.

In the step shown in FIG. 7N, metals to be sputtered includes, in addition to the aluminum (Al), other metals such as tungsten (W), titanium (Ti), molybdenum (Mo), copper (Cu), tantalum (Ta), barium (Ba), strontium (Sr), platinum (Pt), and rubidium (Rb), and compounds thereof. Any of the metals may be employed.

In a current semiconductor process of 0.13 μm rule, for the sputtering of Cu or Ta, generally, the metal to be sputtered is ionized by generating plasma at a pressure of several Pa, so as to increase the directivity. On the other hand, Al, Ti, or W is sputtered at a low pressure of about 100 mPa. Therefore, in the case where the pressure in the cavity is desired to be held at a low pressure of about 100 mPa, it is preferred that the sputtering of Al, Ti, or W be performed. In the case of a sensor which does not require not so high vacuum such as an infrared sensor, the sputtering may be performed at a pressure of 5 Pa or less. If the sputtering is performed at a pressure of 10 Pa or less, the detection sensitivity of the sensor can be sufficiently improved as compared with the conventional production method.

Also in this embodiment, an optimal range of inclination in the oblique sputtering can be defined similarly to the first embodiment. The shape of the etching hole can be considered similarly to the first embodiment and the modification thereof.

Embodiment 4

Hereinafter a fourth embodiment of the present invention will be described.

In general, step coverage of a thin film deposited by sputtering is not so high. Therefore, in the case where the oblique sputtering is not used, the deposition rate of a metal film on a sidewall of an etching hole is smaller than the deposition rate on an upper face of a substrate. That is, in order to close the etching holes by a metal sealing member, the aspect ratio is preferably larger than 1. However, as the thickness of a silicon oxide film 64 is increased, the amount of absorption of infrared rays by the silicon oxide film 64 is increased. Thus, the sensitivity of the infrared sensor is deteriorated.

Therefore, in order to maintain the sensitivity of the infrared sensor high and to easily close the etching holes by the metal sealing member, it is considered that the size of each etching hole is reduced. However, if the size of each etching hole is reduced, the efficiency in etching a sacrifice polysilicon layer may be disadvantageously degraded. In this modification, a method for improving the efficiency in etching the sacrifice polysilicon layer is described.

Figure 9:
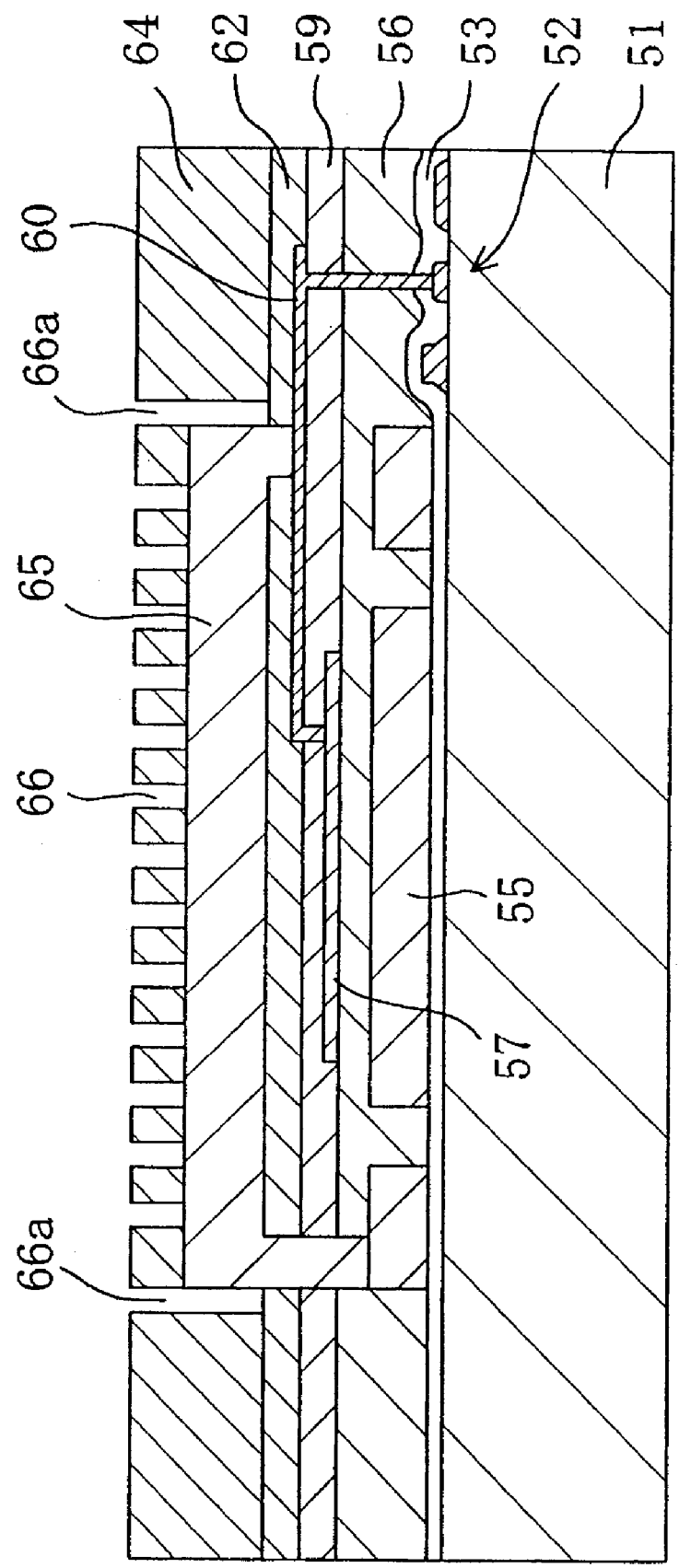
FIG. 9 is a sectional view illustrating an infrared sensor according to a fourth embodiment of the present invention.

FIG. 9 is a view showing a configuration in a step corresponding to the step shown in FIG. 7L of the infrared sensor according to this embodiment. The final configuration of the infrared sensor of this embodiment is almost the same as that of the infrared sensor in the third embodiment shown in FIG. 7O, but is different in the following point.

In this embodiment, in the step shown in FIG. 7L in the third embodiment, when etching holes 66 are formed in a silicon oxide film 64, side etching holes 66a which are in contact with side portions of the second sacrifice polysilicon layer 65 are formed. With the provision of the side etching holes 66a, an etchant is introduced to the second sacrifice polysilicon layer 65 from the side faces thereof. Thus, the etching efficiency of the second sacrifice polysilicon layer 65 is increased. Therefore, if a diameter of each etching hole 66 is reduced, the etching efficiency of the second sacrifice polysilicon layer 65 and the first sacrifice polysilicon layer 55 is not lowered. Therefore, in the case where the thickness of the silicon oxide film 64 is not changed, the etching holes 66 can be rapidly closed by the metal sealing member. Alternatively, the thickness of a portion of the silicon oxide film 64 positioned above the second sacrifice polysilicon layer 65 is reduced, so that the sensitivity of the infrared sensor can be increased.

On the other hand, the side etching holes 66a reach the surface portion of the protecting film 62 through the silicon oxide film 64. Since the side etching holes 66a are not through holes, it is possible to relatively easily close the side etching holes 66a by the metal deposited on both of the bottom face and the side face of the side etching holes 66a in a later step of closing the etching holes 66 by sputtering a metal (the step shown in FIG. 7N). In addition, even if the metal film is deposited on the side face of the upper cavity 65, the metal film does not badly affect the sensitivity and the performance of the sensor such as an infrared sensor. Thus, a diameter of the side etching hole 66a may be larger than that of the other etching holes 66. Instead of the side etching holes 66a, an etching groove may be formed along the side face of the second sacrifice polysilicon layer 65. The side etching holes 66a (or the etching groove) are not required to reach the protecting film 62, but may be formed by digging only an upper portion of the silicon oxide film 64.

Embodiment 5

Hereinafter a fifth embodiment according to the present invention will be described.

This embodiment describes a method in which a step of closing the etching holes after the etching of the sacrifice polysilicon layers is performed by a combination of CVD and sputtering.

Figure 10A:
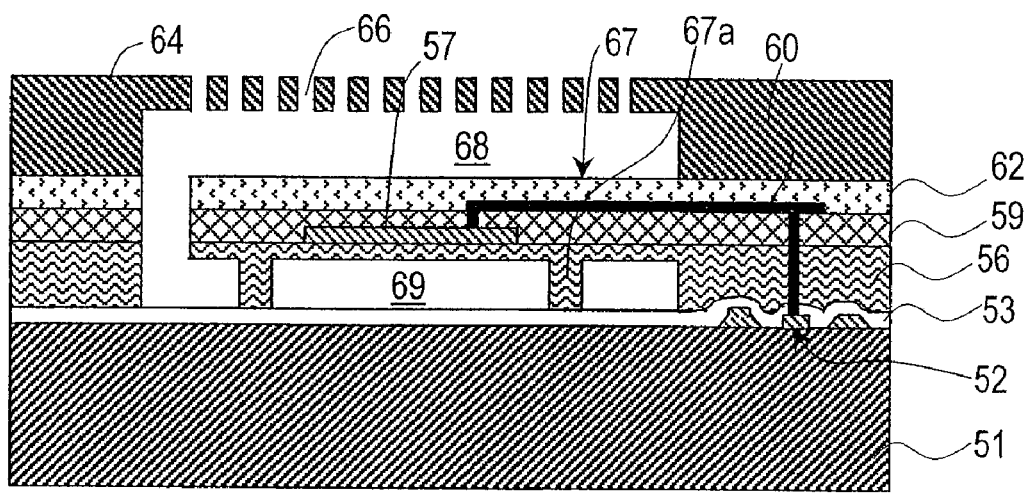
FIG. 10A is a sectional view of a step illustrating a method of fabricating an electronic device according to a fifth embodiment of the present invention.
Figure 10B:
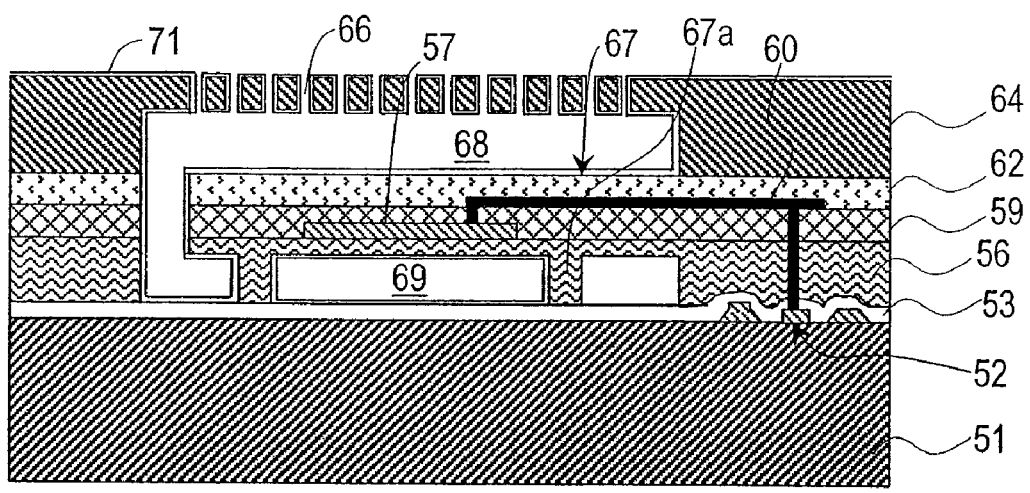
FIG. 10B is a sectional view of a step illustrating the method of fabricating the electronic device according to the fifth embodiment of the present invention.
Figure 10C:
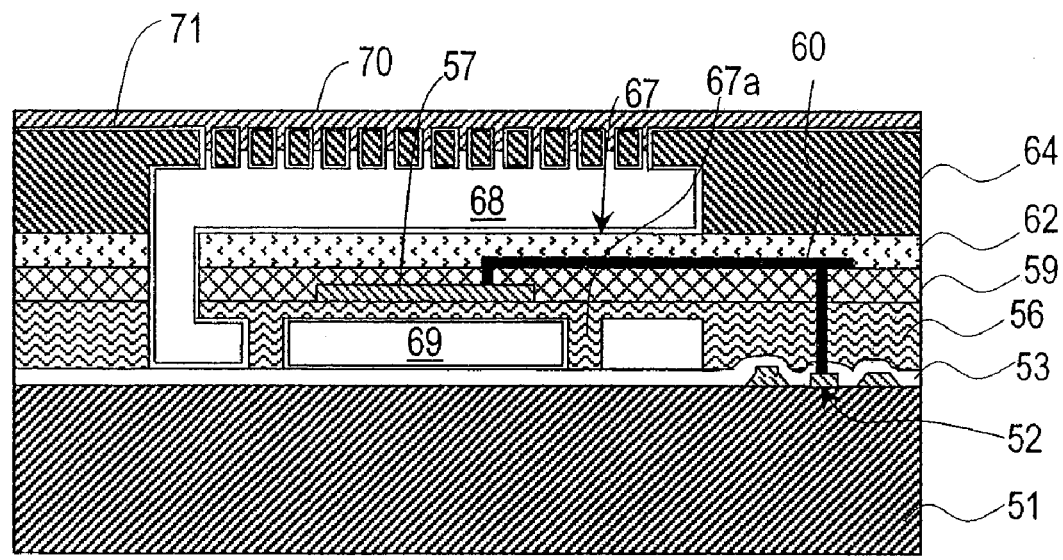
FIG. 10C is a sectional view of a step illustrating the method of fabricating the electronic device according to the fifth embodiment of the present invention.

FIGS. 10A to 10C are sectional view showing production steps corresponding to FIGS. 7M to 7N of an infrared sensor according to this embodiment.

In this embodiment, in the step shown in FIG. 10A, a $CF_4$ gas is introduced to the second sacrifice polysilicon layer 65 and the first sacrifice polysilicon layer 55 through the etching holes 66, thereby removing the first and second sacrifice polysilicon layers 55 and 65. As the result of this treatment, an upper cavity 68 is formed above a resistive element 57 as an infrared detecting unit of the infrared sensor and a supporting member 67 for supporting this, and a lower cavity 69 is formed below them. Specifically, the resistive element 57 and the supporting member 67 are conducted only by a supporting column 67a of the supporting member 67. Thus, the resistive element 57 is almost thermally insulated from a silicon substrate 51.

Next, in the step shown in FIG. 10B, a polysilicon film 71 having a thickness of about 50 nm, for example, is deposited by CVD on an exposed surface. As the result of this treatment, an opening area of the etching hole 66 is reduced.

Next, in the step shown in FIG. 10C, an Al film 70 is deposited by sputtering in the etching holes 66 and on the upper face of the substrate. At this time, the sputtering is performed under a low pressure in the range of 10 Pa or less. By the deposition, the etching holes 66 are closed by the Al film 70.

Diagrammatic representation of succeeding steps is omitted, but similarly to the step shown in FIG. 7O, etching back of the Al film 70 is performed, thereby removing a portion of the Al film 70 positioned above the upper face of the substrate. The metal sealing member is left only in the etching holes 66.

According to this embodiment, in the step shown in FIG. 10A, the first and second sacrifice polysilicon layers 55 and 65 can be rapidly and surely removed by using relatively larger etching holes 66 (a diameter of 0.35 μm, for example).

In the step shown in FIG. 10C, etching holes 66 of which the diameter is reduced (for example, 0.3 μm) can be closed by Al in a shorter period of time. After the step shown in FIG. 10C, an effect that the time required for etching back of the Al film 70 is shortened is attained.

Even if the polysilicon film 71 is deposited on the wall surfaces of the respective cavities 68 and 69 and on the surface of the supporting member 67, the polysilicon film 71 transmits infrared rays, so that the deposition does not affect the sensitivity of the infrared sensor. Alternatively, in the case where a silicon oxide film is deposited instead of the polysilicon film 71, when the thickness is sufficiently thin (about 50 nm, for example), the deposition does not affect the sensitivity of the infrared sensor.

Embodiment 6

Hereinafter a sixth embodiment according to the present invention will be described.

Figure 11:
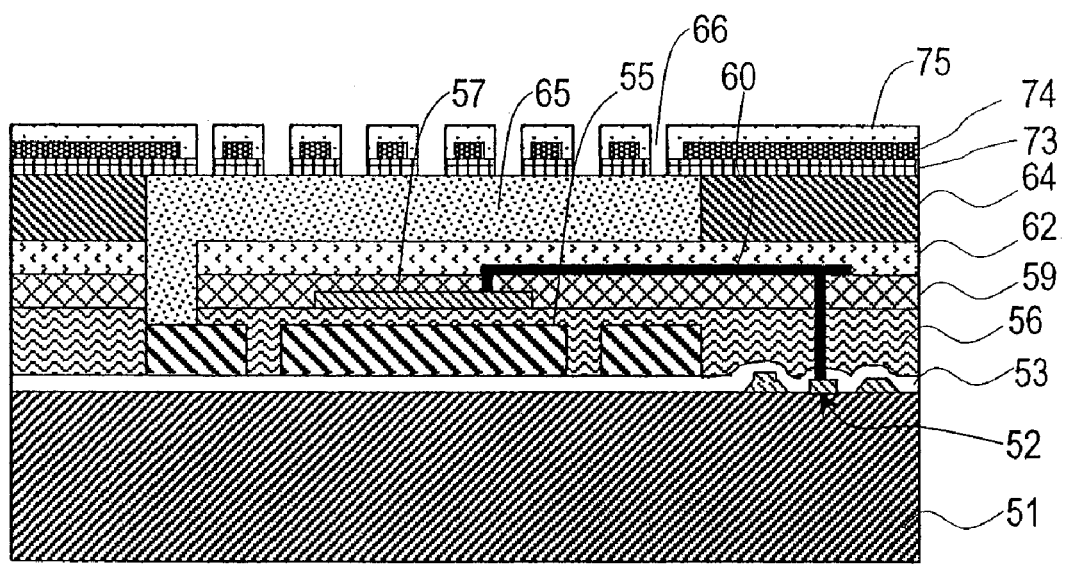
FIG. 11 is a sectional view illustrating a method of fabricating an electronic device according to a sixth embodiment of the present invention.

FIG. 11 is a view showing a configuration in a step corresponding to the step shown in FIG. 7L of an infrared sensor according to this embodiment. The final configuration of the infrared sensor in this embodiment is almost the same as that of the infrared sensor shown in FIG. 7O, but is different in the following points.

In this embodiment, in the step shown in FIG. 7L, after the silicon oxide film 64 is deposited, the silicon oxide film 64 is planarized by CMP or the like until the upper face of the silicon oxide film 64 is at the same level of the upper face of the second sacrifice polysilicon layer 65. Thereafter, on the entire surface of the substrate, a silicon oxide film 73 having a thickness of about 5 nm and a polysilicon film 74 having a thickness of about 500 nm are sequentially deposited by CVD. Thereafter, a relatively large opening having a diameter of about 0.4 μm is formed in the polysilicon film 74. Then, after a silicon oxide film 75 having a thickness of about 50 nm is deposited on the entire surface of the substrate by CVD, portions of the silicon oxide films 75 and 73 corresponding to the positions of the openings of the polysilicon film 74 are removed, thereby forming etching holes 66 which reach the second sacrifice polysilicon layer 65. For example, by the above-described process, the configuration shown in FIG. 11 is formed. By a process which is different from the process as described above, the configuration shown in FIG. 11 can be obtained.

According to this embodiment, the whole of the contour portion surrounding the etching holes 66 when the first and second sacrifice films 55 and 65 are etched is not configured by a silicon oxide film, but the polysilicon film 74 is covered with the silicon oxide films 73 and 75. In this case, the thickness of the silicon oxide film which absorbs the infrared rays is greatly reduced (100 nm in total in this example) as compared with the second embodiment. Thus, it is possible to suppress the deterioration of the sensitivity of the infrared sensor. On the other hand, the periphery of the polysilicon film 74 is covered with the silicon oxide films 73 and 75, so that there is no trouble for etching the first and second sacrifice polysilicon layers 55 and 65.

In the first and second embodiments, and in the respective modifications, examples in which the invention is applied to the infrared sensor are described. The electronic devices to which the present invention is applied include, other than the infrared sensor, a pressure sensor, an acceleration sensor, a flow-rate sensor, a vacuum transistor, and the like. The infrared sensor is generally classified into a thermal type such as a bolometer, a pyroelectric-type sensor, and a thermopile, and a quantum type using PbS, InSb, HgCdTe, and the like. Some bolometers utilize the resistance law of polysilicon, Ti, TiON, $VO_x$ or the like. In addition, some utilize a transient property of a forward current of a PN diode or the like. Some thermopiles utilize a Seebeck effect caused in a PN junction. Some pyroelectric-type infrared sensors utilize a pyroelectric effect of a material such as PZT, BST, ZnO, $PbTiO_3$. Some utilize the variation in dielectric constant of these materials. The quantum-type infrared sensor detects a current caused by electronic excitation. For example, there is an infrared sensor having a chromel-alumel thermocouple for detecting infrared rays by Seebeck effect, or the like.

As for the above-mentioned infrared sensors, in order to maintain the detection sensitivity for infrared rays, and the accuracy in detection of the infrared rays high, it is preferred that heat dissipation from the infrared detecting unit be small. The characteristics of such an infrared sensor are improved, when it is sealed in a cap unit in a vacuum atmosphere or in an inert gas atmosphere.

As for the pressure sensor and the acceleration sensor, it is known that the sensitivity thereof is increased by reducing the viscous resistance of the air, so that the characteristics are improved when it is sealed in a cap unit in a vacuum atmosphere or an inert gas atmosphere.

In the above-described respective embodiments, a metal sealing member of Al is used as the sealing member for the present invention. Alternatively, it is possible to use metals other than Al, or conductive materials which can be sputtered such as polysilicon as the sealing member of the present invention.

Embodiment 7

Hereinafter with reference to the drawings, a seventh embodiment according to the present invention will be described.

An electronic device of this embodiment is an image sensor in which both of infrared detecting units and visible-light detecting units are integrated on one and the same substrate. An exemplary configuration of an image sensor provided with infrared detecting units and visible-light detecting units is disclosed in Japanese Laid-Open Patent Publication No. 2003-17672, for example.

By arranging both of the infrared detecting units and the visible-light detecting units on one and the same substrate by using a semiconductor process, the production cost can be reduced, and the device can be miniaturized. In the case where an image sensor for infrared rays and an image sensor for visible light are disposed on separate substrates, it is necessary to perform optical alignment accurately, and to correct a deviation between the infrared image and the visible-light image. According to this embodiment in which both are integrated on one and the same substrate (one chip), such problems can be solved.

Figure 12:
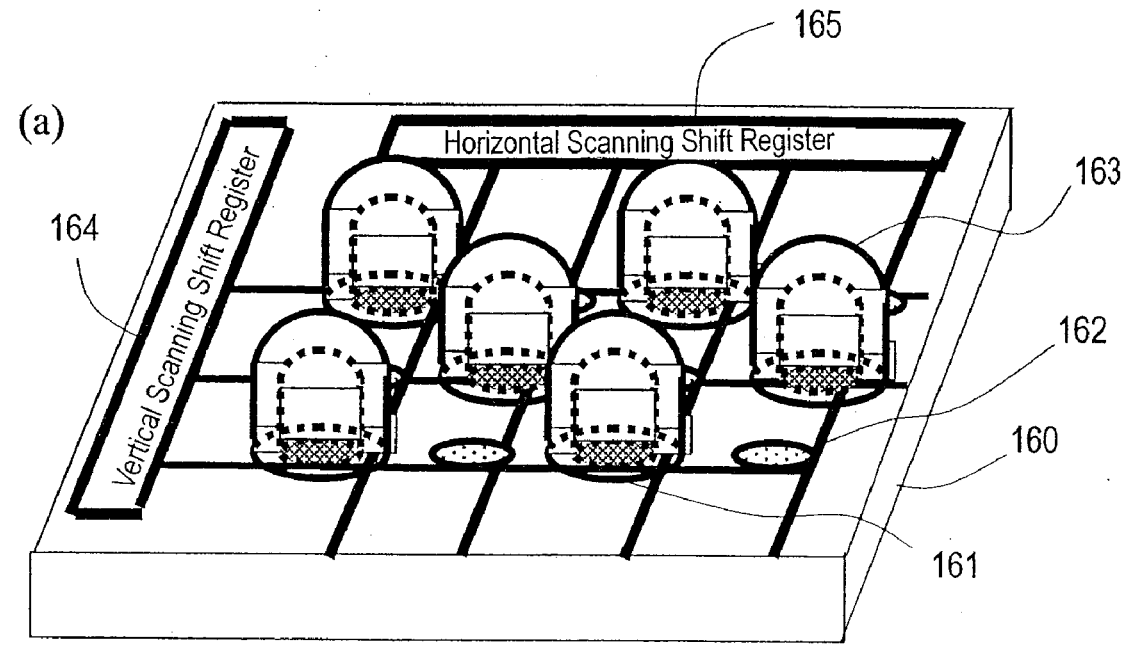
FIG. 12(a) is a perspective view illustrating a seventh embodiment of the present invention.
FIG. 12(b) is an equivalent circuit diagram thereof.
Figure 12:
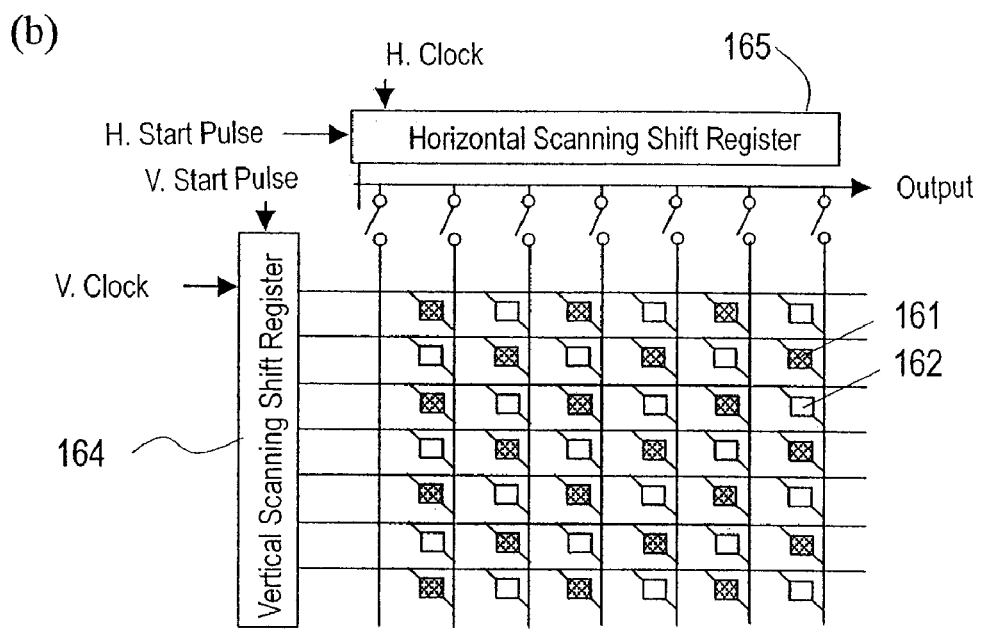

The electronic device of this embodiment includes, as shown in FIGS. 12(a) and (b), a silicon substrate 160, a plurality of infrared detecting units 161 and visible-light detecting units 162 arranged in a matrix (in an array) of rows and columns on the silicon substrate 160, and a reading circuit. The reading circuit is constituted by a vertical scanning register 164 and a horizontal scanning register 165.

The plurality of infrared detecting units 161 arranged on the silicon substrate 160 are covered with individual micro vacuum packages 163, respectively. For easy understanding, in FIG. 12(a), the micro vacuum package 163 is shown as a package member which is different from the above-described cavity formed by using a semiconductor process such as thin-film deposition, photolithography, and patterning technique, but also in this embodiment, the cavity is formed by using the semiconductor process similarly to the above-described embodiments.

FIGS. 12(a) and (b) schematically show the arranged relationships of the respective units, but does not represent precisely the specific shape or scale of the configuration of the actual electronic device. The actual infrared detecting unit 161 is preferably designed to be larger (to have a size of about 50 μm, for example) than the visible-light detecting unit 162 so that a predetermined sensitivity is attained. In the case where the size of the infrared detecting unit 161 is remarkably larger than the size of the visible-light detecting unit 162, a preferred layout for arrangement of the infrared detecting units 161 and the visible-light detecting units 162 is not the same as the layout shown in FIG. 1.

Figure 13:
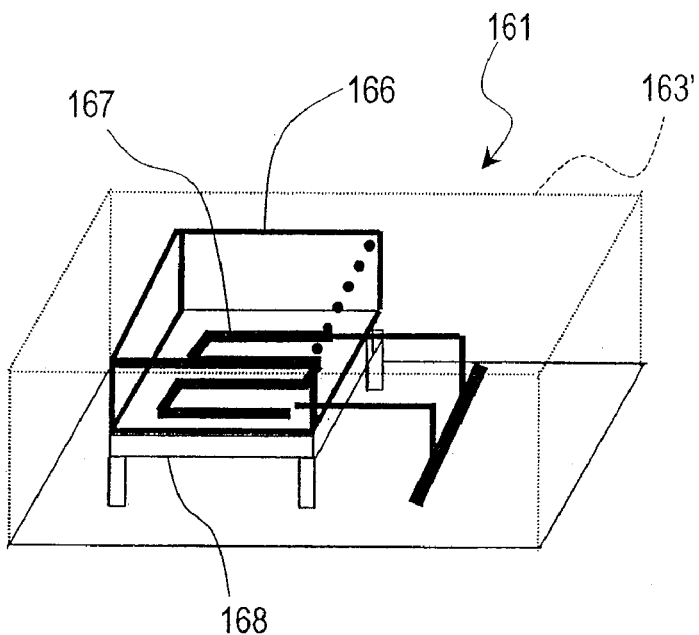
FIG. 13 is a perspective view schematically showing a configuration of an infrared detecting unit in the seventh embodiment of the present invention.

FIG. 13 is a perspective view schematically showing a configuration of a representative example of the infrared detecting unit 161 shown in FIGS. 12(a) and (b). The infrared detecting unit 161 includes an infrared absorbing portion 166, a micro heater 167, and a micro heater supporting portion 168, and these are formed inside a cavity 163'.

The micro heater 168 is a resistive element formed from a resistivity-changeable material, and the micro heater 168 has two functions in this embodiment. The first function is a function of detecting a temperature based on resistance variation. The second function is a function of generating heat by Joule heat. As described later, by means of the temperature detecting function of the micro heater 167, the incident amount of the infrared rays is detected, and by means of a combination of the heat generating function and the temperature detecting function of the micro heater 167, the vacuum level (the pressure) in the cavity can be detected.

The micro heater 167 can be formed from a semiconductor such as silicon, a metal oxide such as TiO (titania) or $VO_x$ (vanadium oxide), or a metal such as Ti (titanium) or PT (platinum), or a metal silicide thereof. These materials are known as material having large coefficient of resistance law, and can attain a superior temperature detecting function. An impurity such as B, As, Sr, or Cu may be doped into the material. For example, as for polysilicon doped with B or TiO doped with Sr, an electric resistance value can be controlled to be an appropriate value by adjusting the impurity doping level.

Figure 14:
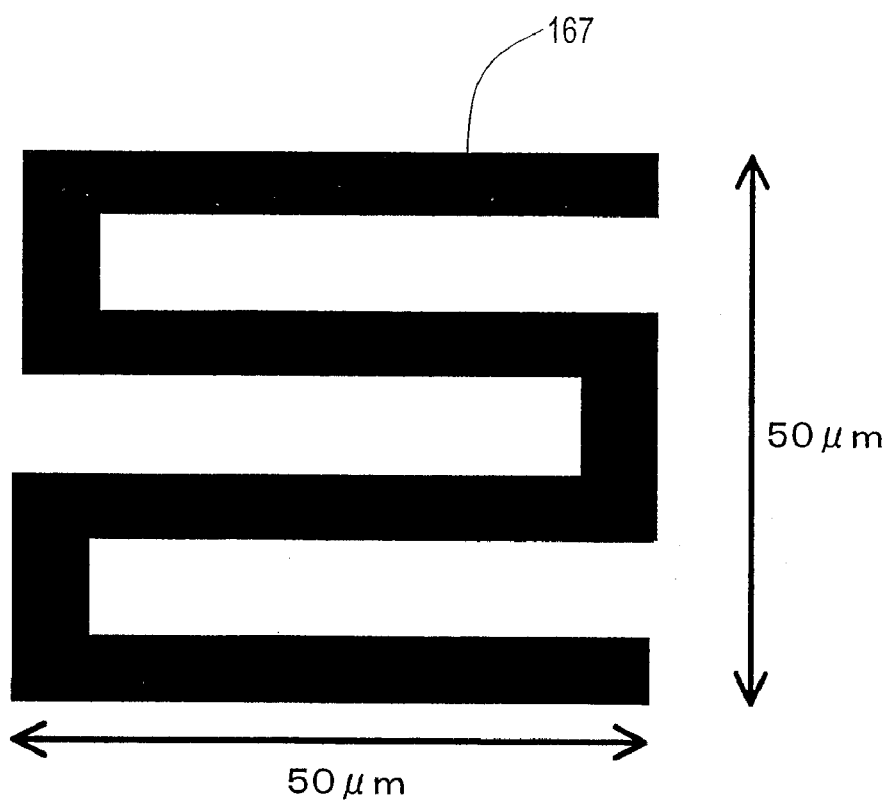
FIG. 14 is a plan view showing an exemplary layout of a micro heater 167.

A planar size of the micro heater 167 in the preferred embodiment is a size falling in a rectangular area of 1 mm×1 mm. A preferred example of the planar layout of the micro heater 167 includes a meandering pattern included in a rectangular area of 50 μm×50 μm, as shown in FIG. 14, so that a relatively long pattern of resistive element is formed in a relatively small area to be occupied.

The micro heater 162 in this embodiment is held, as shown in FIG. 13, by the micro heater supporting portion 168 in a position (a position higher by 1 μm, for example) distant from the surface of the silicon substrate 160 (FIG. 12(a)).

If the position of the rectangular region for defining the planar size of the micro heater 167 exceeds 1 mm, the distortion caused in the micro heater 167 is increased. Therefore, it is necessary to further increase the distance between the micro heater 167 and the substrate 160. If the micro heater 167 is designed to be larger, the electronic device cannot be miniaturized. Therefore, it is preferred that the micro heater 167 be designed to have a size falling in a rectangular region of 1 mm×1 mm. Such a small micro heater 167 is obtained by, after a thin film of a material exhibiting the above-described functions is deposited by thin film deposition technique, patterning the thin film so as to have a desired shape by photolithography and etching techniques. The thickness of the thin film is set in the range of 50 nm to 1 μm, for example.

The infrared absorbing portion 166 is formed from a material which can absorb infrared rays, for example, $SiO_2$. When the infrared detecting unit 166 formed from such a material receives the irradiation of infrared rays, it generates heat by absorbing the infrared rays. As a result, the temperature of the infrared absorbing portion 166 is increased, and accordingly the temperature of the micro heater 167 is increased. Since the micro heater 167 is formed from a resistivity-changeable material, the electric resistance is varied as the rise of temperature. The variation in electric resistance is read and sensed by a readout circuit (a vertical scanning register 164 and a horizontal scanning register 165) shown in FIGS. 12(a) and (b), thereby knowing irradiation amount of infrared rays.

The micro heater supporting portion 168 separates the micro heater 167 from the surface of the substrate by means of an insulator patterned as a small column having a relatively small sectional area as compared with the length thereof, as shown in FIG. 13. The thermal conductivity of the micro heater supporting portion 168 is low, and a thermal conductance between the micro heater 167 and the substrate 160 is low. Therefore, it is possible to increase the amount of rise in temperature of the micro heater 167 when the infrared rays are incident, so that the detection sensitivity for infrared rays is improved.

Figure 15:
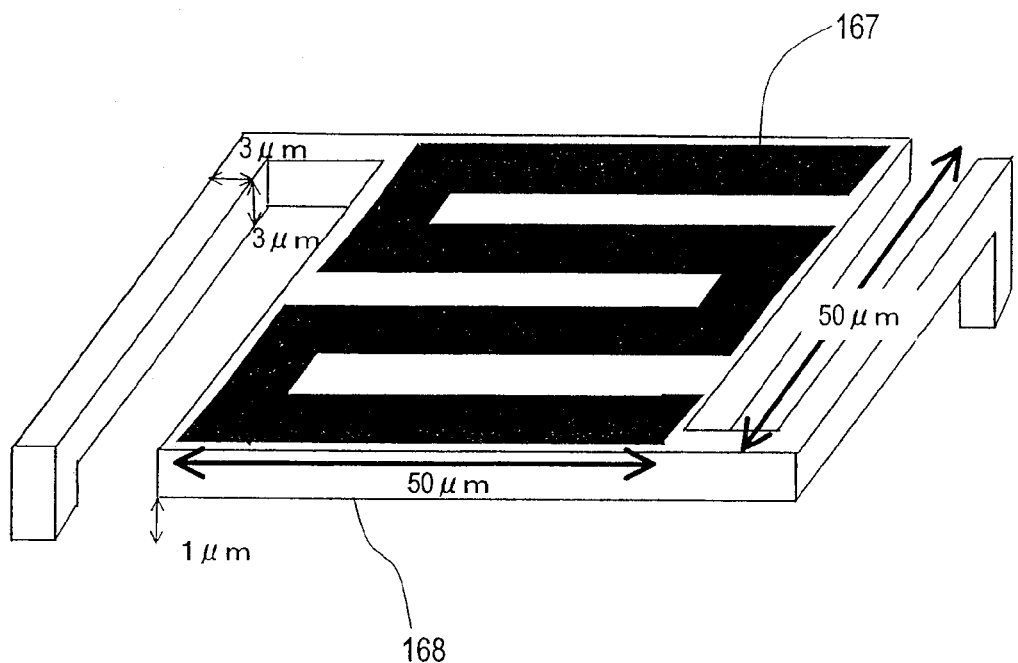
FIG. 15 is a perspective view showing an exemplary configuration of a micro heater supporting unit 168.

The thermal conductance between the micro heater supporting portion 168 and the substrate 160 can be previously obtained by calculation, when the shape and the material of the micro heater supporting portion 168 are determined. For example, as shown in FIG. 15, the micro heater supporting portion 168 has a square plate shape having a side of about 50 μm supported by two columns each having a sectional area of 3×3 μm$^2$ and a length of about 50 μm, and is formed from $Si_3N_4$, the thermal conductance is calculated to be $3×10^{-7}$ W/K. The small micro heater supporting portion as shown in FIG. 15 can be produced by using the technique of MEMS (Micro Electro Mechanical Systems).

The visible-light detecting unit 162 shown in FIGS. 12(a) and (b) is constituted by a photodiode, for example, and can detect the amount of incident visible light by measuring a current or a voltage generated in accordance with the amount of incident visible light. The visible-light detecting unit 162 in this embodiment is preferably formed by doping a selected region of the surface of the silicon substrate 160 with an impurity. The visible-light detecting unit 162 can be formed by a step of forming a readout circuit on the silicon substrate, or a step before or after the step of forming the readout circuit. The visible-light detecting unit 162 is formed before a manufacturing step of the infrared detecting unit 161 in a preferred embodiment.

In this embodiment, the infrared detecting unit 161 and the visible-light detecting unit 162 are formed on one and the same silicon substrate by the semiconductor process, so that it is possible to provide an image sensor which is formed in one chip for infrared rays and visible light at a low cost.

The intensities of infrared rays and visible light incident on the infrared detecting unit 161 and the visible-light detecting unit 162, respectively, are converted into electric signals in the corresponding detecting units. The electric signals are sequentially read out by readout circuits (164, 165). The infrared detecting units 161 and the visible-light detecting units 162 are arranged in a matrix on one and the same substrate, so that electric signals corresponding to an infrared image and a visible light image can be obtained. An imaging method by light detecting units arranged in a matrix is disclosed in detail in Japanese Laid-Open Patent Publication No. 11-326037, for example.

The micro vacuum package portion in this embodiment covers individual infrared detecting units 161 and the interior thereof is maintained in a condition of a reduced pressure (about 50 mTorr, for example). By lowering the pressure of the atmospheric gas of the infrared detecting units 161, the thermal conductance between the micro heater 167 and the substrate 160, and the thermal conductance between the micro heater 167 and the exterior atmosphere can be reduced and the detection sensitivity for infrared rays can be improved.

Each vacuum package can take various forms. For example, as shown in FIG. 15, the package includes an internal space having a size capable of including the micro heater supporting portion 168. The height of the internal space can be set to be about 3 to 1000 μm, for example.

The micro vacuum package portion can be generally fabricated by a method disclosed in Japanese Laid-Open Patent Publication No. 11-326037. Specifically, the micro vacuum package portion can be fabricated by forming annular joining faces of metal, for example, on opposed faces of a cap unit and a substrate which are previously prepared, and then by joining the joining faces by pressure in a high vacuum. However, when a cavity is formed by the semiconductor process (thin-film deposition, photolithography, etching, and the like), the production cost can be reduced, and the device can be miniaturized.

(Method of Detecting the Vacuum Level)

Next, an exemplary method of detecting an internal pressure (the vacuum level) of the micro vacuum package in this embodiment will be described.

Since the micro heater 167 in this embodiment is formed from a resistivity-changeable material as described above, the electric resistance of the micro heater 167 is varied depending on the temperature. Therefore, if the electric resistance of the micro heater 167 is measured by causing a current to flow from the external to the micro heater 167, the temperature of the micro heater 167 can be obtained.

On the other hand, an electric resistance (a value at a predetermined temperature) and a current of the micro heater 167 are measured in a condition where it is not irradiated with infrared rays. By using the measured values of the electric resistance and the current, an amount of heat generation Q per unit time from the micro heater can be calculated from Joule's law. That is, when the measured electric resistance of the micro heater 167 is represented by R (ohm), and a current flowing through the micro heater 167 is represented by I (ampere), Q can be calculated by using the following expression:

$$Q=I^2R \text{ (watt)}.$$

Therefore, when the current I and the electric resistance R flowing through the micro heater 167 are measured, the amount of heat generation Q from the micro heater 167 can be known. At this time, the temperature of the micro heater 167 in a condition where a current is caused to flow to the micro heater 167 is represented by T, the temperature of the substrate 160 is represented by T0, and the thermal conductance between the micro heater 167 and the exterior is represented by g, the following relationship expression is established:

$$(T-T0) \times g = Q.$$

The thermal conductance g between the micro heater 167 and the exterior is, as shown below, a sum of the thermal conductance $g_S$ relating to the heat flowing through the micro heater supporting portion 168 and the thermal conductance $g_A$ relating to the heat flowing through the atmospheric gas in the inside the vacuum package.

$$g = g_S + g_A$$

From the above two expressions, the following relationship expression is obtained.

$$(T-T0) \times (gS+GA) = Q$$

When the expression is transformed, the following expression is obtained.

$$gA = Q/(T-T0) - gS$$

Among the parameters of the right side of this expression, Q is calculated from the current I and the electric resistance R flowing through the micro heater 167. The parameter $g_S$ is a constant which is previously measured, and the substrate temperature T0 can be dealt as a constant of about a room temperature. Therefore, by measuring the temperature T, $g_A$ can be obtained by calculation.

On the other hand, the relationship between the thermal conductance $g_A$ via the atmospheric gas and the pressure of the atmospheric gas can be obtained by simulation or experiments. Therefore, if the thermal conductance $g_A$ via the atmospheric gas is obtained, the pressure inside the micro vacuum package can be known.

Figure 16:
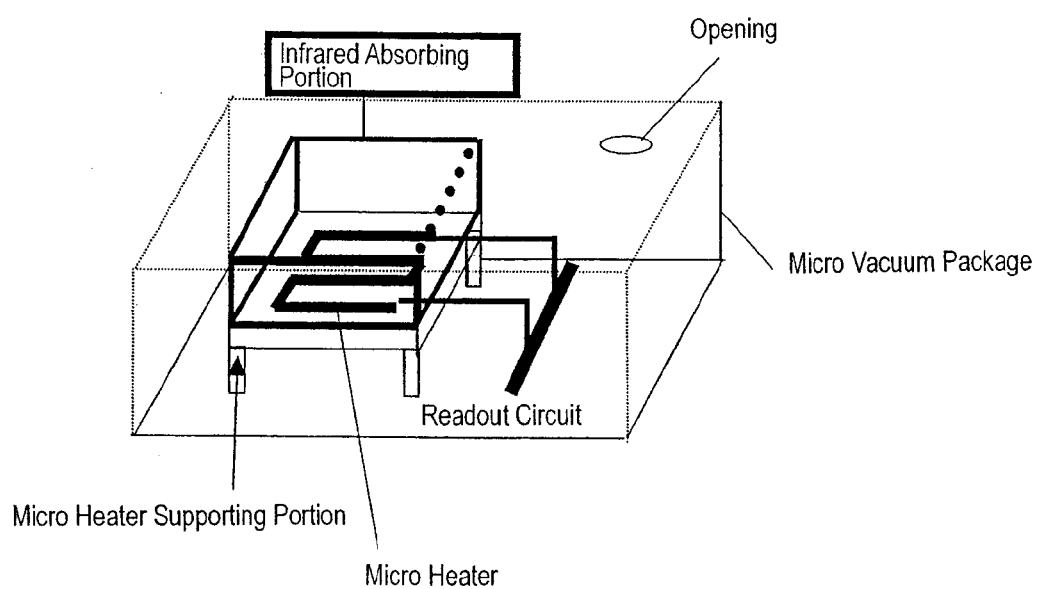
FIG. 16 is a perspective view showing an infrared detecting test unit.

In order to obtain the relationship between the thermal conductance $g_A$ via the atmospheric gas and the pressure of the atmospheric gas by experiments, a test device including a macro vacuum package with a small opening may be prepared, as shown in FIG. 16, and the test device may be disposed in a vacuum chamber, for example. Via the opening of the micro vacuum package, the difference in pressure between the inside and the outside of the micro vacuum package is eliminated. Thus, $g_A$ may be obtained from the above expression with changing the internal pressure of the vacuum chamber, so as to determine the dependency on pressure of $g_A$.

Next, with reference to FIGS. 17A to 17D, an exemplary specific configuration of the micro heater 167 preferably employed in this embodiment will be described.

Figure 17A:
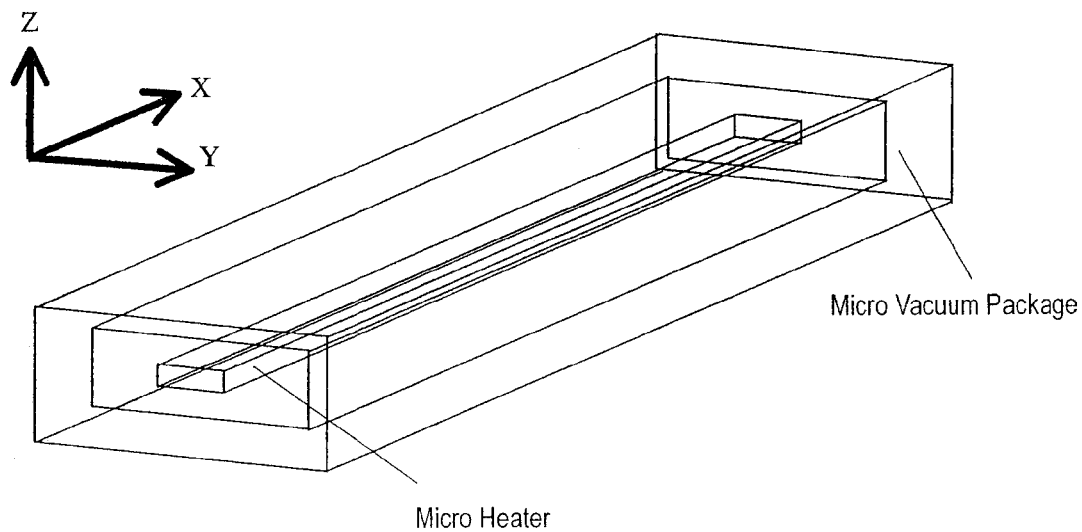
FIG. 17A is a perspective view showing a configuration of a micro heater.
Figure 17B:
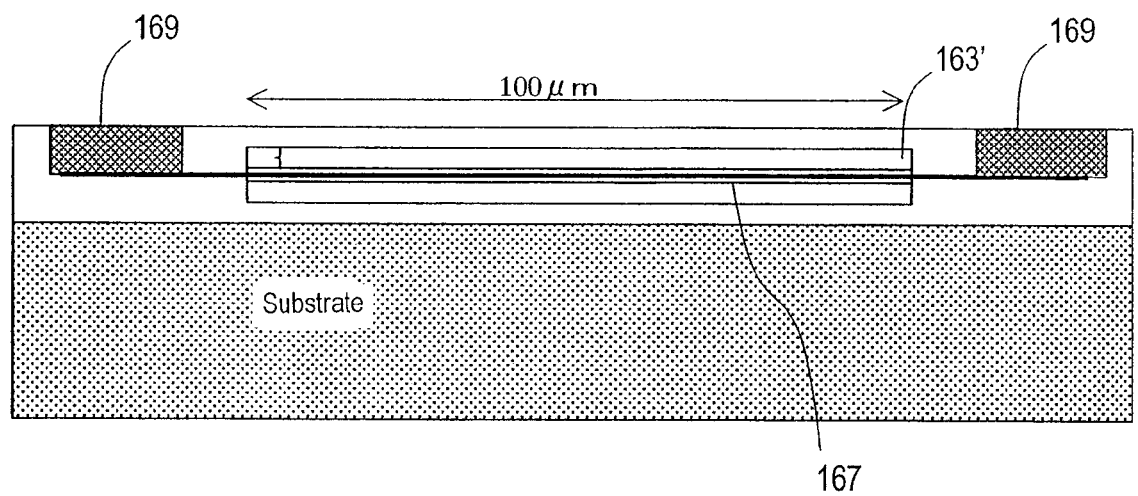
FIG. 17B is a sectional view showing the configuration of the micro heater (a sectional view taken across a bridge).
Figure 17C:
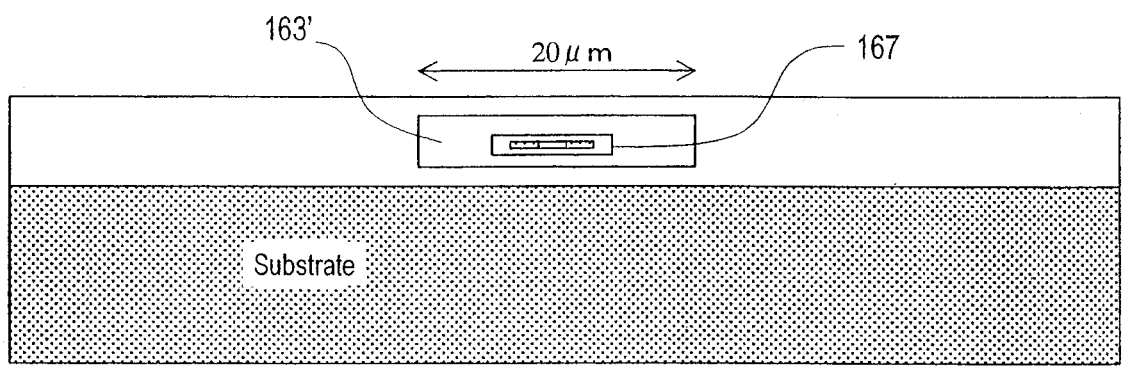
FIG. 17C is a sectional view showing the configuration of the micro heater (a sectional view in parallel to a direction in which the bridge extends).
Figure 17D:
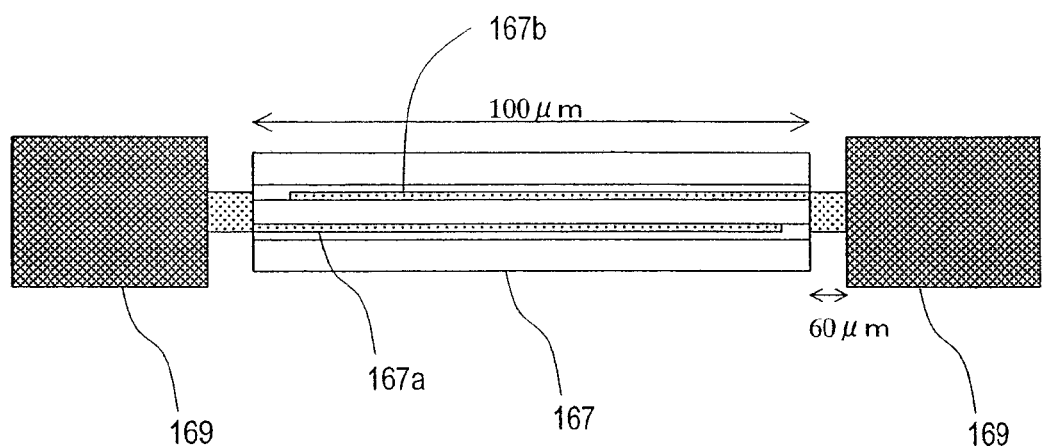
FIG. 17D is a plan view showing the configuration of the micro heater.

FIG. 17A is a perspective view showing the micro heater 167 formed in a rectangular cavity (the micro vacuum package). FIG. 17B is a sectional view taken along a plane parallel to the XZ plane. FIG. 17C is a sectional view taken along a plane parallel to the YZ plane. FIG. 17D is a view showing a layout in a plane parallel to the XY plane.

As shown in FIGS. 17B to 17D, a bridge (a member functioning as both of the micro heater and the micro heater supporting portion) formed in a rectangular parallelepiped cavity having a width of about 20 μm, a height of about 3 μm, and a length of a longer side of about 100 μm is provided. The thickness of the bridge is about 1 μm, and the width thereof is about 8 μm, and the bridge extends in the substantially center portion of the cavity 163' in the longer side direction (the length of about 100 μm).

The bridge in this embodiment is formed from silicon doped with an impurity (dopant such as boron). Selected regions (two parallel linear regions) of the bridge are doped with the impurity at a higher density than the other regions, so as to lower the resistance. One end of the higher density impurity region of lower resistance which linearly extends is electrically connected to one of a pair of aluminum electrode pads, so as to exhibit the same function as that of a conductive wiring. A predetermined voltage is applied across the pair of aluminum electrode pads, a current flows in a portion in which the impurity density is relatively low in the bridge along a shorter side direction of the bridge.

Figure 18:
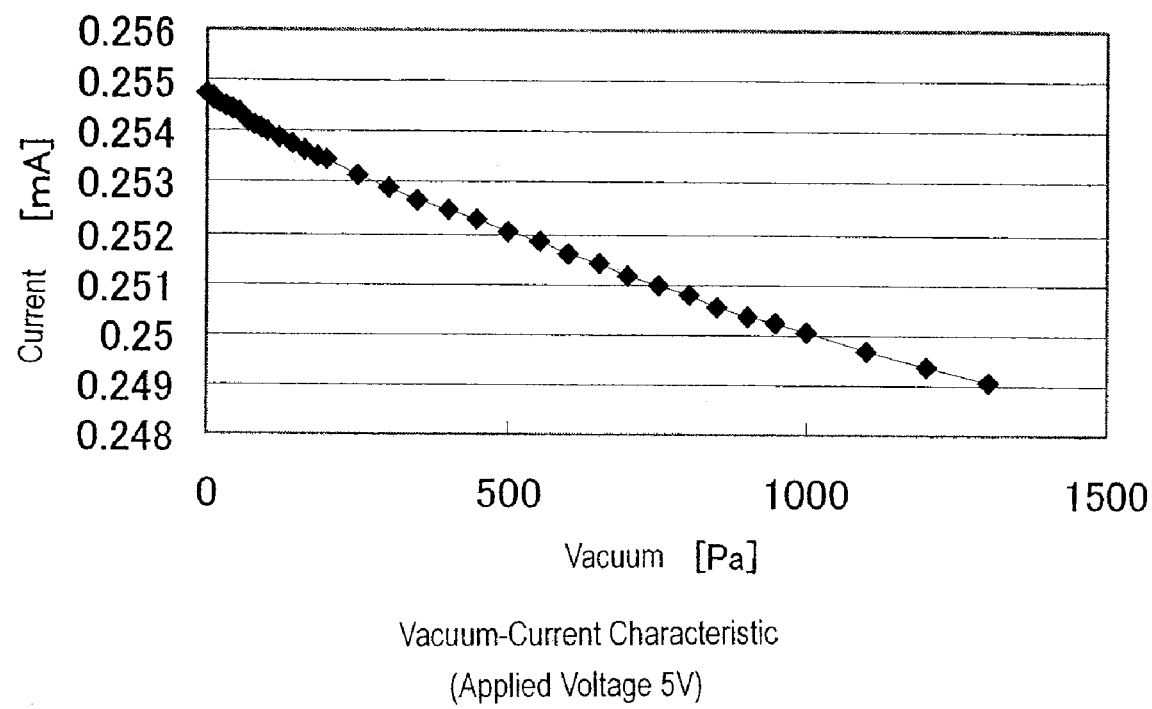
FIG. 18 is a graph showing an exemplary relationship between an electric resistance and a vacuum level (a pressure) in the micro heater.

FIG. 18 is a graph showing an example of the relationship between the electric resistance and the vacuum level (the pressure) in the micro heater shown in FIGS. 17A to 17D. As is seen from the graph, the current flowing through the micro heater is reduced in accordance with the increase in pressure. This means that the temperature rise in the micro heater is reduced in accordance with the increase in pressure, and as a result, the reduction in electric resistance in the micro heater becomes small.

FIGS. 17A to 17D show an example of the length and the width of the resistive element in the micro heater 167, and the configuration of the actual micro heater is not limited to those shown in the figures.

The micro heater 167 in this embodiment is not only used for measuring the vacuum level, but also used for measuring the irradiation amount of infrared rays. In the case where infrared rays are detected in the micro heater in the above-described manner, it is desired that a folding pattern be applied to the micro heater for the purpose of increasing the light receiving area.

When the relationship between the current (the electric resistance) and the vacuum level as shown in FIG. 18 is used, the vacuum level (the pressure) inside the micro vacuum package (inside the cavity) can be obtained in real time, by measuring the current (the electric resistance) of the micro heater.

Next, with reference to FIGS. 19 to 33, a method of fabricating the micro heater and the micro vacuum package will be described. Figures (c) in FIGS. 19 to 33 are plan views showing main portions of the substrate. Figures (a) are sectional views taken along a line A-A' in (c). Figures (b) are sectional views taken along a ling B-B' in (c).

Figure 19:
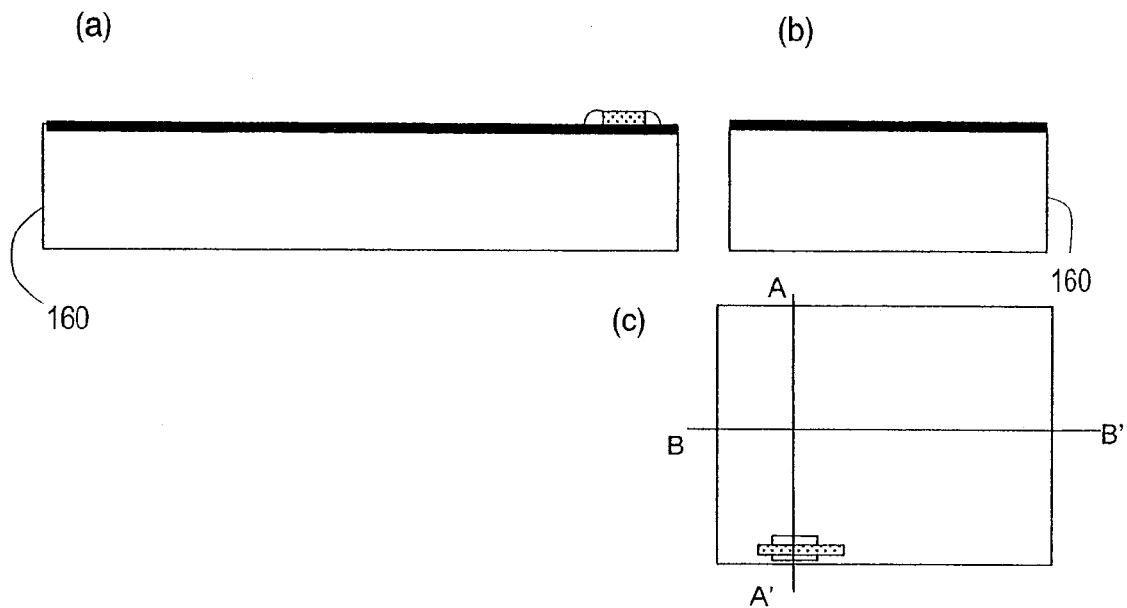
FIG. 19 is views showing a production step of the electronic device in the seventh embodiment of the present invention in which (a) is a sectional view taken along a line A-A', (b) is a sectional view taken along a line B-B', and (c) is a plan view.

First, as shown in FIG. 19, a readout circuit (a transistor or the like) is formed on a silicon substrate 160. The readout circuit is preferably constituted by a CMOS circuit integrated on the silicon substrate, and manufactured by a known semiconductor integrated circuit manufacturing technique. Thereafter, although not shown in the figure, visible-light detecting units are formed on the silicon substrate 160.

Figure 20:
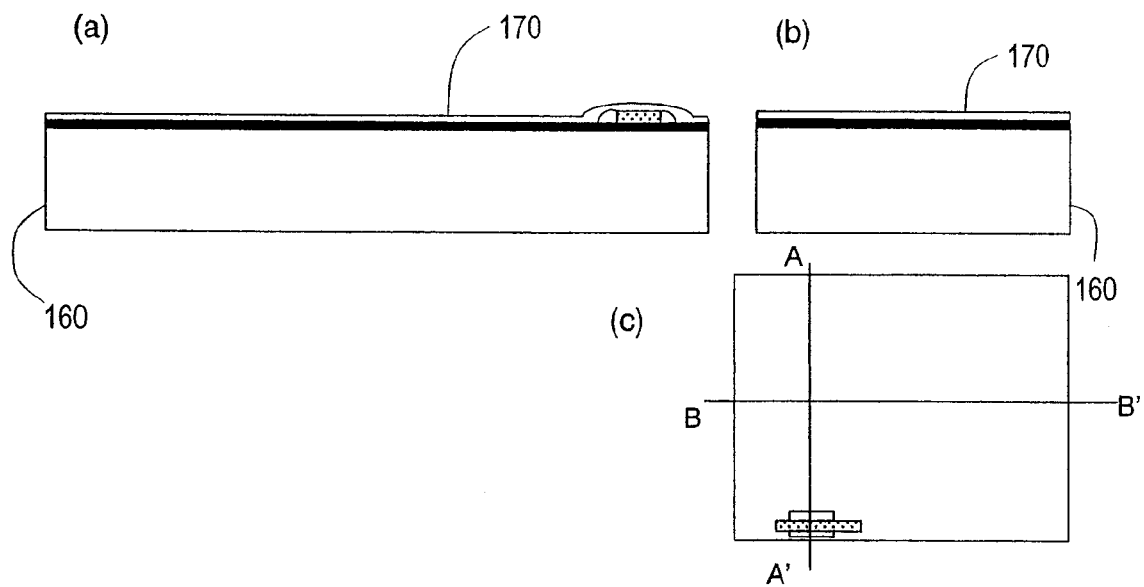
FIG. 20 is views showing a production step of the electronic device in the seventh embodiment of the present invention in which (a) is a sectional view taken along a line A-A', (b) is a sectional view taken along a line B-B', and (c) is a plan view.

Next, as shown in FIG. 20, by a thin film deposition technique such as CVD, a silicon oxide film (the thickness of about 100 nm) 170 is deposited so as to cover the entire upper face of the silicon substrate 160.

Figure 21:
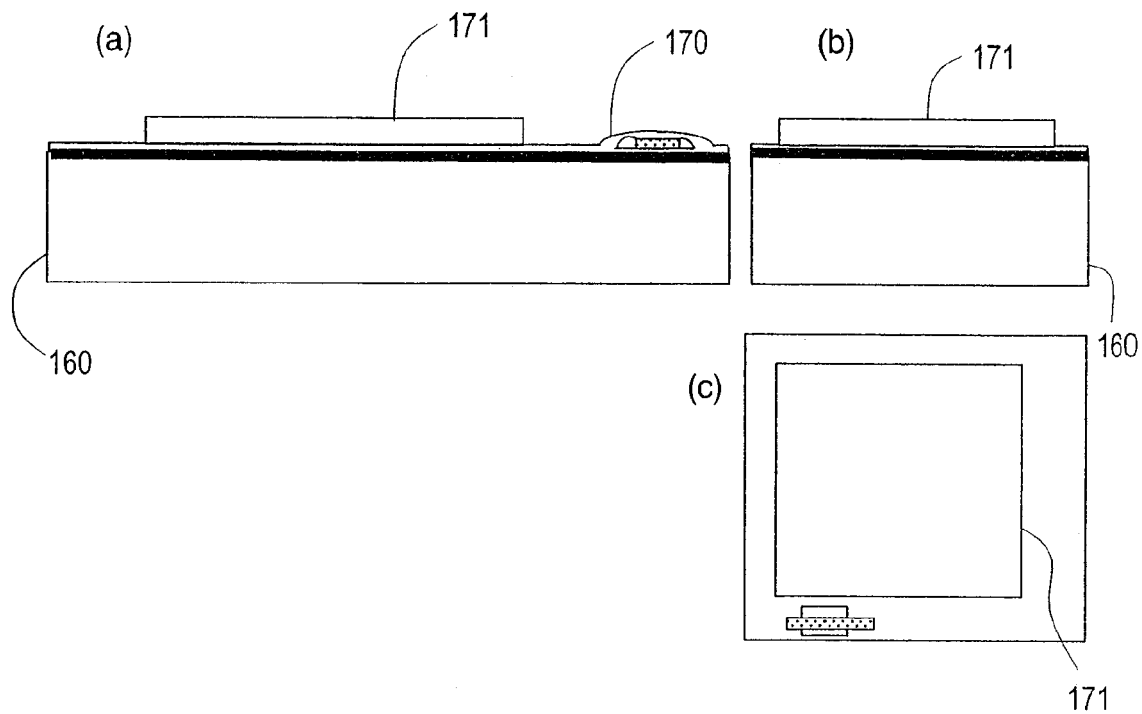
FIG. 21 is views showing a production step of the electronic device in the seventh embodiment of the present invention in which (a) is a sectional view taken along a line A-A', (b) is a sectional view taken along a line B-B', and (c) is a plan view.

Thereafter, as shown in FIG. 21, a polysilicon layer 171 having a thickness of about 1 μm is formed in a region in which infrared detecting units are to be formed. The polysilicon layer 171 can be fabricated by depositing a polysilicon film on the silicon oxide film 170 by CVD, for example, and thereafter by patterning the polysilicon film by photolithography and etching techniques. The polysilicon layer 171 functions as a "first sacrificial layer" which is finally removed by etching. In the example shown in FIG. 21, the polysilicon layer 171 has a rectangular planar shape, and the micro heater is formed above the polysilicon layer 171.

Figure 22:
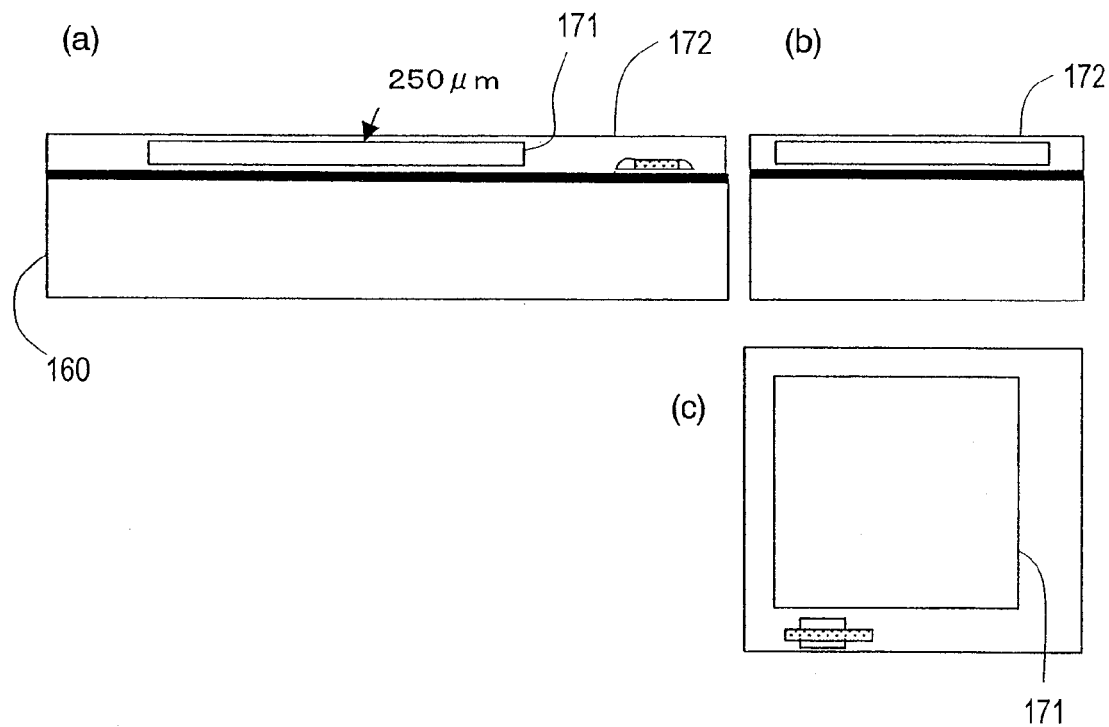
FIG. 22 is views showing a production step of the electronic device in the seventh embodiment of the present invention in which (a) is a sectional view taken along a line A-A', (b) is a sectional view taken along a line B-B', and (c) is a plan view.

Next, as shown in FIG. 22, after a second silicon oxide film 172 is deposited so as to cover the polysilicon layer 171, an upper face of the second silicon oxide film 172 is planarized. The planarization is performed so as to leave the silicon oxide film 171 having a thickness of about 250 nm on the polysilicon layer (the first sacrificial layer) 171. The silicon oxide film 172 on the polysilicon layer (the first sacrificial layer) 171 functions as an etch stop layer for a lower portion of the micro heater in a step of etching the polysilicon layer (the first sacrificial layer).

Figure 23:
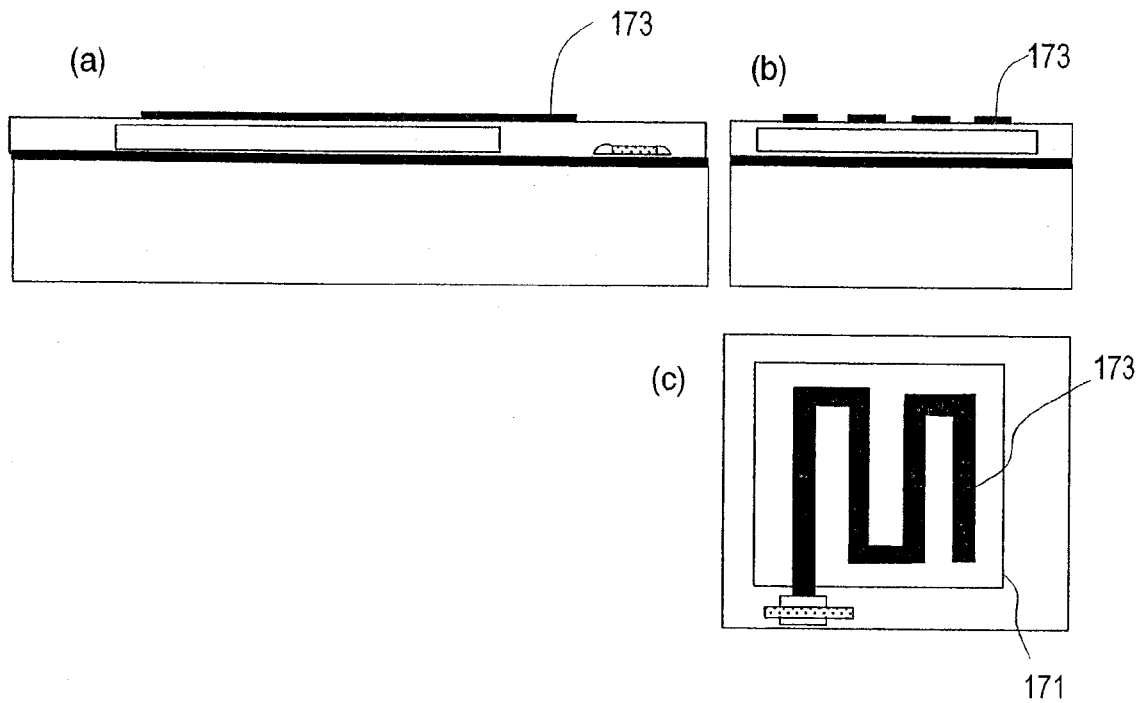
FIG. 23 is views showing a production step of the electronic device in the seventh embodiment of the present invention in which (a) is a sectional view taken along a line A-A', (b) is a sectional view taken along a line B-B', and (c) is a plan view.

Next, as shown in FIG. 23, a micro heater 173 of polysilicon doped with B (boron) is formed in a region in which infrared detecting units are to be formed. The micro heater 173 is fabricated by depositing a second polysilicon film on the second silicon oxide film 172, for example, and injecting B ions into the second polysilicon film, and then by patterning the second polysilicon film by photolithography and etching techniques. Instead of the separate steps of deposition of the second polysilicon film and the injection of B ions, a dopant gas may be added to silane gas or the like which is a material for polysilicon during the deposition of the second polysilicon film. The impurity with which the second polysilicon film is doped is not limited to B.

Thereafter, by injecting ions such as $BF_2$ into selected regions of the second polysilicon film, the doping level of the injected regions is relatively increased, and the electric resistivity (the specific resistance) is reduced. In this way, a region functioning as a resistive element and a region functioning as a wiring portion as shown in FIG. 17D can be formed in polysilicon.

Figure 24:
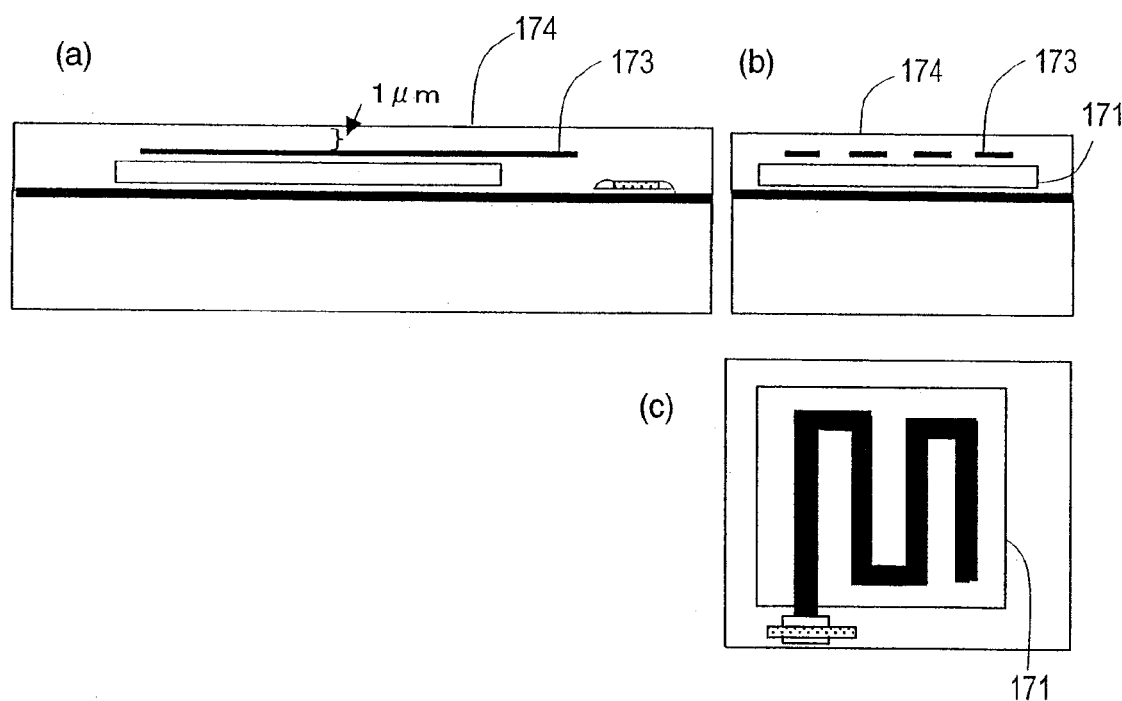
FIG. 24 is views showing a production step of the electronic device in the seventh embodiment of the present invention in which (a) is a sectional view taken along a line A-A', (b) is a sectional view taken along a line B-B', and (c) is a plan view.

Next, as shown in FIG. 24, a third silicon oxide film 174 having a thickness exceeding 1 μm is deposited, and then the film is planarized. The planarization is performed so as to leave the third silicon oxide film 174 having a thickness of about 1 μm on the micro heater 173. The third silicon oxide film 174 has a function as an interlayer insulating film positioned between the upper and lower wirings, a function as an etch stop layer for the upper portion of the micro heater in the etching process of the sacrificial layer, and a function as an infrared absorbing portion.

Figure 25:
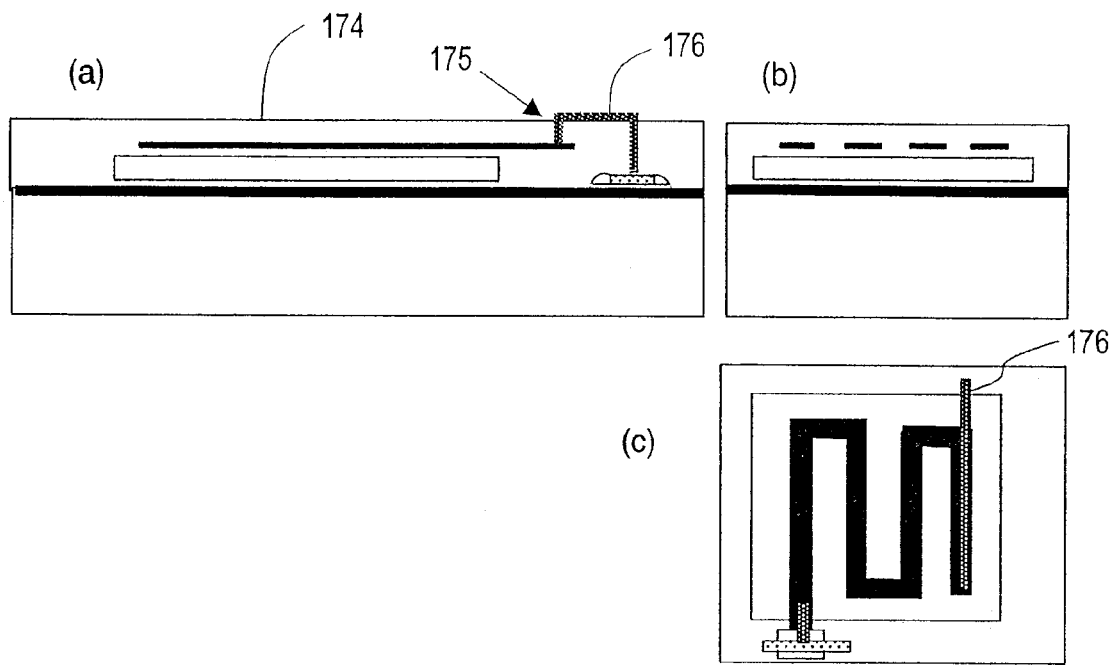
FIG. 25 is views showing a production step of the electronic device in the seventh embodiment of the present invention in which (a) is a sectional view taken along a line A-A', (b) is a sectional view taken along a line B-B', and (c) is a plan view.

Next, as shown in FIG. 25, in order to electrically connect the micro heater 173 and the readout circuit, a contact hole 175 is formed in the silicon oxide film, and a wiring portion 176 is formed. The contact hole 175 is formed in such a manner that a predetermined portion of the silicon oxide film is removed by photolithography and etching techniques. The wiring portion 176 is formed by depositing a film of a wiring material such as aluminum on the third silicon oxide film 174 and then by patterning the film by photolithography and etching techniques. The wiring portion 176 is patterned so as to connect the micro heater 173 and the readout circuit via the contact hole 175.

Figure 26:
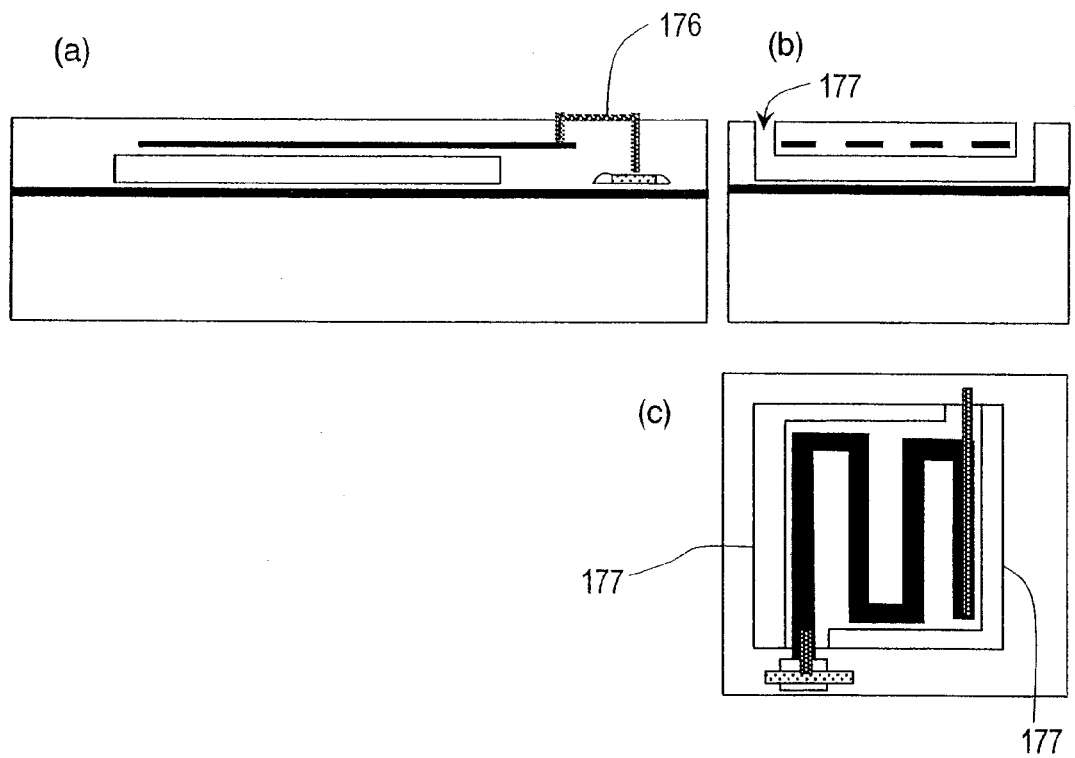
FIG. 26 is views showing a production step of the electronic device in the seventh embodiment of the present invention in which (a) is a sectional view taken along a line A-A', (b) is a sectional view taken along a line B-B', and (c) is a plan view.

Next, as shown in FIG. 26, openings (etching holes) 177 are formed in the third silicon oxide film (the etch stop layer for the upper portion of the micro heater) 174 and the second silicon oxide film (the etch stop layer for the lower portion of the micro heater) 172, so as to expose a portion of the polysilicon layer (the first sacrificial layer) 171. The openings function as a space for thermal insulation between the infrared detecting units and the side face of the vacuum package.

Figure 27:
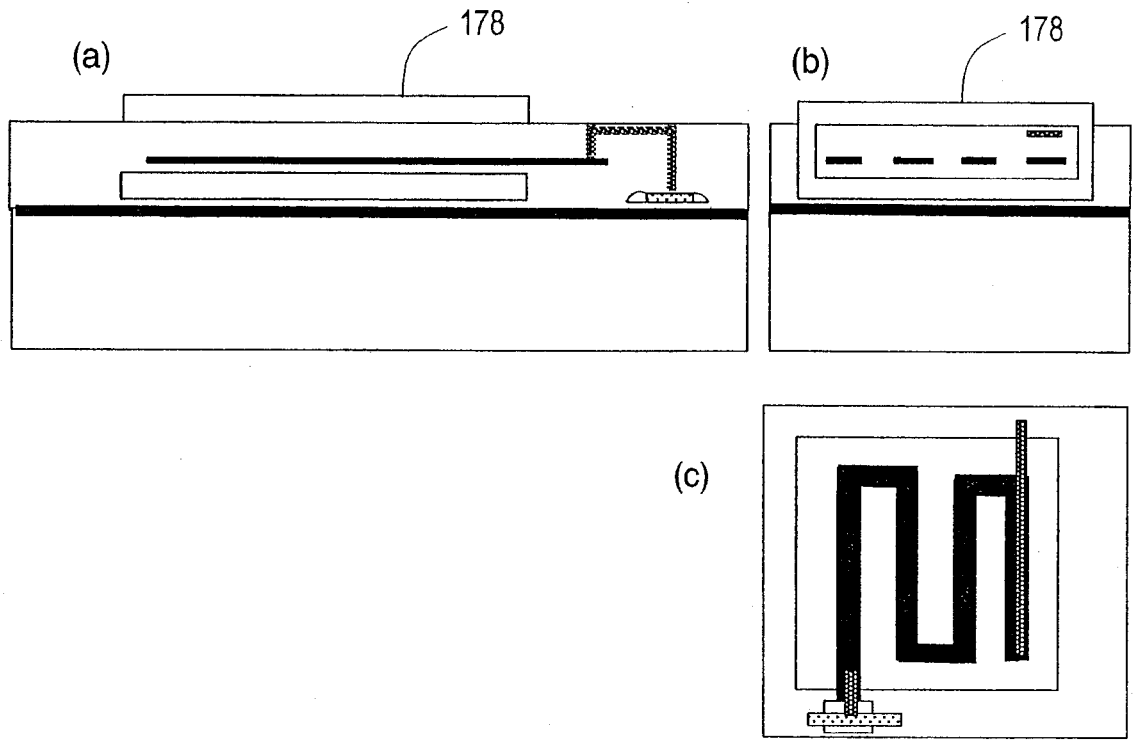
FIG. 27 is views showing a production step of the electronic device in the seventh embodiment of the present invention in which (a) is a sectional view taken along a line A-A', (b) is a sectional view taken along a line B-B', and (c) is a plan view.

Next, as shown in FIG. 27, after a fourth silicon oxide film having a predetermined thickness is deposited, a polysilicon layer (thickness of about 1 μm) 178 functioning as a second sacrificial layer is formed thereon. The polysilicon layer is also formed by patterning the deposited polysilicon film by photolithography and etching techniques.

Figure 28:
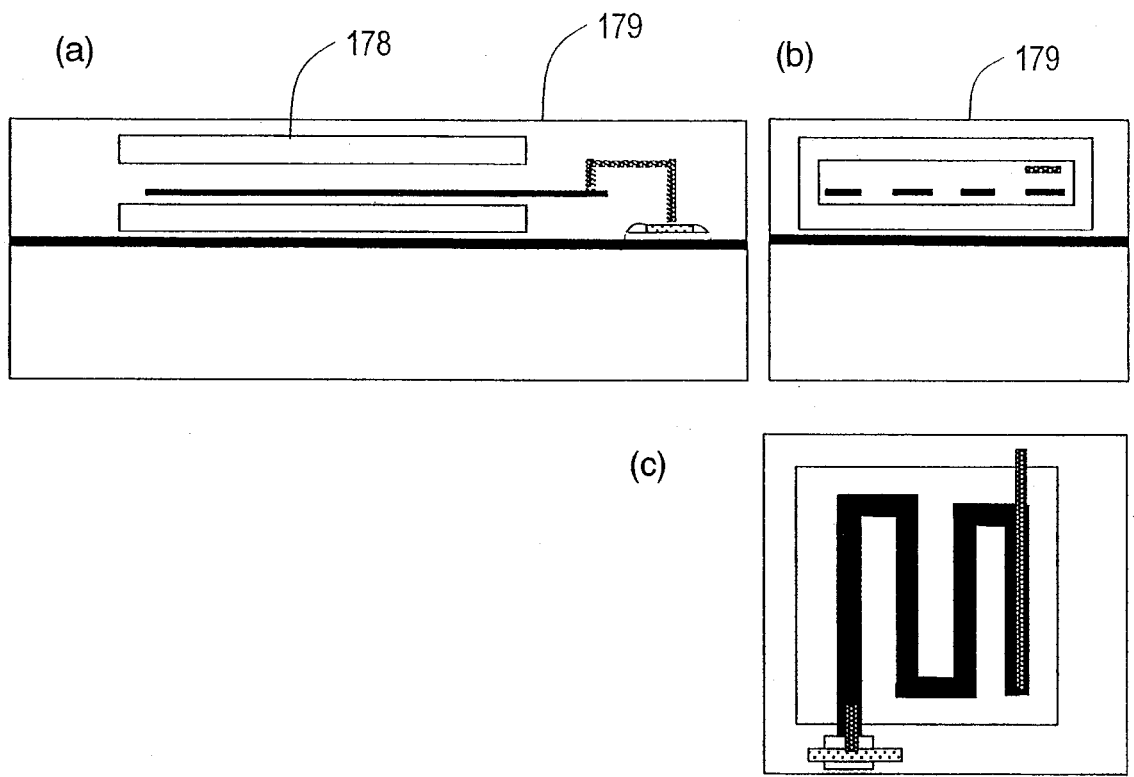
FIG. 28 is views showing a production step of the electronic device in the seventh embodiment of the present invention in which (a) is a sectional view taken along a line A-A', (b) is a sectional view taken along a line B-B', and (c) is a plan view.

Next, as shown in FIG. 28, a fifth silicon oxide film 179 is deposited, and then planarization is performed. The planarization is performed so that the fifth silicon oxide film 179 positioned on the polysilicon film functioning as the second sacrificial layer has a thickness of about 500 nm. The fifth silicon oxide film 179 eventually functions as a wall surface of the vacuum package.

Figure 29:
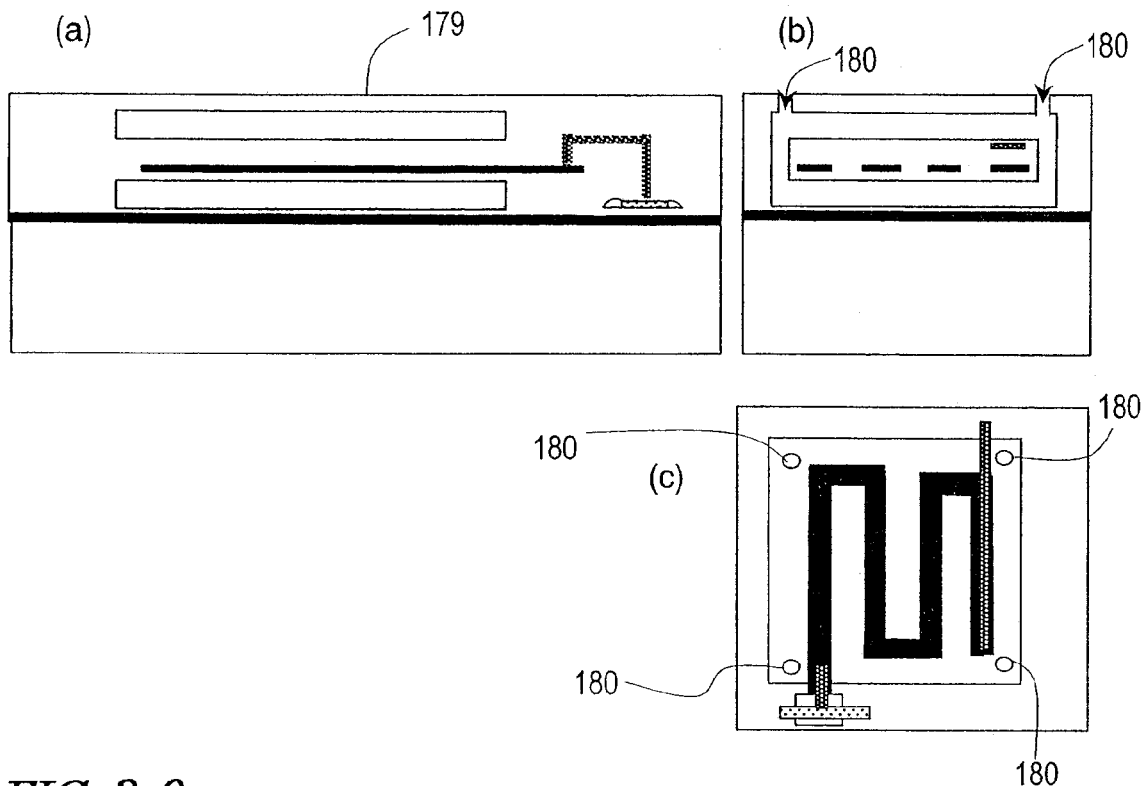
FIG. 29 is views showing a production step of the electronic device in the seventh embodiment of the present invention in which (a) is a sectional view taken along a line A-A', (b) is a sectional view taken along a line B-B', and (c) is a plan view.
Figure 30:
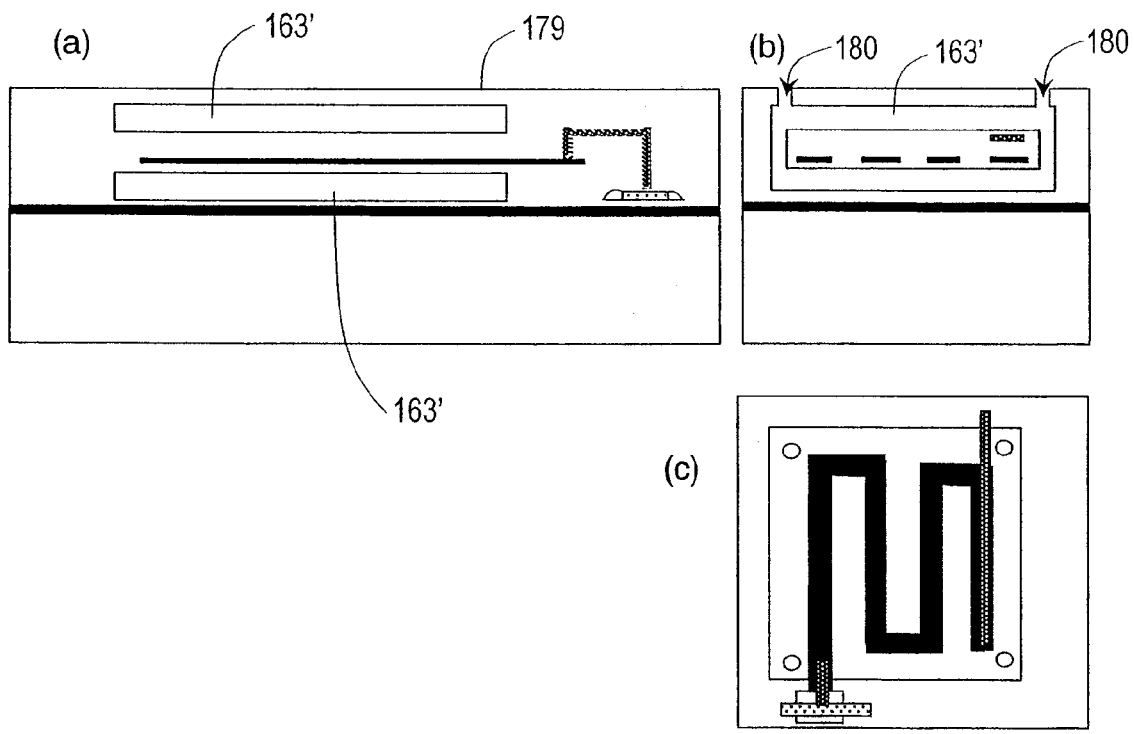
FIG. 30 is views showing a production step of the electronic device in the seventh embodiment of the present invention in which (a) is a sectional view taken along a line A-A', (b) is a sectional view taken along a line B-B', and (c) is a plan view.

Next, as shown in FIG. 29, an etching hole 180 having a diameter of about 0.3 μm is formed in the fifth silicon oxide film 179. Thereafter, as shown in FIG. 30, an $XeF_2$ gas is introduced through the etching hole 180, thereby etching the polysilicon layer functioning as a sacrificial layer. As the result of the etching, a cavity 163' is formed in a region surrounding the micro heater.

Figure 31:
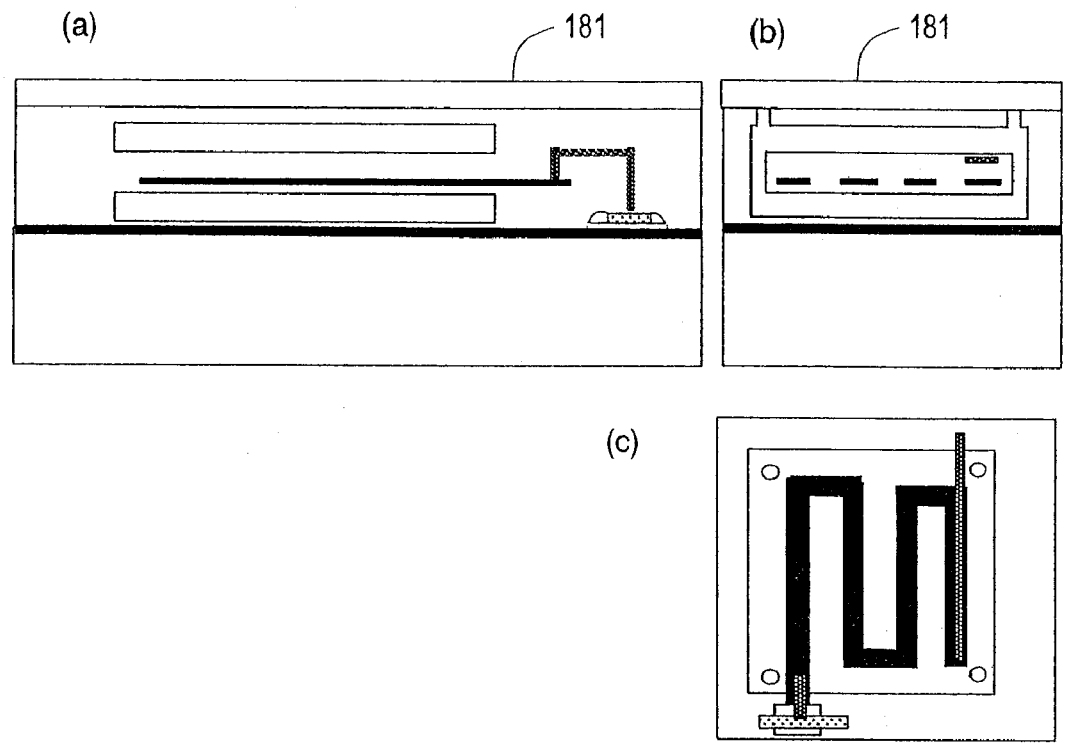
FIG. 31 is views showing a production step of the electronic device in the seventh embodiment of the present invention in which (a) is a sectional view taken along a line A-A', (b) is a sectional view taken along a line B-B', and (c) is a plan view.

Next, as shown in FIG. 31, a silicon film 181 having a thickness of about 2 μm is deposited on the fifth silicon oxide film by sputtering. The deposition of the silicon film 181 closes the etching hole 180, and seals the cavity 163'. By the sealing, the internal pressure of the cavity 163' is held at an atmospheric gas pressure in the sputtering step (the internal pressure of the sputter chamber). Next, part of the silicon film (the sputtered sealing film) 181 is removed, and then electrode pads which are not shown are formed.

By a series of the above-described steps, the micro heater can be disposed inside the small vacuum package (inside a cavity of a reduced pressure). In the figures which are referred to, a single micro meter is depicted for simplicity. In a preferred embodiment, by the above-described MEMS technique, a number of micro heaters are simultaneously formed on one and the same substrate. Each of the micro heaters is formed by a patterned thin film, so that they can be fabricated by MEMS technique at a low cost.

According to this embodiment, the micro heater 173 can not only measure the irradiation amount of infrared rays, but also detect the internal pressure of the cavity 163'. Therefore, even if an abnormal occurs in the internal pressure of the cavity 163' because of a defect of a production process, the abnormal pressure can be sensed before shipping the product. Even in the case where the internal pressure of the cavity 163' is at an appropriate level immediately after the production, the pressure may increase during the use and due to the time elapse. In this embodiment, the internal pressure of the cavity 163' can be measured as required, or at regular intervals. Thus, it is possible to sense the abnormality in pressure.

The specific resistance of the micro heater 173 in this embodiment is preferably designed in a range of not lower than $1 \times 10^{-1}$ Ωcm nor more than $1 \times 10^5$ Ωcm. If the specific resistance of the micro heater 173 is larger than the upper limit of the range, the electric resistance of the micro heater 173 is an extremely large value of 100 kΩ or more, for example. Thus, it is difficult to detect the temperature. In the case where the specific resistance is smaller than the lower limit of the above-mentioned range, the rate of change in resistance caused in the micro heater 173 is an extremely small value of $1 \times 10^{-3}$ or less. Thus, it is difficult to detect the temperature.

When the micro heater 173 is formed from a thin film of a material having a specific resistance in the range of not lower than $5 \times 10^2$ Ωcm nor more than 5 Ωcm, the thickness of the thin film is set to be 500 nm or less. In addition, preferably, the resistance of the resistive element portion in the micro heater 173 is designed to be 100 kΩ or less, and the rate of change in resistance is designed to be 0.01 or more.

When the first sacrificial layer positioned below the micro heater 173 is to be etched, for the purpose of preventing the micro heater 173 from bending in the upper direction or the lower direction, it is preferred that a film of a material having large tensile stress be disposed on and/or under the micro heater 173. Such a film of a material having large tensile stress can be formed from SiN, for example.

When the sacrificial layer is to be etched, instead of $XeF_2$, an etching gas such as $SF_6$ or $CF_4$ may be used, or a drug solution such as TMAH or hydrazine may be used. The material for a film which is deposited for closing the etching hole is not limited to silicon, and other materials (a metal such as Al) may be used. When the etching hole is closed by the deposition of such a film and the cavity is sealed, in order to increase the vacuum level in the cavity, it is preferred that the film is deposited under a pressure of 10 Pa or less. Especially when the micro heater 17 also functions as the infrared detecting unit as in this embodiment, in order to increase the amount of incident infrared rays, it is preferred that the member functioning as a ceiling of the cavity (a wall portion of the cavity) is formed from a material which absorbs less infrared rays. For example, if the wall portion of the cavity is formed from silicon of which the surface is covered with a silicon oxide film, the amount of absorbed infrared rays is small, and the silicon oxide film preferably functions as an etch stopper.

Embodiment 8

Hereinafter an eighth embodiment according to the present invention will be described.

Figure 32:
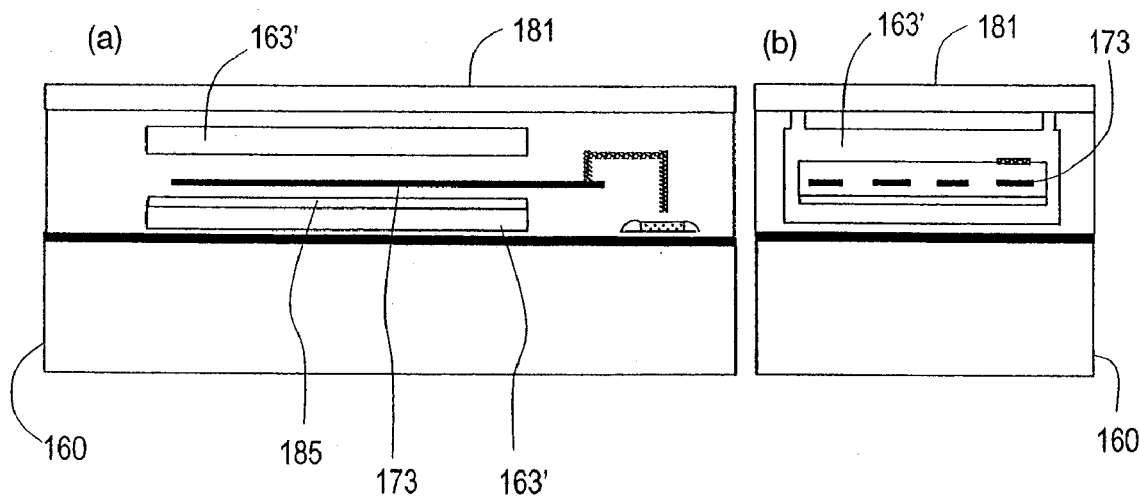
FIG. 32 is sectional views showing an electronic device in an eighth embodiment of the present invention in which (a) is a sectional view taken along a line A-A', and (b) is a sectional view taken along a line B-B'.

FIG. 32 shows an embodiment in which a gettering thin film is disposed inside the micro vacuum package (inside the cavity 163'). The gettering thin film is activated by the heat generation of the micro heater 173, so as to adsorb a gas existing inside the micro vacuum package (inside the cavity 163'), thereby reducing the pressure.

In the above-described seventh embodiment, the silicon film 181 functioning as the sealing member is formed by sputtering, thereby reducing the internal pressure of the cavity 163'. The reason why the internal pressure of the cavity 163' can be reduced by forming the sealing member by sputtering is that, as described above, an internal pressure of a sputter chamber (which defines the internal pressure of the cavity 163') is lower than an internal pressure in a chamber of a CVD apparatus. In this embodiment, the gettering thin film is disposed inside the cavity 163', and the effect of reducing the pressure by the gettering thin film is utilized, so that the method of forming the sealing member is not limited to sputtering, and alternatively various thin film deposition methods including CVD can be used. Specifically, after the sealing member is formed by a known thin film deposition method, gettering by the gettering thin film is performed, thereby reducing the internal pressure of the cavity 163' up to a sufficiently low value (preferably 10 Pa or less, and more preferably 5 Pa or less). The deposition of the sealing member by CVD is performed at a pressure of about 67 Pa, for example, so that the internal pressure of the cavity 163' immediately after the sealing member is deposited by CVD is about 67 Pa.

In this embodiment, the gettering thin film 185 is disposed under the silicon oxide film which functions as an etch stop layer below the micro heater 173. The thickness of the gettering thin film 185 is set to be 500 nm, for example. In order to maintain the vacuum level inside the micro vacuum package high by the function of the gettering thin film 185, it is necessary to set the thickness of the gettering thin film 185 to be a sufficient level. A preferred thickness depends on the internal volume of the micro vacuum package.

The electric resistance of the micro heater 173 is set to be 1 MΩ or less, for example. In a preferred example, when a voltage of 10 V is applied to the micro heater, the heat generation is $10^{-4}$ W or more. When the thermal conductance between the micro heater 173 and the external is set to be $1 \times 10^{-7}$ W/K, the temperature of the micro heater 173 is 1000 K or more, so that the activation of the gettering thin film can be sufficiently performed.

The material for the gettering thin film 185 is suitably selected from alloys of Zr, Ti, or Zr, and Al, or a getter material of non-evaporation type such as V (vanadium), for example. When the gettering thin film adheres the gas in the micro vacuum package, and the gettering function is degraded, the micro heater 173 is heated, and the temperature may be increased up to a temperature (for example, 900 degrees) at which the gettering thin film 185 can activate again. By such heating, molecules of the gas adhered to the surface is diffused inside the gettering thin film 185, so that the getter material can be exposed to the surface of the gettering thin film 185 again (activation).

In order to activate the gettering thin film 185 in this way, it is necessary to increase the temperature of the micro heater 173 up to a remarkably high level as compared with the operation time of the electronic device. In order that such heating does not badly affect the electronic circuit integrated on one and the same substrate 160, it is desired that the micro heater 173 and the substrate 160 be thermally insulated. In this embodiment, the thermal conductance between the substrate and the micro heater is set to be a small value of about $10^{-7}$ W/K, so that there arises almost no bad influence on the electronic circuit. In the case where the value of the thermal conductance is large, i.e., in the case where the thermal insulating is insufficient, it is necessary to dispose the electronic circuit in a position distant from the region in which the micro heater 173 is formed. Thus, the miniaturization of the electronic device may be disturbed.

Figure 33:
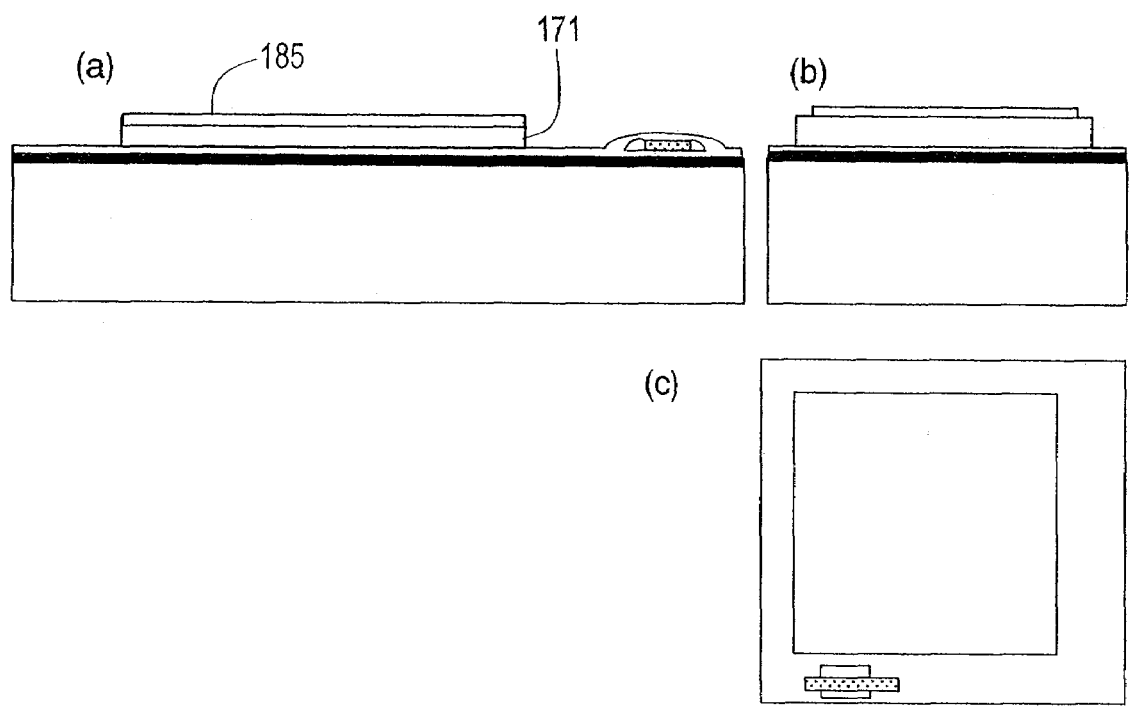
FIG. 33 is views showing a production step of the electronic device in the eighth embodiment of the present invention in which (a) is a sectional view taken along a line A-A', (b) is a sectional view taken along a line B-B', and (c) is a plan view.

The gettering thin film 185 is fabricated in the following way. As shown in FIG. 33, after the polysilicon layer (the first sacrificial layer) 171 is formed, a thin film of a gettering material is deposited on the polysilicon layer 171 by sputtering, for example. Next, the thin film is patterned into a desired shape, by photolithography and etching techniques.

The step shown in FIG. 33 is performed between the step of FIG. 21 and the step of FIG. 22. The succeeding steps are the same as those shown in FIGS. 22 to 31.

According to the electronic device of this embodiment, the gettering thin film 185 is disposed below the micro heater 173, so that irradiation of infrared rays to the micro heater 173 is not blocked.

Moreover, in this embodiment, a cavity also exists below the gettering thin film 185, so that the gettering thin film 185 can be easily insulated thermally from the substrate.

As described above, in this embodiment, a heat absorbing and emitting portion for heating the inside of the micro vacuum package for the purpose of detecting the vacuum level in the cavity 163', a temperature detecting portion for performing temperature detection, and an activating portion for heating the gettering thin film for the purpose of increasing the vacuum level are realized by one micro heater. Therefore, the production cost can be reduced, and improvement in the degree of integration of elements can be attained.

The above-mentioned heat absorbing and emitting portion, temperature detecting portion, and activating portion may be formed as separate elements. Since the pressure can be measured by using an element for absorbing heat, a heat absorbing and emitting portion may be disposed, instead of the heat absorbing and emitting portion. The heat absorbing and emitting portion can be formed by a Peltier element. By detecting the temperature inside the micro vacuum package which varies in accordance with the heat generation or heat absorption of the Peltier element, the thermal conductance $g_A$ is obtained. The vacuum level can be obtained from the obtained $g_A$.

In this embodiment, the heat absorbing and emitting portion, the temperature detecting portion, and/or the activating portion are disposed one by one in each vacuum package. Alternatively, a plural number may be disposed in one vacuum package.

The cavity may be formed inside the substrate. By etching part of the substrate, a cavity is formed, so as to perform thermal insulation between the heat absorbing and emitting portion, the temperature detecting portion, and/or the activating portion, and the substrate. Such a configuration can be fabricated in the following way, for example. Specifically, first, after an etch stop layer is formed on the surface of the substrate, an etching hole is formed in the etch stop layer. Next, part of the substrate is etched via the etching hole, and a cavity is formed inside the substrate.

As the substrate, instead of the silicon substrate, an SOI substrate may be used. When the SOI substrate is used, after an etching hole is formed in an oxide layer existing inside the substrate, part of the substrate positioned below the oxide layer may be removed via the etching hole, thereby forming a cavity.

Instead of the formation of the cavity, a porous material such as porous silicon may be disposed, thereby attaining thermal insulation.

The heat absorbing and emitting portion, the temperature detecting portion, and/or the activating portion can be formed on the surface of the substrate. In such a case, it is necessary to adopt a temperature range and a layout which do not badly affect the electronic circuit on the substrate, as described above. If the heat absorbing and emitting portion, the temperature detecting portion, and/or the activating portion are positioned inside the micro vacuum package, they may be formed on an arbitrary face.

The heat absorbing and emitting portion, the temperature detecting portion, and/or the activating portion may be formed from a material other than silicon. For example, they can be formed from a metal such as Ti or Pt, a metal oxide such as TiO or $VO_x$, or a semiconductor such as SiGe. In the case where the semiconductor is used, a PN junction is formed in the semiconductor, and the temperature can be detected based on the variation in a current or a voltage in forward direction.

The detection of temperature by the temperature detecting portion may be performed by, other than the method based on the resistance variation, a method utilizing a pyroelectric effect, a method utilizing a variation of dielectric constant caused in accordance with the temperature variation (a dielectric bolometer), a method utilizing a phenomenon in which a thermal electromotive force occurs in accordance with a temperature difference between a hot junction and a cold junction in a thermopile in which a thermocouple or a plurality of thermocouples are connected in series (Seebeck effect), or the like.

In the above-described respective embodiments, the vacuum level is detected based on the temperature of the micro heater in a static state. In the case where the time required for changing the micro heater into the static state is too long, because the thermal conductance of the micro heater is large, it is possible to detect the vacuum level base on the temperature in a transient state.

Embodiment 9

Figure 34:
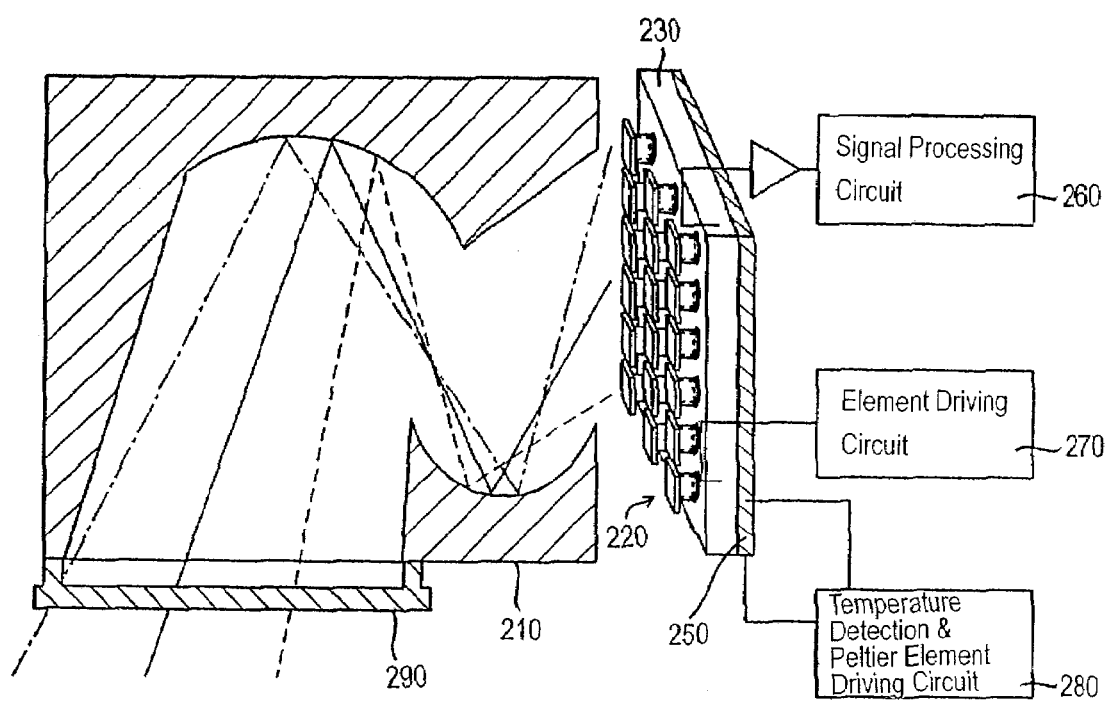
FIG. 34 is a view showing a ninth embodiment of the present invention.

With reference to FIG. 34, a ninth embodiment according to the present invention will be described. The electronic device of this embodiment is a camera (an imaging device) provided with an infrared area sensor.

As shown in FIG. 34, the camera of this embodiment includes an optical system 210 for introducing infrared rays emitted from an object into an infrared detecting unit (FIG. 34 shows an example using a reflective optical system, but a refracting system may be used), a substrate 230 having a plurality of infrared sensor elements 220 sealed in micro vacuum packages, each micro vacuum package including one or a plurality of elements, a Peltier element 250 formed on a back face of the substrate 230 opposite to the face on which the infrared sensor elements are formed, a signal processing circuit 60 for processing output signals of the infrared sensor elements, an element driving circuit 270 for pulse-driving the infrared sensor elements, a temperature detection & Peltier element driving circuit 280 for detecting a surface temperature of the substrate 230 and controlling the substrate temperature by driving the Peltier element 250, and a blocking plate 290 for examination for blocking the infrared rays incident on the optical system during the measurement of the temperature. When the optical system 210 is not the reflecting optical system, but the refracting optical system is used for experiments, a lens is formed by silicon or germanium which transmits infrared rays. However, it is difficult for such materials to transmit visible light. For this reason, it is preferred that the reflecting optical system be used.

Figure 35:
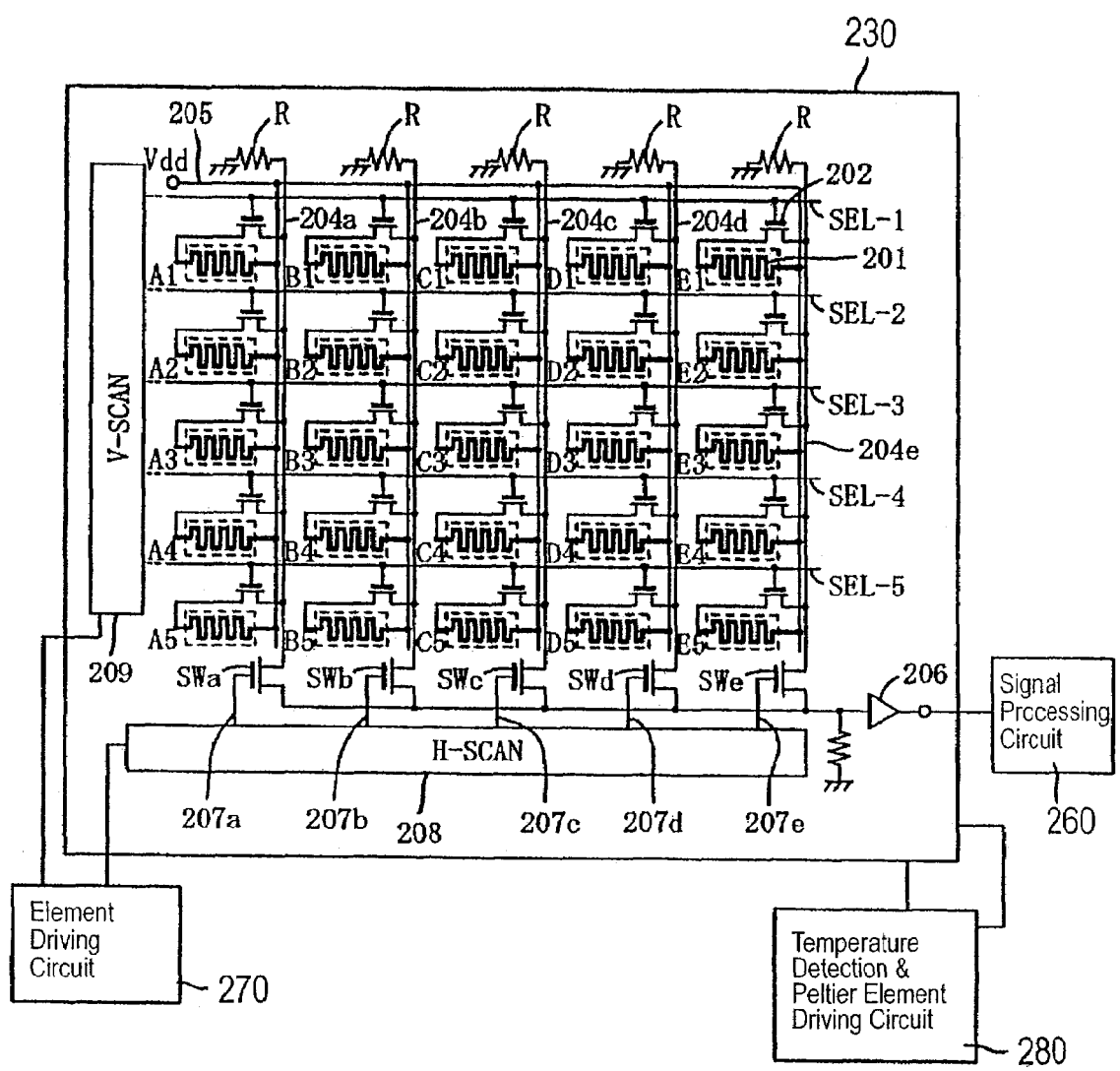
FIG. 35 is an equivalent circuit diagram of the ninth embodiment of the present invention.

Next, with reference to FIG. 35, the configuration of an infrared detecting unit is described.

In this embodiment, as shown in FIG. 35, infrared detecting units arranged on the substrate 230 are sealed in cap units, respectively. On the substrate 230, a cell array in which a number of cells A1 to E5 each including a resistive element (a bolometer) 201 and a switching transistor 202 are arranged in a matrix is disposed. The size of one cell is about 40 µm to 50 µm, for example, but it is sufficient that the size is 20 µm or more which is substantially twice as long as the wavelength of the infrared rays to be sensed.

FIG. 35 also shows the signal processing circuit 260 for processing output signals of the infrared detecting units, the element driving circuit 270 for pulse-driving the infrared detecting units, and the temperature detection & Peltier element driving circuit 80. The Peltier element is an element utilizing a heat absorbing function in conjunction with the movement of carriers passing through a Shottky contact portion. When the temperature is measured, infrared rays incident on the optical system is blocked by the blocking plate 290 for examination shown in FIG. 34.

A gate electrode of the switching transistor 202 in each cell is connected to selection lines SEL-1 to SEL-5 extending from a vertical scanning circuit 209 (V-SCAN). One end of the resistive element 201 of each cell is connected to power supply line 205. A source of the switching transistor 202 is connected to data lines 204*a* to 204*e* extending via a reference resistance R which is grounded from one end thereof. The data lines 204*a* to 204*e* are connected to an output amplifier 206 via switching transistors SWa to SWe, respectively. To gate electrodes of the respective switching transistors SWa to SWe, signal lines 207*a* to 207*e* extending from a horizontal scanning circuit 208 (H-SCAN) are connected.

Although not shown in FIG. 35, on a back face of the substrate, the Peltier element 250 to which the temperature detection & Peltier element driving circuit 80 is connected is disposed, thereby controlling the temperature of the substrate 230.

The external vertical scanning circuit 209 (V-SCAN) and the horizontal scanning circuit 208 (H-SCAN) are connected to the external element driving circuit 270, thereby driving the infrared detecting units. Signals from the infrared detecting units are output to the signal processing circuit 260 via the output amplifier 206.

The infrared detecting unit includes a folding-type resistive element (a bolometer) 201 disposed on the substrate 230, and a switching transistor 202 for turning on or off a current to the resistive element 201. The material of the resistive element 201 may be Ti, TiO, or polysilicon, and any one of them can be used. The switching transistor 202 includes a source region, a drain region, and a gate electrode, and electrically connects the resistive element 201 which is sealed in a vacuum condition to an external circuit.

(Vacuum Level in the Micro Vacuum Package of the Infrared Detecting Unit)

Figure 36:
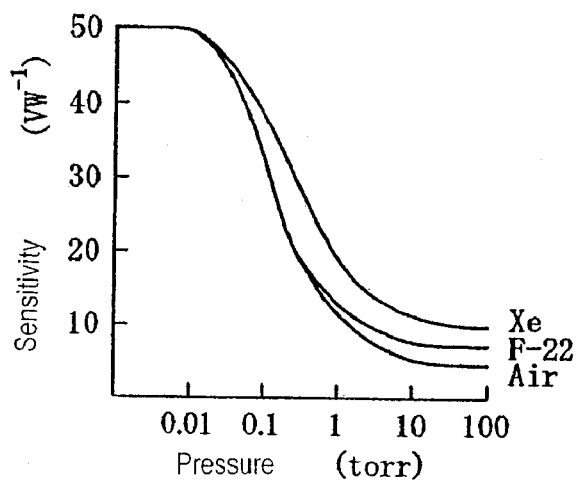
FIG. 36 is a graph showing a relationship between the sensitivity of the infrared detecting unit and the vacuum level of the atmosphere.

In order that each infrared detecting unit operates with good accuracy, the vacuum level of the space in which the infrared detecting unit is sealed is important. FIG. 36 is a graph showing the relationship between the sensitivity of the infrared detecting unit and the vacuum level of the atmosphere.

As shown in FIG. 36, the sensitivity of the infrared detecting unit in the atmosphere having a vacuum level of which the pressure is much more reduced from the vacuum level of about $1.0 \times 10^{-2}$ Torr (1.3 Pa) is improved about ten times as much as the sensitivity of the infrared sensor at the atmospheric pressure. That is, when the pressure of the atmosphere of the region in which the infrared sensor is formed is reduced from about $10^{-2}$ Torr (1.3 Pa), it is possible to realize an infrared sensor having the sensitivity which is 10 times as high as the sensitivity of an infrared sensor which is driven at the atmospheric pressure. Therefore, when the infrared detecting unit can be sealed at the vacuum level higher than the vacuum level of $10^{-2}$ Torr (1.3 Pa), and the vacuum level can be maintained after the sealing, a device with high sensitivity can be realized.

(Method for Determining the Vacuum Level)

After the temperature of the resistive element is increased by heat generation, and after the resistive element is left for a predetermined period of time, the temperature of the resistive element is lowered again, and becomes closer to the initial temperature. By detecting the change in the temperature, the pressure can be measured.

Figure 37:
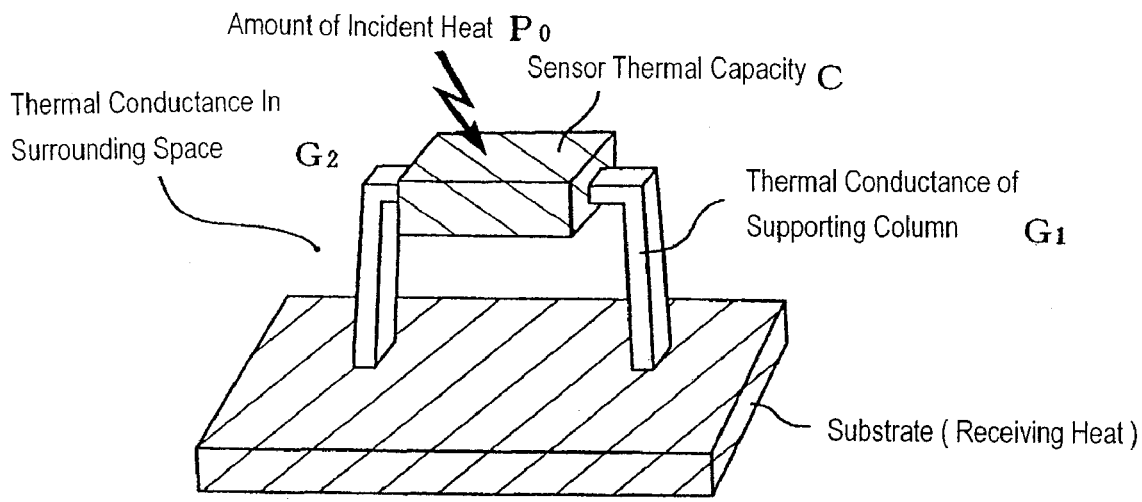
FIG. 37 is a perspective view for illustrating coming and exiting of heat in a resistive element.

FIG. 37 is a view for illustrating the movement in and out of the heat of the resistive element.

When the amount of heat generation of the micro heater is $P_0$, the thermal capacity of the resistive element is C, the change in temperature is $\Delta T$, the thermal conductance of the micro heater supporting portion is $G_1$, the thermal conductance of the atmospheric gas of the resistive element is $G_2$, and the frequency is $\omega$, the following relationship expression is established.

$$Cd(\Delta T)/dt + (G_1(\Delta T) + G_2(\Delta T)) = P_0 exp(j\omega t)$$

When the change in temperature $\Delta T$ is obtained from the above expression, the following expression is obtained.

$$\Delta T = P_0 exp(j\omega t)/((G_1+G_2)+j\omega C)$$

When the resistive element is self-heated, the temperature T of the infrared detecting unit is increased in proportion to the amount of generated heat $P_0$. In accordance with the increase in temperature T, the electric resistance R of the resistive element is changed.

Figure 38:
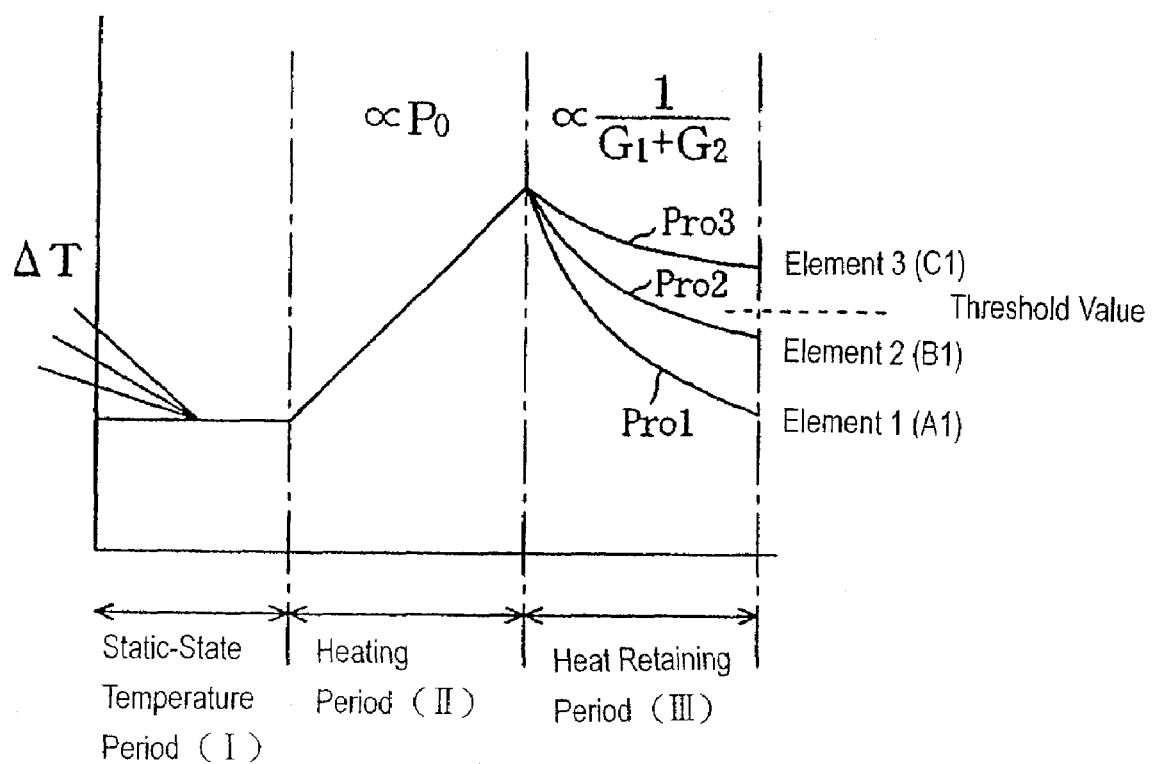
FIG. 38 is a graph showing a temperature change of the resistive element after the resistive element is self-heated and left for a predetermined period of time in which Pro1 to 3 indicate temperature profiles of devices 1 to 3 located in micro packages of different vacuum levels, respectively.

FIG. 38 shows the change in temperature of the resistive element after the resistive element is self heated, and then left for a predetermined period of time. In the figure, Pro1 to 3 denote temperature profiles of elements 1 to 3 disposed in micro packages of different vacuum levels.

A static-state temperature period (I) is a period before the micro heater is heated, and a heating period (II) is a period in which a current is caused to flow to the resistive element for heating. The temperature T of the resistive element is increased by 100 to 01° C., for example, in the heating period (II). After the heating period (II) elapses, when the current flowing to the resistive element is stopped, the self-heating of the resistive element is stopped. Thus, the temperature of the resistive element lowers. The rate of temperature reduction is different depending on the thermal capacity C of the resistive element and the thermal conductance ($G_1+G_2$). For a predetermined heat retention period (III) which is previously set, the temperature T of the resistive element lowers up to a temperature corresponding to the vacuum level.

In the example of FIG. 38, the temperature of the element 3 after the heat retention period (III) is higher than a threshold value (a set temperature), but the temperatures of the other elements 1 and 2 are lower than the threshold value. A difference between the temperature at the start of the heat retention period and the temperature after the heat retention period is $\Delta T$.

Based on the change in temperature $\Delta T$ of the resistive element, the vacuum level can be evaluated. Specifically, $\Delta T$ in each resistive element is measured, and an average of values excluding the maximum value and the minimum value among the measured values of $\Delta T$. Then, by median filtering in which the average value is used as a threshold value (a set temperature), the vacuum level can be determined. By this method, in an electronic device in which the vacuum levels are reduced in a number of vacuum packages with time, relative evaluation of vacuum level in individual vacuum packages can be appropriately performed. Instead of the adoption of this method, a temperature corresponding to the vacuum level to be noted may be determined as a threshold value (a set temperature).

Hereinafter, with reference to FIGS. 35 to 39, a method of measuring a temperature T of a resistive element is more concretely described.

Figure 39:
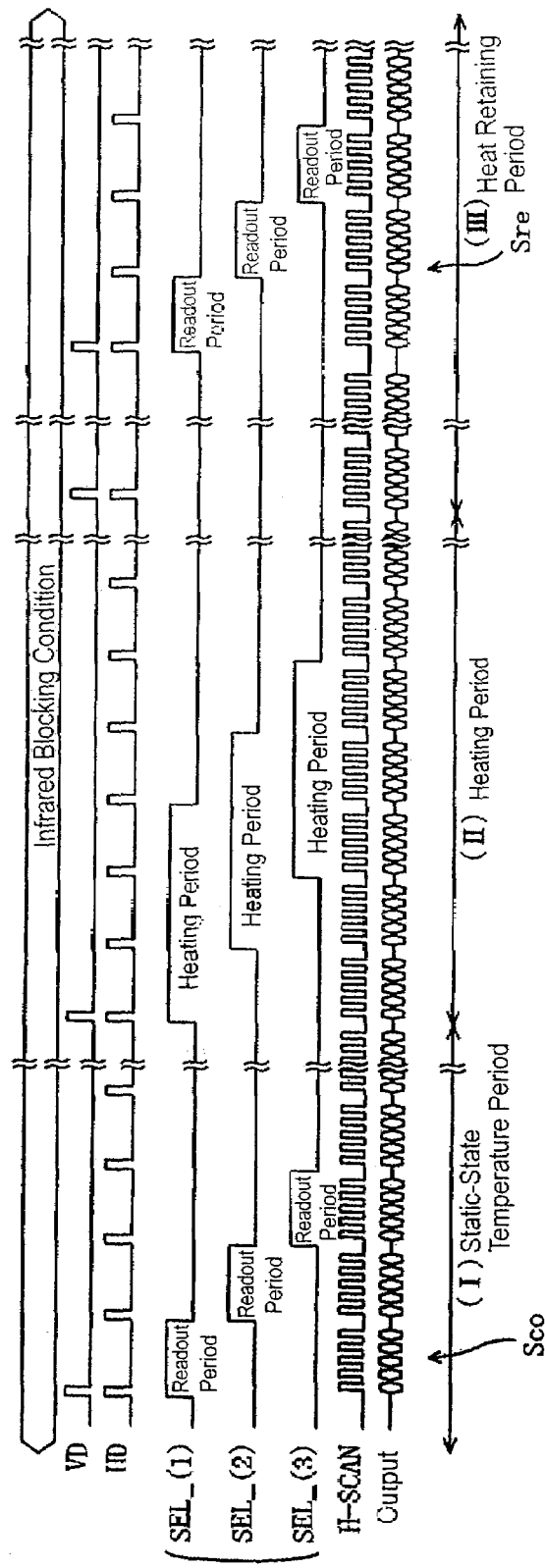
FIG. 39 is a timing chart for temperature measuring of the resistive element in the embodiment in which the abscissa indicates a time and the ordinate indicates a driving voltage.

FIG. 39 is a timing chart for measuring the temperature of the resistive element in this embodiment. In FIG. 39, the abscissa indicates a time, and the ordinate indicates a driving voltage. Hereinafter, for simplicity, the case where the temperatures of the resistive elements in the infrared detecting units A1, B1, and C1 in FIG. 35 are detected is described. A horizontal period is a period between HD clocks, and a frame is a period between VD clocks.

In the electronic device of this embodiment, when the vacuum level is to be performed, the irradiation of infrared rays into the infrared detecting units is blocked. More preferably, during several frames to several tens of frames before the static-state temperature condition (I) shown in FIG. 39, a condition in which line selection is not performed is maintained, so that the temperatures of the respective infrared detecting units A1, B1, . . . are stabilized to constant levels.

Next, in the static-state temperature period (I), while the temperatures of the respective infrared detecting units are maintained to be constant, the vertical scanning circuit 209 (V-SCAN) is driven in a condition where a voltage of 5 V is applied to Vdd. The voltage is applied to SEL#1, SEL#2, . . . , in this order. When the voltage is applied to SEL#1, output signals Sco (first signal outputs) of the respective infrared detecting units A1, B1, C1, . . . are sequentially read out. The values of the output signals Sco are written into a preceding frame memory in the signal processing circuit 60 in the order selected by the horizontal scanning circuit 208 (H-SCAN).

In the heating period (II), the vertical scanning circuit 209 (V-SCAN) is driven in a condition where a voltage of 25 V is applied to Vdd. At this time, the value of the voltage applied to Vdd is preferably larger than the voltage applied in the static state (I) by 20 V or more. When the vertical scanning circuit 209 (V-SCAN) is driven, SEL#1, SEL#2, . . . are selected in this order. When SEL#1 is selected, the voltage is applied to the respective infrared detecting units A1, B1, C1, . . . . At this time, since the resistance values of the infrared detecting units A1, B1, C1, . . . are substantially the same, the resistive elements in the infrared detecting units A1, B1, C1, . . . reach substantially the same temperature due to self-heating. In FIG. 39, the heating period includes three horizontal periods. Alternatively, the heating may be extended by several tens of frames.

In the heat retention period (III), the vertical scanning circuit 209 (V-SCAN) is driven in a condition where a voltage of 5 V is applied again to Vdd. The voltage is applied to SEL#1, SEL#2, . . . in this order. When SEL#1 is selected, output signals Sre of the respective infrared detecting units A1, B1, C1, . . . are sequentially read out. The values of the output signals Sre (second signal outputs) are read out in the order selected by the horizontal scanning circuit 208 (H-SCAN). In the signal processing circuit 60, the values of the output signals Sre after the heating period are compared with the values of the output signals Sco before the heating period stored in the preceding frame memory. Thus, temperature changes of the respective infrared detecting units can be detected.

As described above, when output signals after a predetermined time elapses after the heating of the resistive elements are read out, as described above, the temperature of an infrared detecting unit in which the vacuum level is deteriorated is lower than the temperature of an infrared detecting unit having a high vacuum level. Accordingly, by measuring the temperature change value before and after the heating, the vacuum level of the cap unit for sealing each infrared detecting unit can be evaluated.

Hereinafter, the relationship between a temperature change value before and after heating and an output signal as a voltage signal which is actually output is described by way of an example of the infrared detecting unit A1.

An output voltage V(A1) of the infrared detecting unit A1 is a product of a division resistance value of a resistance value R (A1) of the infrared detecting unit A1 with the resistance value R(ref) of a reference resistance R shown in FIG. 35, and a voltage Vdd applied to the power supply line 205, as is seen from FIG. 35. Thus, the output voltage V(A1) of the infrared detecting unit A1 is represented by the following expression.

$$V(A1)=\{R(ref)/(R(A1)+R(ref))\}\cdot Vdd$$

On the other hand, a temperature T(t) of the infrared detecting unit A1 is represented by the following expression.

$$T(t)\propto \{R(A1)/(R(A1)+R(ref))\}\cdot Vdd \propto Vdd-V(A1)$$

At this time, in the infrared detecting unit A1, a temperature change value $\Delta T$ from the temperature T(t0) in the static-state temperature period (I) to the temperature T(t1) in the heat retention period (III) is represented by the following expression.

$$\Delta T=T(t1)-T(t0)$$

When the output voltage V(A1) is calculated, since the values of the resistance value R(A1) and the applied voltage Vdd are known, the temperature change value $\Delta T$ can be uniquely determined depending on the output voltage V(A1) of the infrared detecting unit A1.

When the temperature of the Peltier element is set to be lower than an ordinary temperature (10° C. or less, for example) by using the temperature detection & Peltier element driving circuit 80, radiation heat from a tubular wall of the cap unit as the cap unit to the bolometer, so that the bolometer is cooled.

In FIG. 39, in the heating period (II), in order to match the timings from the start to the readout for respective lines, the timings of start is shifted for SEL#1, SEL#2, and SEL#3. Alternatively, they may be started at the same time.

In the heating period (II) shown in FIG. 39, as a method of self-heating the bolometer, a voltage is applied to the bolometer. As another method, in the heating period (II), only the temperature of the Peltier element is increased so as to heat the substrate without applying any voltage to the bolometer. The temperature of the bolometer is increased by heat radiation from the substrate or the tubular wall of the cap unit. In the succeeding readout period, the temperature of the Peltier element is returned to the initial state (10° C., for example), and the readout is performed for each line. In this method, the vacuum level is judged to be worse, as the change in temperature of the bolometer is larger before and after the heating by the Peltier element. If a difference between the detected temperatures is small, the vacuum level is judged to be good.

In the heating period (II) shown in FIG. 39, the heating may be performed by using a combination of the bolometer and the Peltier element.

(Signal Processing Method)

Figure 40:
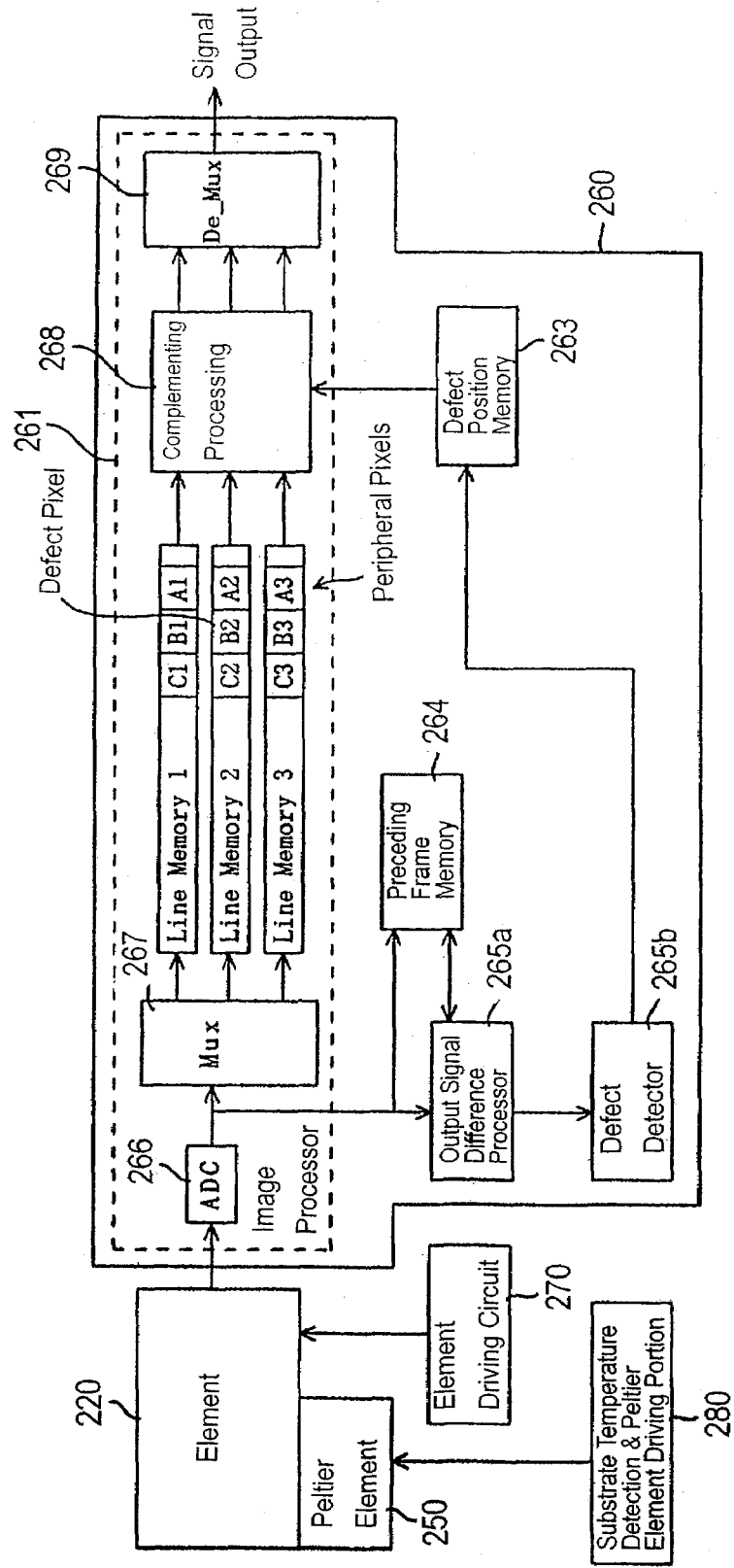
FIG. 40 is a diagram showing a circuit for processing an output signal of the infrared detecting unit and for complementing a defect in measuring a temperature for the purpose of determining the vacuum level.

Next, a method for processing the output signals Sco and Sre obtained by the measuring method shown in FIG. 39 in the signal processing circuit 60 will be described with reference to FIG. 40. FIG. 40 is a diagram showing a circuit for processing the output signals from the infrared detecting units and complementing a defect in the measurement of temperature for determining the vacuum level.

As shown in FIG. 40, in the measurement of temperature, an output signal Sco output from an infrared detecting unit in the static-state temperature period (I) as shown in FIG. 39 is AD-converted into a digital signal Dco in an ADC 66 of the signal processing circuit 60. Thereafter the digital signal Dco is stored in the preceding frame memory 64.

Next, after the heating period (II), an output signal Sre output from the infrared detecting unit 20 which is left for a predetermined period is also AD-converted into a digital signal Dre in the ADC 66 of the signal processing circuit 60. Thereafter, in an output signal difference detector 65a, a signal indicating a difference between the value of the digital signal Dco before the heating period and the value of the digital signal Dre after the heating stored in the preceding frame memory 64 is generated.

Moreover, in a defect detector 65b, the output signal indicating the change value is compared with a threshold value (a set voltage value) which is set based on the threshold value (the set temperature) shown in FIG. 38, thereby determining the vacuum level of the infrared detecting unit.

The position of the infrared detecting unit of which the vacuum level is determined to be deteriorated as the result of the determination of the vacuum level in the above-described way is stored into a defect position memory 63.

(Method of Complementing a Defect Pixel)

Next, a method of complementing an infrared detecting unit having a defect when the electronic device of this embodiment is used for a camera will be described with reference to FIG. 40.

When the camera using infrared detecting units is actually used, infrared rays emitted from an object are incident on the infrared detecting units 20 in a condition where the blocking plate for test is not used, so as to image output signals of the infrared detecting units 20. When the process is repeated, the vacuum level is gradually deteriorated in the region in which the respective infrared detecting units 20 are sealed. The degree of deterioration is varied for each of the cap units in which the respective infrared detecting units 20 are sealed. Therefore, in some of the infrared detecting units 20, the sensitivity is deteriorated because of the serious deterioration of the vacuum level. The position of the infrared detecting unit can be known by the above-described temperature measuring method.

When the camera is actually used, the infrared rays incident on the optical system 10 are made into an output signal S via the infrared detecting unit. The output signal S is input into an image processor 61 of the signal processing circuit 60, and converted into a digital signal of 8 bits or more by the ADC 66. Thereafter, the digital signal is input into line memories Line Memory 1 to 3 of 3 lines or more by a multiplexer Mux67, and temporarily stored as a signal corresponding to a pixel in each line (SEL#1, SEL#2, ... in FIG. 35). The signals of the pixels in each line are input into the complementing processor 68. In the processor, a signal of a defective pixel stored in the defect position memory 63 is subjected to interpolation complementing processing by utilizing signals of 8 pixels surrounding the signal of the defective pixel. Specifically, the complementing processing is performed in such a manner that a signal of a pixel obtained by adding signals of 8 pixels as the surrounding pixels (A1, B1, C1, A2, C2, A3, B3, C3 shown in FIG. 40), and multiplying ⅛ is substituted for the signal of the pixel which is determined to be a defective pixel (B2 shown in FIG. 40) based on the information from the defect position memory 63. Data after the complementing processing is input into a demultiplexer De# Mux69, so as to select a line required for the readout. The line is output as the output signal to the external.

(Arrangement of Micro Vacuum Packages)

Figure 41:
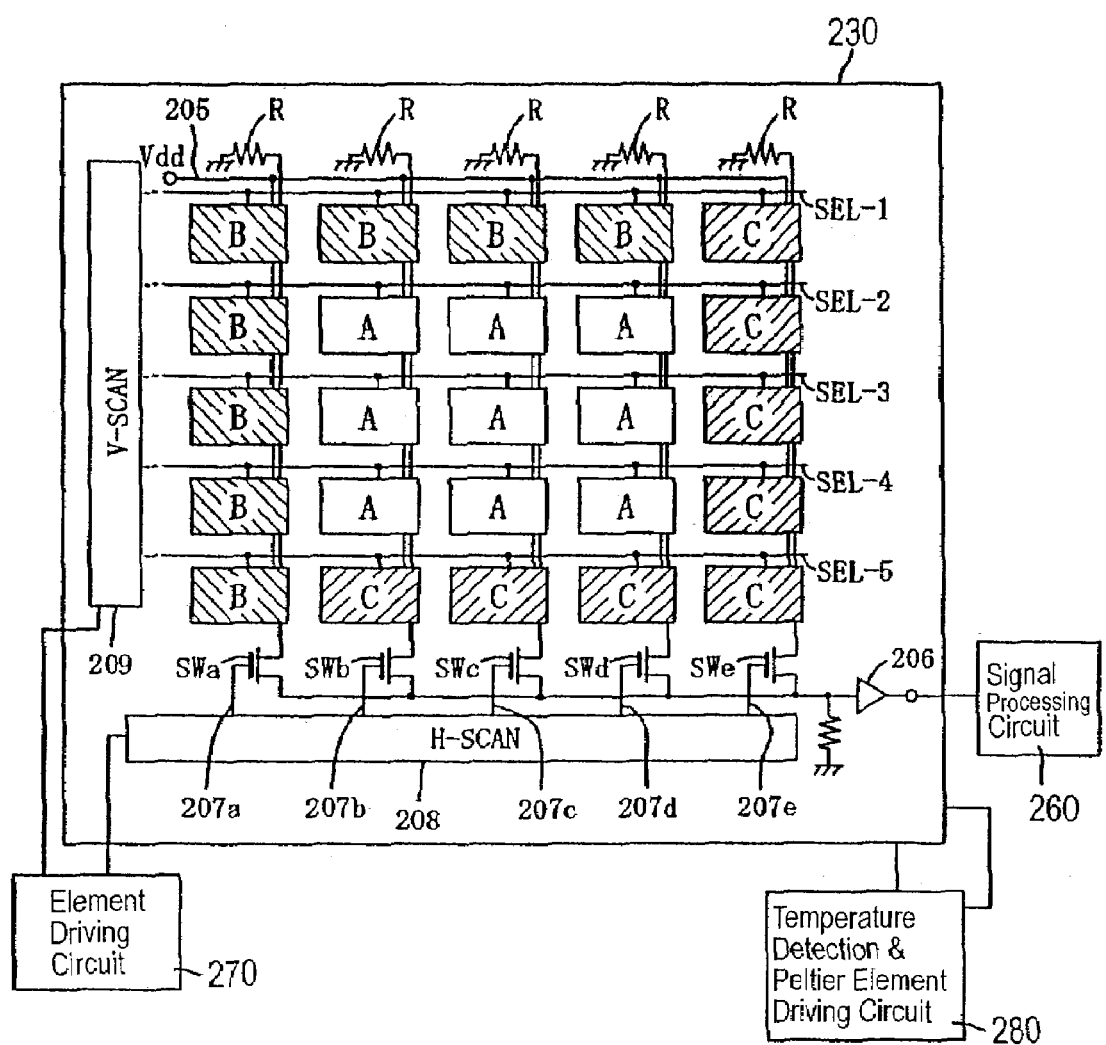
FIG. 41 is a diagram schematically showing the arrangement of the micro vacuum package in the cell array shown in FIG. 35.
Figure 42:
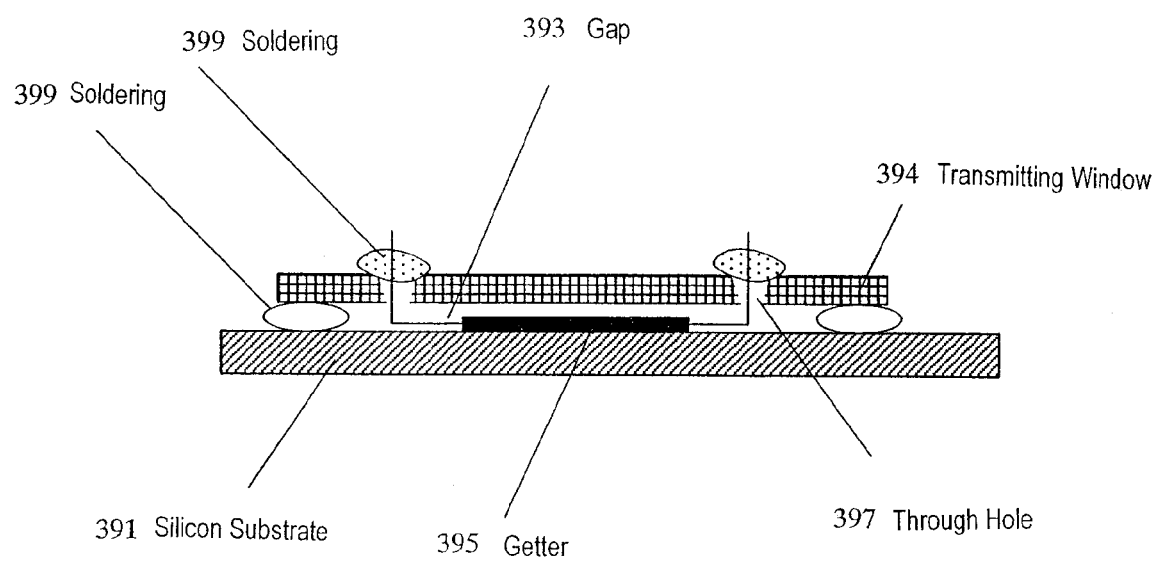
FIG. 42 is a diagram schematically showing a sectional configuration of an electronic device having a conventional vacuum package.

Hereinafter, the arrangement of the micro vacuum packages in this embodiment will be described with reference to FIG. 41. FIG. 41 is a diagram schematically showing the arrangement of the micro vacuum packages in the cell array shown in FIG. 35.

As shown in FIG. 41, in the cell array of this embodiment, micro packages A, micro vacuum packages B, and micro vacuum packages C are arranged. The micro vacuum packages A are formed from Si which transmits infrared rays, and a reduced pressure atmosphere is realized in the micro vacuum packages A without blocking the infrared rays. The micro vacuum packages B are formed by sputtering Al which blocks infrared rays onto the surface thereof, and a reduced pressure atmosphere is realized in the micro vacuum packages B with blocking the infrared rays. The micro vacuum packages C are formed from Si which transmits infrared rays. Since an opening is formed in part thereof, an ambient pressure atmosphere is realized in the micro vacuum packages C without blocking the infrared rays.

Hereinafter, functions of the respective micro vacuum packages and the infrared detecting units sealed in the micro vacuum packages will be described.

Infrared detecting units sealed by the micro vacuum packages A (hereinafter referred to as infrared detecting units A) are in the reduced pressure atmosphere, and in a condition where infrared rays are incident. By sensing infrared rays emitted from an object, the infrared detecting units A output signals in accordance with the intensity of the infrared rays from the object. The output signals include an offset value which exists in a condition where any infrared rays are not incident. The vacuum level in the micro vacuum packages A is held at a reference value or more at the time of sealing. Thereafter, it is considered that the vacuum level is gradually deteriorated with time and due to the use of the device.

Infrared detecting units sealed by the micro vacuum packages B (hereinafter referred to as infrared detecting units B) are in a reduced pressure atmosphere which is substantially at the same level as that of the infrared detecting units A, and in a condition where any infrared rays are not incident. Therefore, in the region in which the infrared detecting units B are formed when the camera is actually used, it is possible to obtain outputs in a dark condition in which any infrared rays are not incident. By using the measured value, it is possible to remove the offset value included in the output signals of the infrared sensors A.

Infrared detecting units sealed by the micro vacuum packages C (hereinafter referred to as infrared detecting units C) are in an ambient pressure atmosphere. Therefore, when an examination for determining the vacuum level is performed, it is possible to know the temperature of the infrared detecting units C in the ambient pressure atmosphere which is similar to the case where the vacuum level is most deteriorated. By comparing the temperature of the infrared detecting units C with an average value of the temperatures in the infrared detecting units A, it is judged how the deterioration progresses as a whole of the cell array.

In this embodiment, the micro vacuum packages B and the micro vacuum packages C are disposed on the infrared detecting units positioned in a peripheral portion among the infrared detecting units which constitute the cell array. In the present invention, the arrangement of the micro vacuum packages B and the micro vacuum packages C is not limited to this.

Specifically, if one micro vacuum package C is disposed for each line, the above-described effect can be attained. It is preferred that the micro vacuum packages B are disposed at the rate of about 20 to 30 pixels for the cell array including signals of 510 pixels in a horizontal direction.

In the cell array of the present invention, the micro vacuum packages B and the micro vacuum packages C are not necessarily formed. One of the two may be formed, or neither of them is formed.

In this embodiment, the micro vacuum packages C may not be formed for the infrared detecting units C. In such a case, for the examination, the infrared detecting units C are exposed to the ambient pressure atmosphere, and a difference between the self-heating and the heat dissipation of the bolometer can be measured. In this embodiment, the micro vacuum packages C each having an opening are formed for the infrared detecting units C, for the purpose of performing more accurate measurement by making the conditions such as heat convection in the examination closer to those of the infrared detecting units A and B.

The above-described temperature change measurement and the determination of the vacuum level may be performed during the production or at the shipping, or may be performed by a user after the shipping. They will be described below.

In the production, for example, micro vacuum packages A to C having the vacuum level of $3 \times 10^{-3}$ Pa are formed. The forming method is performed similarly to the method performed in other embodiments. Specifically, a step of forming an etching hole, a step of forming a cavity by etching, and a step of closing the etching hole by sputtering may be performed.

A slit-like opening is formed in the micro vacuum package C, so that the vacuum level which is known in a vacuum chamber is held in the micro vacuum package C. Therefore, in the case where temperature change measurement is performed at this time, the temperature change value of the infrared detecting unit C in the micro vacuum package C can be used as a temperature change value corresponding to the vacuum level of the known value and the optimum value. The corresponding relationship can be used for setting a threshold value.

Next, the determination of vacuum level at the shipping can be performed by detecting a micro vacuum package in which the vacuum level is deteriorated due to bond failure of a cap in the production. The determination of vacuum level after the shipping of the device is performed for detecting a micro vacuum package in which the vacuum level is deteriorated with time or as the use of the device. In the determination of vacuum level, a threshold value which is calculated by using the corresponding relationship in the production may be previously determined. Alternatively, a threshold value may be set by regarding an average value of the measured results of the temperature change value of the infrared detecting units C in the micro vacuum packages C as a reference under an ambient pressure when the vacuum level is to be determined.

In this embodiment, one infrared detecting unit is disposed in one micro vacuum package. Alternatively, a plurality of infrared detecting units may be formed in one micro vacuum package.

In this embodiment, a bolometer is used as an element which requires the reduced pressure atmosphere. Other than the bolometer, a thermoelectric conversion element such as a PN diode, an electron releasing element, an element for detecting or releasing a tera-wave having a wavelength of 40 to 50 μm, and the like may be used. The electronic device of the present invention can be suitable for, other than the camera, various types of infrared sensors or other devices.

As the method of determining the vacuum level, a method of measuring a temperature after the device is left for a predetermined period of time after the heating period is described. Alternatively, in the present invention, a time required for reaching a predetermined temperature after the heating period is measured, and the time is compared with a threshold value (a set time), thereby performing the determination of vacuum level.

In this embodiment, the vacuum level is sensed by using the current variation and the temperature variation. Alternatively, in the above-described embodiments, the vacuum level can be sensed in a static state.

In Embodiments 7 and 8, a plurality of infrared detecting units and visible-light detecting units are arranged at regular intervals on one and the same substrate. Alternatively, the number of the infrared detecting unit on the substrate may be one. An electronic device having such a configuration is suitably used as a surveillance camera, for example. According to such an electronic device which is used as a surveillance camera, when an existence of a person is sensed by the infrared detecting unit, the imaging by the visible-light detecting unit is performed, so that the obtained image can be checked by a manager of the surveillance camera.

An example of an electronic device in which infrared detecting units and visible-light detecting units are disposed on one and the same substrate is disclosed in Japanese Laid-Open Patent Publication No. 2003-17672, for example. The present invention can be widely applied to the electronic device disclosed in the document.

According to the present invention, in the case where part of an electronic device is disposed in a cavity, an etching hole disposed in a cavity-wall member is closed by sputtering a metal or the like, so that the pressure of the cavity can be held at a low pressure (a high vacuum). Thus it is possible to provide an electronic device with high performance, such as an infrared sensor with high sensitivity.

Moreover, according to the present invention, since a pressure measuring element and a gettering thin film are disposed inside a cavity such as a micro vacuum package, it is possible to measure the vacuum level inside the individual micro vacuum package. In addition, by appropriately activating the gettering thin film inside the cavity, it is possible to maintain the vacuum level in the cavity high.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of fabricating an electronic device comprising the steps of:
   (a) preparing a substrate on which part of the electronic device is disposed, and forming a sacrificial layer which covers the part of the electronic device on a selected region of the substrate;
   (b) forming a cavity-wall film which covers a top face and a side face of the sacrificial layer on the substrate;
   (c) forming at least one opening which runs through the cavity-wall film, the opening extending along the side face of the sacrificial layer and edges of the opening in contact with the side face of the sacrificial layer, wherein the opening is formed to have a shape which is wider in an upper portion and narrower in a lower portion;
   (d) selectively etching at least part of the sacrificial layer via the opening, thereby forming a cavity surrounding the part of the electronic device; and
   (e) forming a sealing member for closing the opening by sputtering.

2. The method of fabricating an electronic device of claim 1, wherein in the step (e), the sealing member is formed by sputtering a metal.

3. The method of fabricating an electronic device of claim 1, wherein in the step (e), the sealing member is formed by sputtering silicon.

4. The method of fabricating an electronic device of claim 1, wherein in the step (e), the sputtering is performed in a direction inclined with respect to a direction perpendicular to a main face of the substrate.

5. The method of fabricating an electronic device of claim 1, wherein in the step (c), the opening is formed so that the opening does not overlap the part of the electronic device as seen from a direction of the sputtering in the step (e).

6. The method of fabricating an electronic device of claim 1, wherein in the step (e), the sputtering is performed under a pressure of 10 Pa or less.

7. The method of fabricating an electronic device of claim 6, wherein in the step (e), the sputtering is performed under a pressure of 5 Pa or less.

8. The method of fabricating an electronic device of claim 1, wherein in the step (a), the sacrificial layer is formed from a polysilicon film, and in the step (b), a silicon oxide film is formed as the cavity-wall film.

* * * * *